(12) United States Patent
Kobayashi et al.

(10) Patent No.: US 9,948,243 B2
(45) Date of Patent: Apr. 17, 2018

(54) RECONFIGURABLE LOAD MODULATION AMPLIFIER

(71) Applicant: Qorvo US, Inc, Greensboro, NC (US)

(72) Inventors: Kevin Wesley Kobayashi, Redondo Beach, CA (US); Hamhee Jeon, Long Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/278,270

(22) Filed: Sep. 28, 2016

(65) Prior Publication Data

US 2017/0019071 A1  Jan. 19, 2017

Related U.S. Application Data

(63) Continuation-in-part of application No. 14/501,453, filed on Sep. 30, 2014, now Pat. No. 9,484,865.
(Continued)

(51) Int. Cl.
  *H03F 1/02*  (2006.01)
  *H03F 1/32*  (2006.01)
  (Continued)

(52) U.S. Cl.
  CPC .......... *H03F 1/0288* (2013.01); *H03F 1/0233* (2013.01); *H03F 1/56* (2013.01);
  (Continued)

(58) Field of Classification Search
  USPC .................. 330/124 R, 295, 84, 286, 53–54
  See application file for complete search history.

(56) References Cited

U.S. PATENT DOCUMENTS

| 4,187,471 A | 2/1980 | Shimoji et al. |
| 6,208,202 B1 | 3/2001 | Kaufman et al. |
| (Continued) | | |

FOREIGN PATENT DOCUMENTS

WO  2014007703 A1  1/2014

OTHER PUBLICATIONS

Choi, Jinsung, et al., "Optimized Envelope Tracking Operation of Doherty Power Amplifier for High Efficiency Over an Extended Dynamic Range," IEEE Transactions on Microwave Theory and Techniques, vol. 57, No. 6, Jun. 2009, pp. 1508-1515.
Doherty, W.H., "A New High Efficiency Power Amplifier for Modulated Waves," Proceedings of the Institute of Radio Engineers, vol. 24, No. 9, Sep. 1936, pp. 1163-1182.
(Continued)

*Primary Examiner* — Hieu Nguyen
(74) *Attorney, Agent, or Firm* — Withrow & Terranova, P.L.L.C.

(57) ABSTRACT

A reconfigurable load modulation amplifier having a first power amplifier (PA) configured to be supplied by a first drain voltage and a second PA coupled in parallel with the first PA, wherein the second PA is configured to be supplied by a second drain voltage is disclosed. The reconfigurable load modulation amplifier includes a quadrature coupler configured to combine power from both the first PA and the second PA for output through an output port. Also included is control circuitry configured to set at least one of the first drain voltage and the second drain voltage such that the first drain voltage is different than the second drain voltage. In at least one embodiment, the control circuitry is further configured to dynamically adjust at least one of the first drain voltage and the second drain voltage such that the first drain voltage is different than the second drain voltage.

51 Claims, 39 Drawing Sheets

Related U.S. Application Data

(60) Provisional application No. 61/884,571, filed on Sep. 30, 2013, provisional application No. 61/892,683, filed on Oct. 18, 2013.

(51) Int. Cl.
*H03F 3/19* (2006.01)
*H03F 1/56* (2006.01)
*H03F 3/193* (2006.01)

(52) U.S. Cl.
CPC ....... *H03F 3/193* (2013.01); *H03F 2200/102* (2013.01); *H03F 2200/105* (2013.01); *H03F 2200/192* (2013.01); *H03F 2200/204* (2013.01); *H03F 2200/36* (2013.01); *H03F 2200/451* (2013.01)

(56) References Cited

U.S. PATENT DOCUMENTS

| | | | |
|---|---|---|---|
| 6,262,629 B1 | 7/2001 | Stengel et al. | |
| 6,297,696 B1 | 10/2001 | Abdollahian et al. | |
| 6,864,742 B2 | 3/2005 | Kobayashi | |
| 7,064,606 B2* | 6/2006 | Louis | H03F 1/0266 330/124 R |
| 7,138,861 B2* | 11/2006 | Sundstrom | H03F 1/0238 330/124 R |
| 7,345,535 B2 | 3/2008 | Kwon et al. | |
| 7,362,170 B2* | 4/2008 | Louis | H03F 1/0288 330/124 R |
| 7,570,932 B1 | 8/2009 | Folkmann | |
| 8,314,654 B2 | 11/2012 | Outaleb et al. | |
| 8,346,189 B2 | 1/2013 | Dupuy et al. | |
| 8,417,201 B1 | 4/2013 | Schooley | |
| 8,508,296 B1 | 8/2013 | Mustafa et al. | |
| 8,564,367 B2 | 10/2013 | Svechtarov | |
| 8,593,219 B1 | 11/2013 | Root | |
| 8,970,297 B2 | 3/2015 | Lin et al. | |
| 9,336,954 B2 | 5/2016 | Schenk | |
| 9,369,095 B2 | 6/2016 | Kobayashi | |
| 9,397,616 B2* | 7/2016 | Donati | H03F 3/604 |
| 9,397,617 B2 | 7/2016 | Jeon et al. | |
| 9,431,969 B2 | 8/2016 | Jeon et al. | |
| 9,484,865 B2 | 11/2016 | Kobayashi et al. | |
| 2002/0186079 A1 | 12/2002 | Kobayashi | |
| 2005/0134377 A1 | 6/2005 | Dent | |
| 2014/0159818 A1 | 6/2014 | Jeon et al. | |
| 2014/0375389 A1 | 12/2014 | Jeon et al. | |

OTHER PUBLICATIONS

Gustafsson, David, et al., "A Novel Wideband and Reconfigurable High Average Efficiency Power Amplifier," 2012 IEEE MTT-S International Microwave Symposium Digest, Jun. 17-22, 2012, pp. 1-3.

Jeon, Hamhee, et al., "A Triple-Mode Balanced Linear CMOS Power Amplifier Using a Switched-Quadrature Coupler," IEEE Journal of Solid-State Circuits, vol. 47, No. 9, Sep. 2012, pp. 2019-2032.

Lange, J., "Interdigitated Stripline Quadrature Hybrid," IEEE Transactions on Microwave Theory and Techniques, vol. 17, No. 12, Dec. 1969, pp. 1150-1151.

Mohamed, A.M.M., et al., "Reconfigurable Doherty Amplifier for Efficient Amplification of Signals with Variable PAPR," 2013 IEEE MTT-S International Microwave Symposium Digest (IMS), Jun. 2-7, 2013, pp. 1-3.

Non-Final Office Action for U.S. Appl. No. 14/103,089, dated Mar. 24, 2015, 6 pages.

Final Office Action for U.S. Appl. No. 14/103,089, dated May 22, 2015, 5 pages.

Non-Final Office Action for U.S. Appl. No. 14/103,089, dated Sep. 16, 2015, 5 pages.

Notice of Allowance of U.S. Appl. No. 14/103,089, dated Jan. 8, 2016, 7 pages.

Notice of Allowance for U.S. Appl. No. 14/103,089, dated Mar. 18, 2016, 6 pages.

Non-Final Office Action for U.S. Appl. No. 14/314,357, dated Sep. 21, 2015, 19 pages.

Non-Final Office Action for U.S. Appl. No. 14/501,453, dated Dec. 4, 2015, 11 pages.

Notice of Allowance for U.S. Appl. No. 14/606,375, dated Dec. 24, 2015, 7 pages.

Notice of Allowance for U.S. Appl. No. 14/314,357, dated Apr. 18, 2016, 5 pages.

Corrected Notice of Allowability for U.S. Appl. No. 14/103,089, dated Jul. 19, 2016, 4 pages.

Non-Final Office Action for U.S. Appl. No. 15/006,905, dated Sep. 15, 2016, 19 pages.

Notice of Allowance for U.S. Appl. No. 14/501,453, dated Jun. 29, 2016, 7 pages.

Final Office Action for U.S. Appl. No. 15/006,905, dated Mar. 2, 2017, 20 pages.

Non-Final Office Action for U.S. Appl. No. 15/278,450, dated Jun. 26, 2017, 8 pages.

Notice of Allowance for U.S. Appl. No. 15/278,450, dated Sep. 22, 2017, 7 pages.

* cited by examiner

RECONFIGURABLE LOAD MODULATION AMPLIFIER

RELATED APPLICATIONS

This application is a continuation-in-part of U.S. patent application Ser. No. 14/501,453, filed Sep. 30, 2014, now U.S. Pat. No. 9,484,865, entitled "RECONFIGURABLE LOAD MODULATION AMPLIFIER," which claims priority to U.S. provisional patent application No. 61/884,571, filed Sep. 30, 2013; and U.S. provisional patent application No. 61/892,683, filed Oct. 18, 2013.

This application is related to U.S. patent application Ser. No. 15/278,450, filed Sep. 28, 2016, now U.S. Pat. No. 9,887,671, entitled "RECONFIGURABLE LOAD MODULATION AMPLIFIER," which is a continuation of U.S. patent application Ser. No. 14/501,453, filed Sep. 30, 2014, which claims priority to U.S. provisional patent application No. 61/884,571, filed Sep. 30, 2013, and U.S. provisional patent application No. 61/892,683, filed Oct. 18, 2013.

All of the applications listed above are hereby incorporated herein by reference in their entireties.

FIELD OF THE DISCLOSURE

The present disclosure pertains to amplifiers and in particular to load modulation amplifiers having a carrier amplifier and a peak amplifier that are coupled in parallel.

BACKGROUND

The quest for high efficiency over a large peak to average power ratio (PAPR) and the ability to cover a wide bandwidth (BW) of operation (>160 MHz and typically >5% of carrier frequency) is desired for future high data rate wireless transmissions. Envelope Tracking (ET) has been demonstrated to provide high efficiency across >10 dB of PAPR for 20 MHz long term evolution (LTE) mobile applications. However, this approach is BW challenged and is strongly dependent on fundamental semiconductor technology trades.

Bandwidths of up to 30 MHz have been demonstrated for mobile applications. Wireless Fidelity (Wi-Fi) BW requirements for 160 MHz 802.11ac are challenging without costly semiconductor technology disruptions.

Doherty amplifiers can be configured to provide high efficiency over a 6 dB OPBO (output power back off or PAPR range). In particular, Doherty amplifiers may be configured to achieve larger PAPRs of 9 dB and 12 dB or more using N-way and/or asymmetric Doherty approaches. However, these are typically limited to operating BW <5% due to the narrow-band quarter wave impedance inverters used. Doherty amplifiers also rely on Digital Pre-Distortion (DPD) to correct for phase and amplitude distortion resulting from the Doherty operation. For base stations, DPD has shown operation up to 60 MHz with capability in the hundreds of MHz and exceeding 1 GHz for future point to point radio systems. However, Doherty amplifiers are not able to keep up with the BW capability of DPD.

Thus, what is needed is a new amplifier paradigm that is reconfigurable to provide the advantageous characteristics of Doherty amplifier operation while providing the BW capability of DPD. Moreover, an associated need is a load modulation type amplifier that is configured for improved OPBO efficiency by reducing impedance at lower power levels. It is important to note that this need is contrary to conventional load modulation amplifier approaches.

SUMMARY

A reconfigurable load modulation amplifier having a first power amplifier (PA) configured to be supplied by a first drain voltage and a second PA coupled in parallel with the first PA, wherein the second PA is configured to be supplied by a second drain voltage is disclosed. Also included is control circuitry configured to set at least one of the first drain voltage and the second drain voltage such that the first drain voltage is different than the second drain voltage. In at least one embodiment, the control circuitry is further configured to dynamically adjust at least one of the first drain voltage and the second drain voltage such that the first drain voltage is different than the second drain voltage. In some embodiments the first PA is a carrier amplifier and the second PA is a peak amplifier. In other embodiments, the first PA is the peak amplifier and the second PA is the carrier amplifier. In either case, the peak amplifier provides additional power amplification when the carrier amplifier is driven into saturation. A quadrature coupler that is coupled between the carrier amplifier and the peak amplifier is configured to combine power from both the carrier amplifier and the peak amplifier for output through an output load terminal.

In at least some of the embodiments, the carrier amplifier is coupled to the output load terminal through zero phase shift ports of the quadrature coupler. Moreover, at least some embodiments include control circuitry at an isolation port of the quadrature coupler. The control circuitry is configured to provide adjustable impedance at the isolation port of the quadrature coupler. Further still, in at least some embodiments, the reconfigurable load modulation amplifier includes voltage standing wave ratio (VSWR) detection circuitry configured to detect a VSWR mismatch condition associated with the output load terminal. The VSWR detection circuitry is usable by the control circuitry to set an isolation termination impedance of the quadrature coupler to a termination impedance range relative to the nominal output load termination impedance to improve isolation between the carrier and peak amplifiers for improving load insensitive load modulation operation.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 35-1 is a schematic diagram of a reconfigurable load modulated power amplifier that is supplied by asymmetric drain modulations.

FIG. 35-2 is a schematic diagram of the reconfigurable load modulated power amplifier that is reconfigured to provide phase inversion.

DETAILED DESCRIPTION

Figure 1:
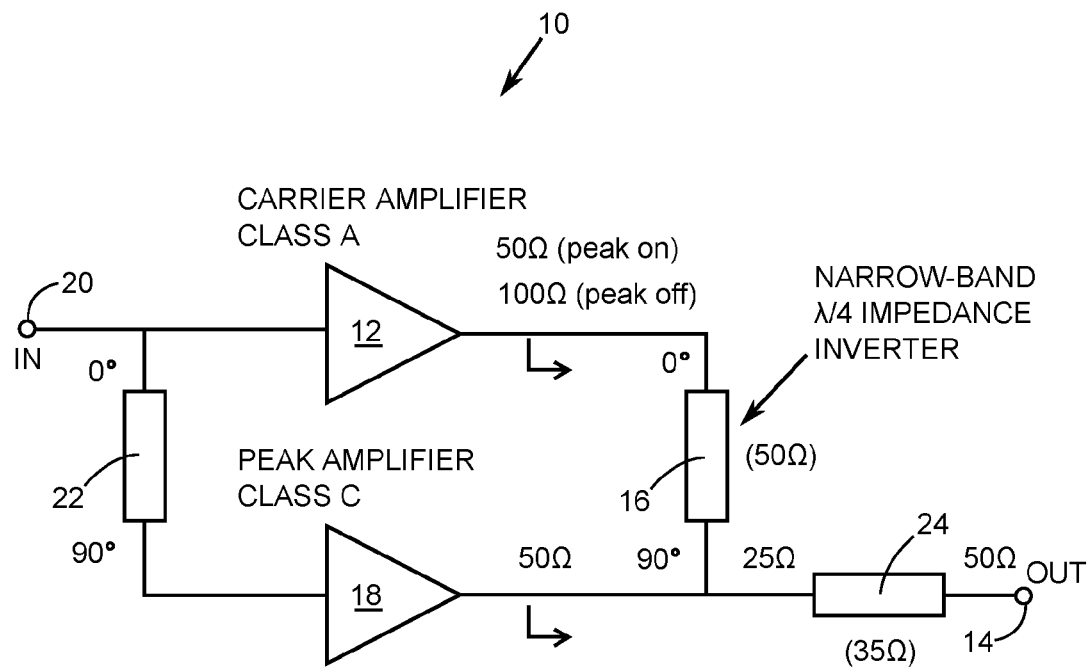
FIG. 1 is a schematic diagram of a conventional Doherty amplifier that is related art.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

In this disclosure, a new type of load modulated amplifier is described. This new type of load modulated amplifier operates with a large departure from fundamental Doherty amplifier operation in three major aspects. In particular, the phase of a carrier amplifier and peak amplifier making up the disclosed load modulated amplifier have been inverted, while at the same time, the impedance modulation versus power may be inverted for the carrier and peak amplifiers resulting in better efficiency and peak to average power ratio (PAPR) while providing improved bandwidth (BW) performance over conventional Doherty amplifiers, and the modulated load impedance seen by either carrier or peak amplifier can achieve a range that is as low as half of the nominal normalized load impedance of the quadrature coupler, and as high as twice the nominal normalized load impedance of the quadrature coupler. It should be appreciated that conventional Doherty operation reconfigures the carrier amplifier load impedance to be as high as twice the nominal normalized load impedance of the quadrature amplifier, but does not reconfigure the carrier amplifier below the nominal normalized load impedance.

Because of the departure from Doherty operation of the impedance versus power profile, where the carrier impedance is now decreasing with reduced input power level, and can produce a modulation load to either the peak or carrier amplifier that is lower than the nominal normalized load impedance of the quadrature coupler, and as low as half of the nominal normalized load impedance of the quadrature amplifier, while maintaining good output power back off (OPBO) efficiency, the amplifier embodiments of the present disclosure are not a type of Doherty amplifier. In effect, the embodiments of the presently disclosed amplifier are novel and merit a new classification—an amplifier sui generis.

In addition, the embodiments of the present disclosure enable a method of preserving port-to-port (i.e., carrier to peak) amplifier isolation over a wide frequency bandwidth, which involves detecting a voltage standing wave ratio (VSWR) and phase at the output, and then adjusting an isolation impedance on the coupler isolation port to provide improved load insensitive and high efficiency operation, which is a fundamental challenge in Doherty amplifiers. Further still, this disclosure also focuses on a reduction to practice of the novel amplifier embodiments disclosed herein. The disclosed reduction to practice is a large departure from fundamental Doherty amplifier load operation in at least two major aspects. The impedance modulation versus power is the opposite of what is characteristic for a Doherty amplifier in which a carrier amplifier is introduced to relatively lower impedance. Another aspect is that the impedance modulation that is presented to one or the other amplifiers is lower than the nominal normalized impedance of the quadrature coupler. In particular, embodiments of the present disclosure see half of the load impedance whereas a Doherty amplifier experiences twice the load impedance during OPBO operation. As a result, an improved small signal efficiency and PAPR is achieved while providing BW improvements over traditional Doherty amplifiers. Moreover, since the present embodiments see half the load impedance, improvements in applications having drain-voltage modulation techniques such as envelope tracking (ET), and average power tracking (APT) can be realized. The present embodiments can also be used in place of traditional Doherty amplifiers for enhanced operation of applications that include traditional Doherty amplifiers.

FIG. 1 is a schematic of a related art Doherty amplifier 10 that is configured conventionally in a 2-way symmetrical design. One difference between the related art Doherty amplifier 10 and embodiments of the present disclosure is that a carrier amplifier 12 of the Doherty amplifier 10 is communicatively coupled to an output terminal 14 through a 90° phase shifter 16. A peak amplifier 18 is coupled to an input terminal 20 through another 90° phase shifter 22. A termination impedance 24 is coupled between the peak amplifier 18 and the output terminal 14. Another difference is that the impedance presented to a carrier amplifier at ~6 dB OPBO is twice the load impedance (i.e., 2*Rload). In the present disclosure, at least one of the embodiments has a carrier amplifier that is coupled to the output through a zero degree coupler. Moreover, at least one other embodiment of the present disclosure has an impedance presented to the carrier amplifier that is approximately Rload/2 at roughly 6 dB OPBO or greater. This lower impedance results in higher carrier amplifier power efficiency when the amplifier is backed off from saturation. Note, that the load impedance Rload (not shown) is provided by a load that is usually coupled to the output terminal 14.

In particular, the embodiments of the present disclosure depart from conventional Doherty amplifiers in at least the following ways. In at least some of the disclosed embodiments, the carrier amplifier is directly coupled to the zero phase terminal through the ports of a 4-port coupler, as opposed to coupling through a 90° phase shift to a summing node. Other embodiments are configured such that a termination impedance of the coupler is adjustable. Due to the termination impedance adjustability, the carrier amplifier load impedance decreases as power is backed off instead of increasing as occurs in a conventional Doherty amplifier operation. Moreover, at least some of the disclosed embodiments are configured to detect a VSWR and automatically adjust the isolation termination impedance ($Z_{ISO}$) of the coupler to provide maximum power amplifier efficiency with good antenna VSWR load immunity. Further still, at least some embodiments are reconfigurable for load modulated amplification using an open loop signal that adjusts termination impedance for maximizing characteristics such as power, efficiency, linearity, bandwidth, load insensitivity or a combination thereof.

Figure 2:
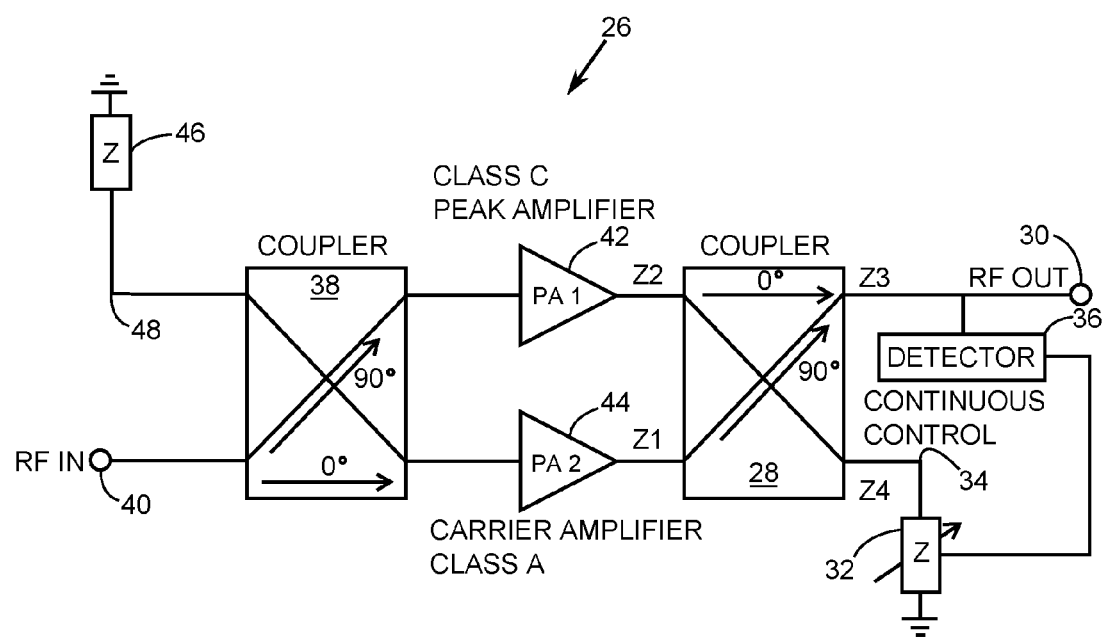
FIG. 2 is a schematic diagram of a related art broadband reconfigurable Doherty power amplifier with tunable coupler.

FIG. 2 is a schematic of a related art reconfigurable broadband Doherty amplifier 26 employing a 4-port quadrature coupler combiner 28 at an output load terminal 30 where load modulation of the carrier amplifier is achieved by changing a termination impedance 32 of a termination port 34 to create Doherty amplifier operation. The termination impedance 32 may be optimized for a given Pout, frequency or temperature, and may involve continuous or discrete control from a control signal generated by a detector 36. Note the coupled port polarity and impedance change with power is inverted for the embodiments of the present disclosure. A second coupler 38 is coupled between an input terminal 40 and a peak amplifier 42 and a carrier amplifier 44. A second termination impedance 46 is coupled to a second termination port 48.

Figure 3A:
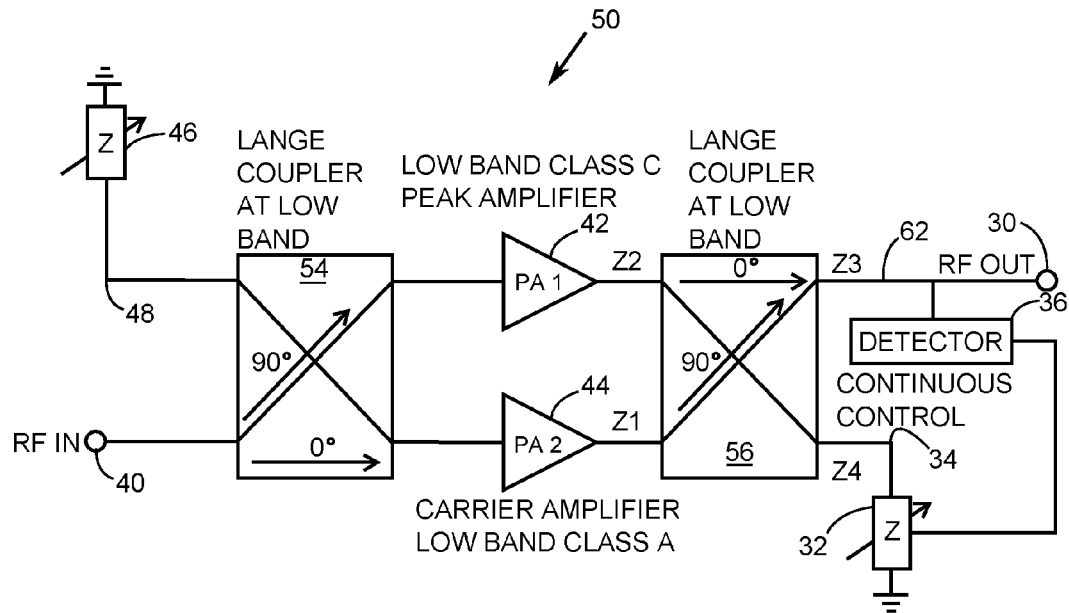
FIGS. 3A and 3B are schematic diagrams of a related art multi-band Doherty power amplifier.
Figure 3B:
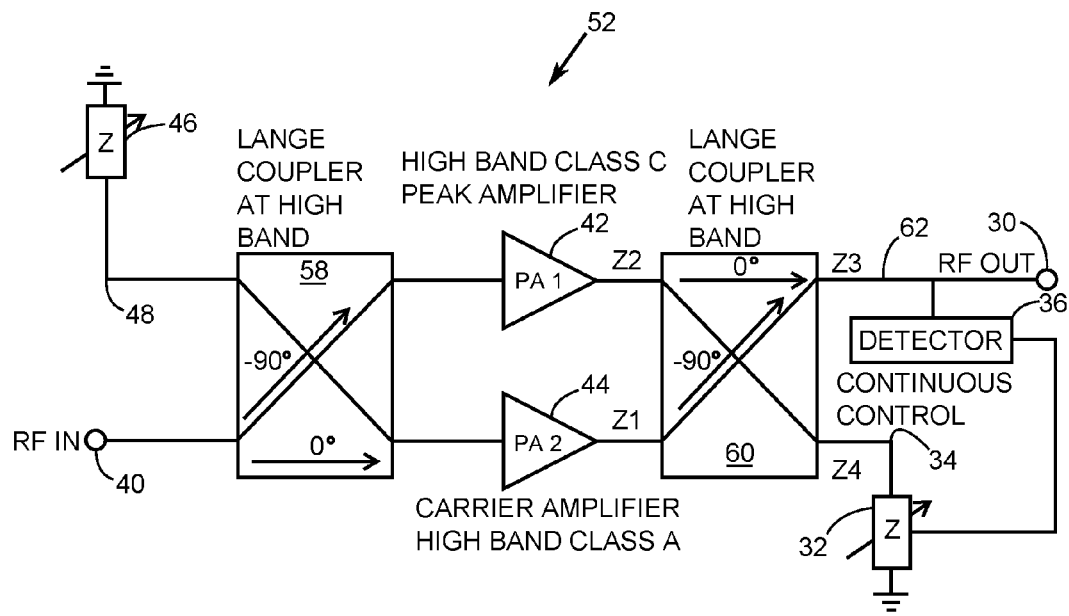

FIGS. 3A and 3B are schematics of a related art low band amplifier 50 and a high band amplifier 52, respectively, that each illustrates the broadband nature of the use of Lange couplers 54, 56, 58, and 60. More specifically, the related art amplifiers 50 and 52 are configured for operation at an operational frequency fo and 3fo and rely on the periodic nature of the Lange quadrature couplers 54, 56, 58, and 60. Phasing during operation is such that the Lange couplers 54 and 56 each provide 90° quadrature characteristics at $1^{st}$ and roughly $3^{rd}$ harmonics with low loss. Thus, reconfigurability can be achieved in multiple bands. Note that a direct coupled output 62 at 0° is coupled to the peak amplifier 42 as in a conventional Doherty amplifier which departs from embodiments of the present disclosure which are not limited to Doherty amplifier operation. Also, a carrier impedance Zcarrier and a peak impedance Zpeak are >Zload for a load (not show) that is typically coupled to the output load terminal 30, whereas embodiments of this disclosure may utilize Zcarrier and Zpeak<Zload for achieving both efficiency and load insensitivity.

Figure 4:
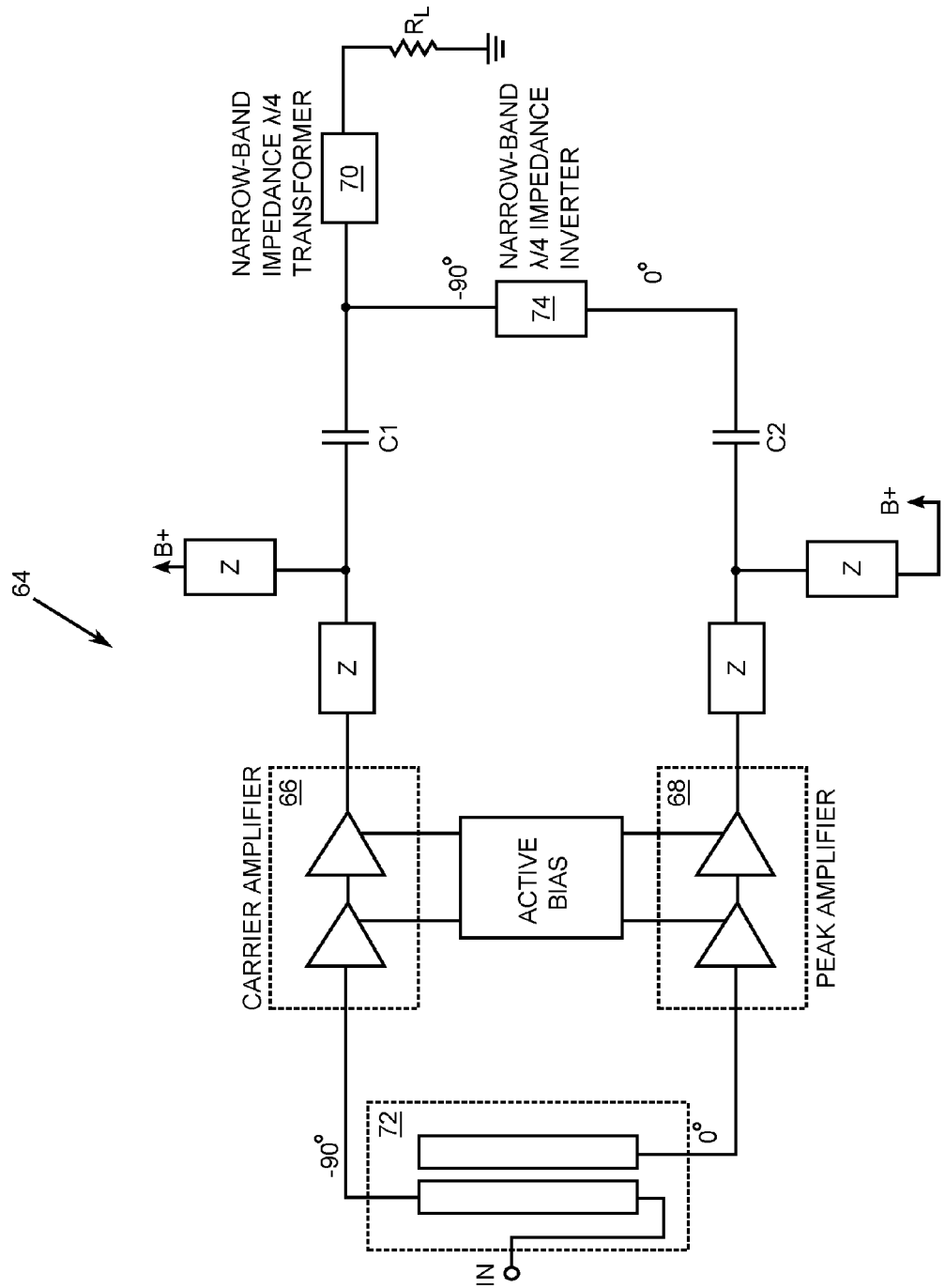
FIG. 4 is a schematic of a related art inverted Doherty amplifier that exchanges phases between a carrier amplifier and a peak amplifier.

FIG. 4 is a schematic of a related art inverted Doherty power amplifier 64. The inverted Doherty power amplifier 64 saves area and thus cost for mobile applications by eliminating matching circuitry. Basically, the inverted Doherty power amplifier 64 exchanges the phases between a carrier amplifier 66 and a peak amplifier 68. Note that a wider bandwidth can be obtained by eliminating output impedance transformer 70, which in this case is a narrow-band impedance λ/4 transformer. This inherent feature is also preserved in embodiments of the present disclosure, since a 4-port quadrature coupler produces a wider and broader band impedance transformation from the 50Ω output impedance. As a result, there is no need for an output impedance transformer such as output impedance transformer 70 for the present embodiments, regardless of the output phase configuration. The inverted Doherty power amplifier 64 also includes a power splitter 72 coupled between an input IN and the carrier amplifier 66 and the peak amplifier 68. Also, a narrow-band λ/4 impedance inverter 74 that is communicatively coupled between outputs of the carrier amplifier 66 and the peak amplifier 68 through coupling capacitors C1 and C2.

Figures 5A, 5B:
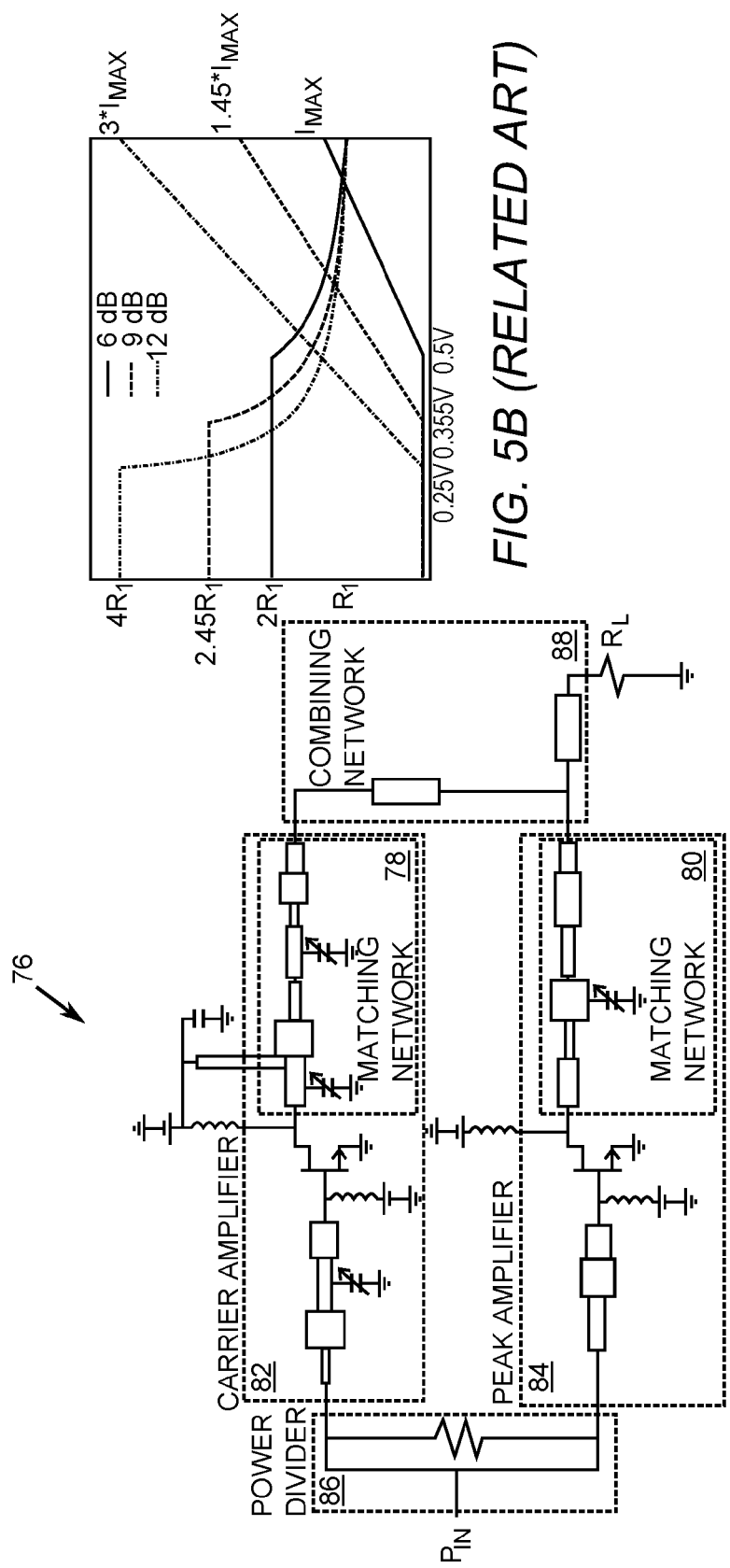
FIG. 5A is a schematic diagram of a related art reconfigurable tuned Doherty amplifier.
FIG. 5B is a graph depicting ideal carrier amplifier transistor impedance and peak amplifier current profiles for various peak-to-average power ratio (PAPR) type Doherty amplifiers.

FIG. 5A is a schematic of a related art reconfigurable Doherty amplifier 76 that in effect is tunable. The objective of this type of Doherty amplifier is to increase the efficiency of the power amplifier over a larger PAPR by augmenting the load modulation of the reconfigurable Doherty amplifier 76 using matching networks 78 and 80 made up of micro-electro-mechanical systems (MEMS) tuning networks at the outputs of a carrier amplifier 82 and a peak amplifier 84. However, it should be noted that this is not a continuous operation. Although the range of impedances presented to the carrier amplifier 82 is much larger than a conventional Doherty amplifier, the reconfigurable Doherty amplifier 76 still utilizes an increase of carrier load impedance as output power is backed off as opposed to a reduction of carrier load impedance taught for operation of the embodiments of the present disclosure. Furthermore, as shown in FIG. 5B, the impedance modulation range practiced for the reconfigurable Doherty amplifier 76 shows impedances larger than $R_L$ (50Ω), whereas the present embodiments may be configured to operate at impedance modulations below and above $R_L$. The reconfigurable Doherty amplifier 76 also includes a power divider 86 coupled between a power input $P_{IN}$ and the carrier amplifier 82 and the peak amplifier 84. A combining network 88 is coupled between the matching networks 78 and 80, and the load $R_L$.

Figure 6A:
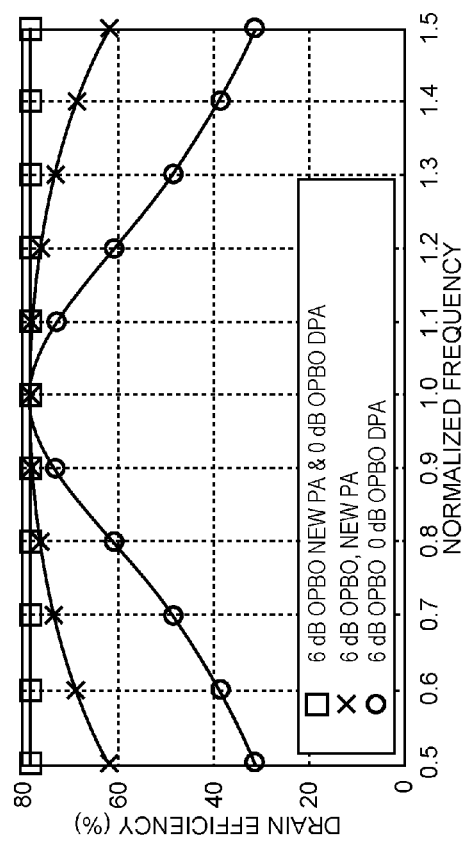
FIG. 6A is a graph of drain efficiency versus normalized frequency for a conventional Doherty amplifier of the related art.
Figure 6B:
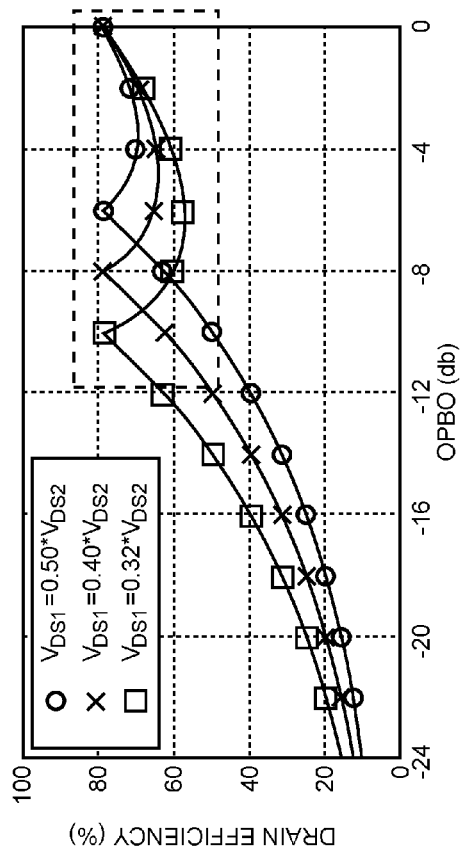
FIG. 6B is a graph of drain efficiency versus output power back off (OPBO) for a conventional Doherty amplifier of the related art.

FIGS. 6A and 6B are graphs for an enhanced related art Doherty amplifier using drain modulation. In these examples, the supply or drain voltage of the carrier amplifier is under output power backed-off conditions in order to further improve the output power efficiency. As shown, a larger OPBO efficiency range is one frequency bandwidth of operation that is also improved by eliminating the output impedance transformer. However, a traditional quarter wave impedance inverter remains included and is designed to have broadband at only the peak efficiency backed-off power level. A region shown inside a dashed box of FIG. 6B illustrates the improvement in OPBO when carrier $V_{DS1}$ supply is reduced compared to peak $V_{DS2}$.

FIGS. 7-11 are schematics of embodiments of the present disclosure. Embodiments of the present disclosure differ from the related art in at least the following significant ways. For one, the carrier amplifier of this disclosure in FIGS. 7-9 may be directly coupled to the zero phase transmission ports of a 4-port coupler, as opposed to coupling through a 90° phase shift to a summing node.

Moreover, the termination port impedance $Z_{ISO}$ of the coupler is adjustable such that the carrier amplifier load impedance decreases as power is backed off instead of increasing as in related art and the related art discussed above. Further still, the present embodiments are configured to adjust the termination port impedance $Z_{ISO}$ over a wider range such that the carrier amplifier load impedance port of the coupler may see a range from Zload/2 to greater than 2*Zload, where Zload is the nominal output port impedance of the coupler. This extends the reconfigurable OPBO efficiency region of the load modulated amplifier. Even further, the embodiments of the present disclosure provide enhanced load insensitivity by detecting the output VSWR and adjusting the coupler termination impedance above the nominal Zload impedance when the detected VSWR mismatch is due to a lower than Zload mismatch impedance, and vice versa (for a non-inverting load modulation configuration). This flexibility improves port to port isolation between the carrier amplifier and the peak amplifier, which is a drawback of conventional Doherty operation. Moreover, the $Z_{ISO}$ tuning range mode may be selected from at least the choices of 0-Zload, or Zload-2*Zload for improved load insensitive performance. Even further, load modulated amplification is reconfigurable using an open loop signal that adjusts termination impedance for maximizing power, efficiency, linearity, bandwidth, load insensitivity or a combination thereof.

Figure 7:
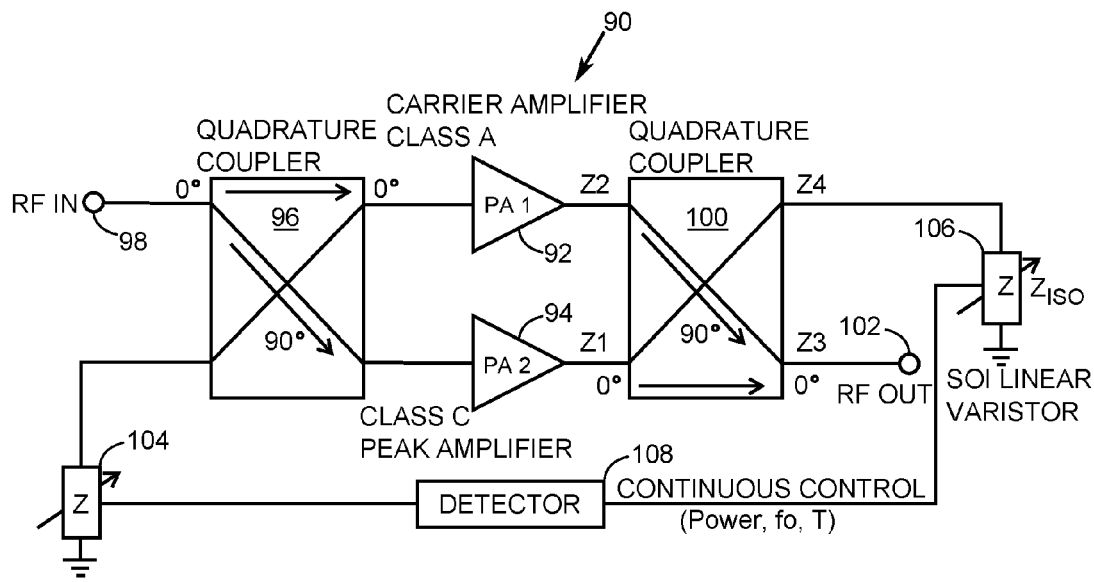
FIG. 7 is a schematic diagram of a first embodiment that in accordance with the present disclosure is a reconfigurable wideband load modulated power amplifier that is closed loop tunable.

FIG. 7 is a schematic diagram of a first embodiment, that in accordance with the present disclosure, is a reconfigurable load modulated power amplifier 90 that is wideband and closed loop tunable. A carrier amplifier 92 is biased for class A operation and a peak amplifier 94 is biased for class C operation. The carrier amplifier 92 and the peak amplifier 94 are coupled in parallel using a first quadrature coupler 96 at an input 98 and a second quadrature coupler 100 at an output load terminal 102. It should be noted that the bias of the peak amplifier 94 may be set for other classes such as A or AB in order to configure the amplifier for a desired response. An input impedance tuning network 104 is coupled between the first quadrature coupler 96 and ground. An output impedance tuning network 106 is coupled between the second quadrature coupler 100 and ground. A detector 108 is a controller that generates signals that tune the impedances of the input impedance tuning network 104 and the output impedance tuning network 106 under continuous control.

Figure 8:
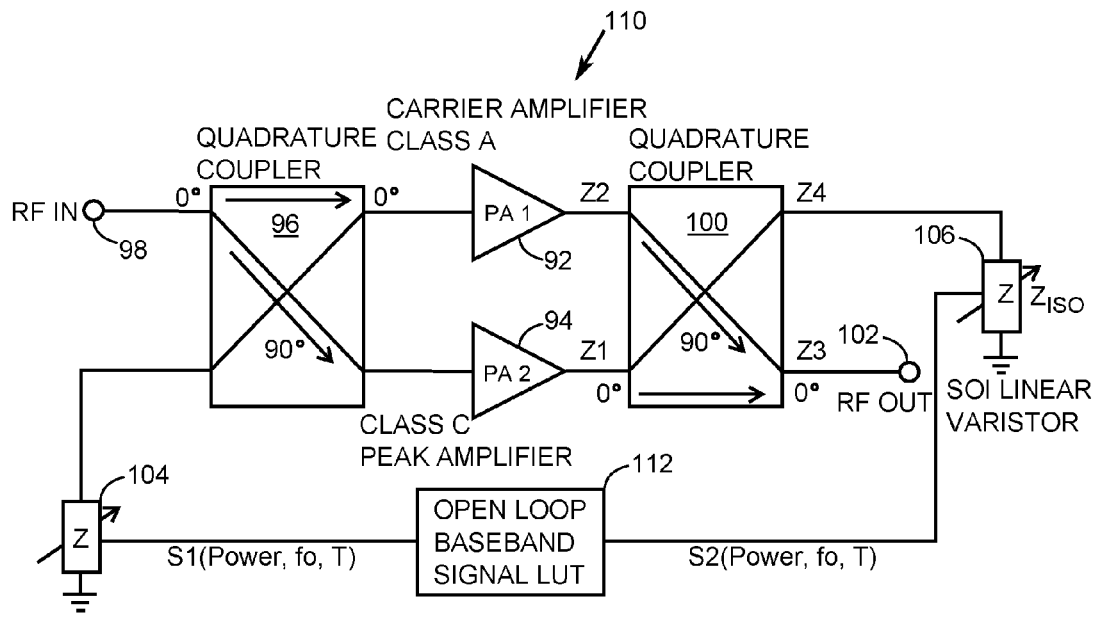
FIG. 8 is a schematic diagram of a second embodiment that in accordance with the present disclosure is a reconfigurable wideband load modulated power amplifier that is open loop tunable.

FIG. 8 is a schematic diagram of a second embodiment that in accordance with the present disclosure is a reconfigurable wideband load modulated power amplifier 110 that is open loop tunable. In particular, the reconfigurable wideband load modulated power amplifier 110 includes an open loop baseband signal look up table (LUT) 112 that is a controller that outputs baseband signals that include a first control signal S1 and a second control signal S2 that each are responsive to power, frequency f0, and temperature T or any combination thereof.

In the present case the desired goal is to achieve high efficiency at OPBO by use of amplifier load modulation. The quadrature couplers may be implemented as a Lange, a branch-line, or a coupled-line coupler construction or any other structure that provides a 90° phase split. In the embodiments shown in FIGS. 7 and 8, the polarity of the input couplers is such that the carrier amplifier 92 receives a signal that is in-phase with the input signal. The peak amplifier 94 receives a signal that has a 90° phase shift with respect to the input signal. To maintain proper power combining at the output, the carrier amplified output signal undergoes a 90° phase shift before combining at a common output node (Z3), while the peak amplified signal is coupled to the output with zero or no phase shift. A termination port (Z4) is presented with a variable isolation termination impedance, $Z_{ISO}$, which may be adjusted continuously or discretely to modulate a carrier amplifier load impedance (Z2) seen by the carrier amplifier 92 in order to improve efficiency as the output power is backed off of compression. This variable tuning impedance means may be realized by a silicon-on-insulator (SOI) linear varistor for continuous or closed loop operation. Alternatively, the variable tuning impedance may also be realized by a switched impedance network of inductors, resistors, and capacitors using MEMs or SOI switch technologies. The input impedance tuning network 104 at a $4^{th}$ (isolation) port of the input quadrature 4-port coupler may be tuned in conjunction with the output impedance tuning network 106 in order to adjust the amplitude and phase combining of the carrier and peak amplifiers 92, 94 for best power performance. The impedance tuning networks 104 and 106 are controlled by the baseband signals that are generated by the detector 108 (FIG. 7), or by baseband generated control signals S1 and S2 generated by the open loop baseband signal LUT 112 (FIG. 8) that may be in response to output detected power, input detector power, DC current characteristics of the peak amplifier and the carrier amplifier, or output VSWR mismatch information.

Unlike a Doherty amplifier or the other related art discussed above, the embodiments of FIGS. 7 and 8 operate where $Z_{ISO}$ is tuned such that Z2 presented to the carrier amplifier 92 may be lower than the nominal load impedance, Zload (which is typically 50Ω), in order to obtain high OPBO efficiency. This is counter to the 2*Zload, in this case ~100Ω, typically presented to the carrier amplifier at 6 dB OPBO for Doherty operation. Secondly, the embodiments of FIG. 7 and FIG. 8 practice a range of Z2 impedances (~Zload/2 to ~2*Zload that are presented to the carrier amplifier 92 that is twice that of a conventional Doherty amplifier. Thirdly, it is demonstrated in this disclosure that the isolation characteristics of the coupler between the carrier amplifier Z2 and peak amplifier Z1 may be improved under output VSWR mismatch by adjusting the $Z_{ISO}$ impedance to be >Zload (50Ω) when the VSWR mismatch is due to an output impedance <Zload (50Ω) or vice versa.

A significant application is realized by a wide range of carrier and peak amplifier load impedances that is used as a general load modulation means for improving power efficiency. For example, in conjunction with envelope tracking (ET) or supply modulation techniques, where the supply is reduced at lower power levels for the carrier amplifier to improve power efficiency at OPBO, $Z_{ISO}$ may be tuned such that the carrier amplifier load impedance Z2 is lower than Zload (50Ω) to provide an efficient load at the lower supply condition. The Z2 carrier load tuning provides an extra degree of freedom to appropriately set the power and efficiency load line on the I-V curves of a power transistor of the carrier amplifier 92. Moreover, the same technique may be applied to a power amplifier system where drain voltage and bias current are both throttled down at lower powers to improve efficiency. The ability to adjust the load line can enable linear operation in addition to efficiency operation. This capability is very useful for improving the power efficiency of gallium nitride-based devices and PAs whose high (~5V) I-V knee voltage limits the efficiency performance when operating at lower supply and drain voltages. The extra degree of freedom to modulate the load impedance of the amplifier enables improvement in efficiency when the minimum practical drain voltage is reached in an envelope tracking system.

Figure 9:
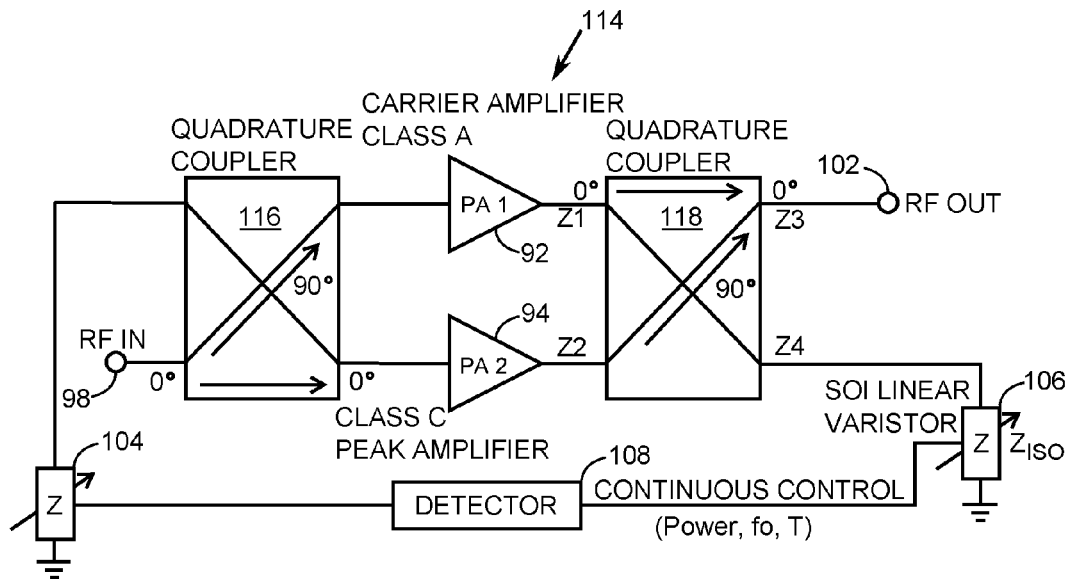
FIG. 9 is a schematic diagram of a third embodiment that in accordance with the present disclosure is a reconfigurable wideband inverted phase load modulated power amplifier that is closed loop tunable.
Figure 10:
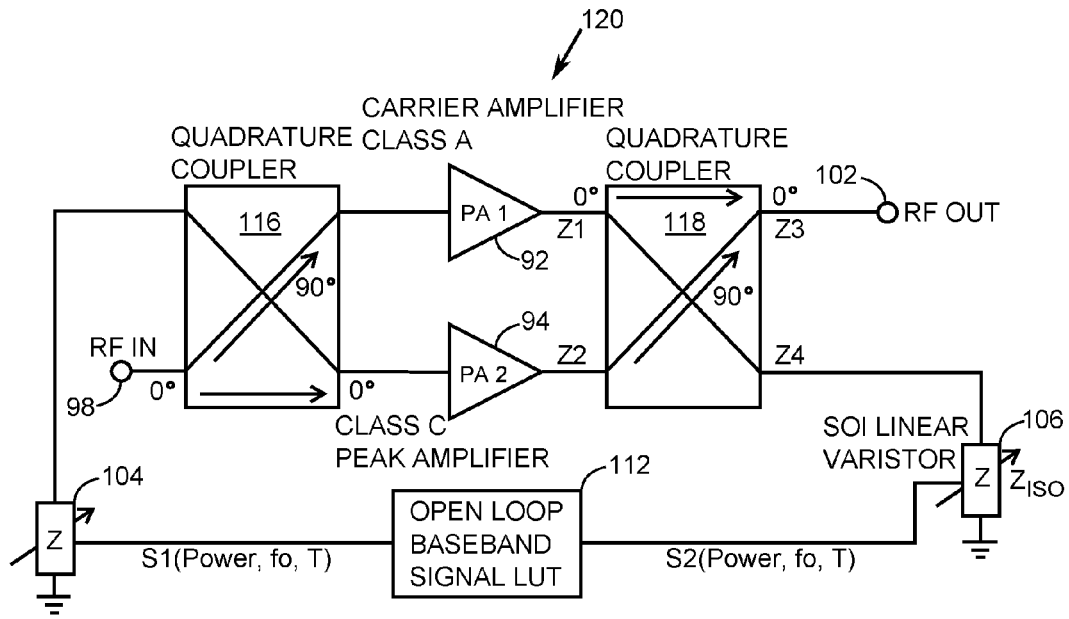
FIG. 10 is a schematic diagram of a fourth embodiment that in accordance with the present disclosure is a reconfigurable wideband inverted phase load modulated power amplifier that is open loop tunable.
Figure 11:
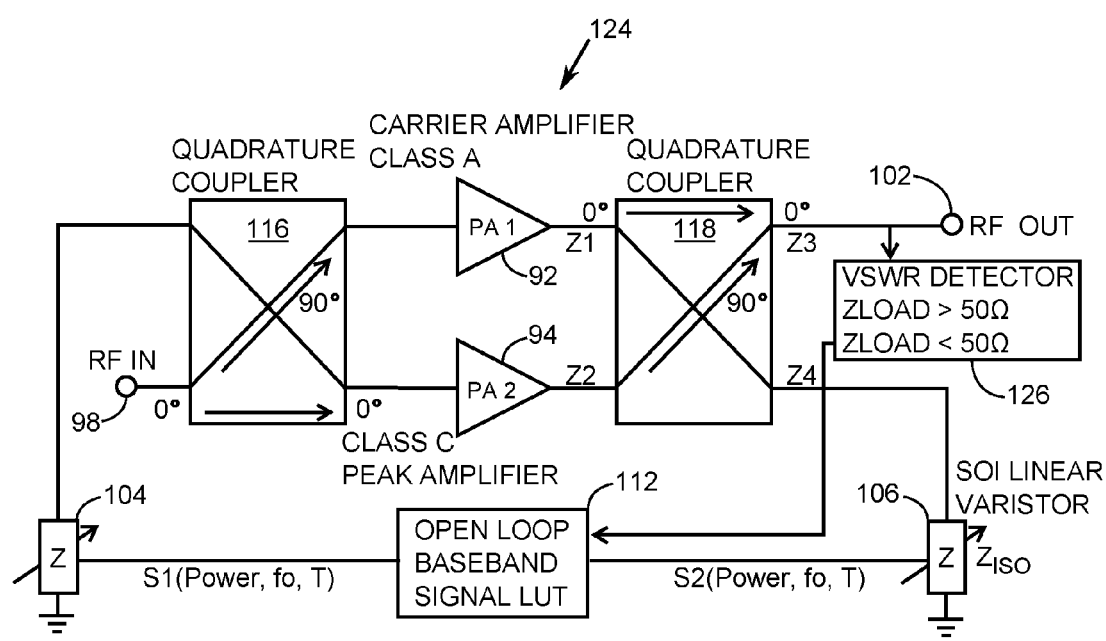
FIG. 11 is a schematic diagram of a fifth embodiment that in accordance with the present disclosure is a reconfigurable wideband inverted phase load modulated power amplifier that is open loop tunable.

FIGS. 9-11 show the $3^{rd}$, $4^{th}$ and 5th embodiments of the present disclosure. These embodiments are fundamentally different from the $1^{st}$ and $2^{nd}$ embodiments in the phase combining of the carrier amplifier 92 and the peak amplifier 94 and depart from the phase combining of the Doherty amplifier operation in general. Beginning with FIG. 9, a reconfigurable wideband inverted phase load modulated power amplifier 114 that is closed loop tunable is shown. In particular, the carrier amplifier 92 biased in class A and the peak amplifier 94 biased in class C are in a combined parallel connection using a first quadrature coupler 116 at the input and a second quadrature coupler 118 at the output load terminal 102. It should be noted that the bias of the peak amplifier 94 may be set for other classes such as A or AB in order to configure the amplifier for a desired response. In the present case the desired goal is to achieve high efficiency at OPBO by use of amplifier load modulation. The quadrature couplers 116 and 118 may be implemented as a Lange, a branch-line, or a coupled-line coupler construction or any other structure that provides a 90 degree phase split. In these $3^{rd}$, $4^{th}$ and $5^{th}$ embodiments, the polarity of the input couplers are different than in the $1^{st}$ and $2^{nd}$ embodiments, and are such that the carrier amplifier 92 receives a signal that is phase shifted 90 degrees with respect to the input signal. The peak amplifier 94 receives a signal that is in-phase (0 degree phase shifted) with respect to the input signal.

To maintain proper power combining at the output, the carrier amplified output signal undergoes zero or no phase shift before combining at the common output node (Z3), while the peak amplified signal is coupled to the output with 90 degree phase shift. Unlike the $1^{st}$ and $2^{nd}$ embodiments and the related art discussed above, the termination port (Z4) is presented with a variable isolation termination impedance, $Z_{ISO}$, which may be adjusted continuously or discretely to modulate the carrier amplifier load impedance (Z1) seen by the carrier amplifier 92 in order to improve efficiency as the output power is backed off of compression. This variable tuning impedance means may be realized by an SOI linear varistor for continuous or closed loop operation. The variable tuning impedance may also be realized by a switched impedance network of inductors, resistors, and capacitors using micro-mechanical-systems (MEMS) switch networks or SOI switch technologies. The input impedance tuning network 104 at the $4^{th}$ (isolation) port of the input quadrature 4-port coupler may be tuned in conjunction with the output impedance tuning network 106 in order to adjust the amplitude and phase combining of the carrier and peak amplifiers 92, 94 for best power performance. The impedance tuning networks 104, 106 may be controlled with a control signal that is generated by the detector 108, a look up table (LUT) or baseband generated signals ($4^{th}$ embodiment) that may be in response to output detected power, input detected power, DC current characteristics of the peak amplifier 94 and the carrier amplifier 92, or output VSWR mismatch information ($5^{th}$ embodiment). For example, FIG. 10 is a schematic diagram of the $4^{th}$ embodiment that in accordance with the present disclosure is a reconfigurable wideband inverted phase load modulated power amplifier 120 that is open loop tunable by way of the open loop baseband signal LUT 112.

Unlike a Doherty amplifier, the related art discussed above, or the $1^{st}$ and $2^{nd}$ embodiments, the $3^{rd}$, $4^{th}$ and $5^{th}$ embodiments operate wherein firstly $Z_{ISO}$ so is tuned such that Z1 presented to the carrier amplifier 92 may be lower than the nominal load impedance, Zload (which is typically 50Ω), in order to obtain high OPBO efficiency characteristics. Presenting Z1 lower to the carrier amplifier 92 is counter to the ~2*Zload (~100Ω) typically presented to the carrier amplifier at 6 dB OPBO for Doherty operation. Secondly, the $3^{rd}$, $4^{th}$ and $5^{th}$ embodiments are practicing a range of Z1 impedances (~Zload/2 to ~2*Zload, FIG. 12) presented to the carrier amplifier or peak amplifier that is twice that of a conventional Doherty amplifier. Thirdly, it is demonstrated in this disclosure that the isolation characteristics of the coupler between the carrier amplifier Z1 and peak amplifier Z2 may be improved under output VSWR mismatch by adjusting the $Z_{ISO}$ impedance to be >Zload (50Ω) when the VSWR mismatch is due to an output impedance <Zload (50Ω) or vice versa.

A significant application of the embodiments of the present disclosure is that a wide range of the carrier amplifier and the peak amplifier load impedances may be used as a general load modulation means for improving power efficiency. For example, in conjunction with envelope tracking or supply modulation techniques where the supply is reduced at lower power levels for the carrier amplifier to improve power efficiency at OPBO, $Z_{ISO}$ may be tuned such that the carrier amplifier load impedance Z1 is lower than Zload (50Ω) to provide an optimized load at the lower supply condition. This Z1 carrier load tuning provides an extra degree of freedom to tune the power and efficiency load line on the I-V curve of the power transistor of the carrier amplifier 92 for a desired performance. Moreover, the same technique may be applied to a power amplifier system where drain voltage and bias current are both throttled down at lower powers to improve efficiency. The ability to adjust the load line can enable linear operation in addition to efficiency operation. This capability is very useful for improving the power efficiency of gallium nitride-based devices and power amplifiers whose high (~5V) I-V knee voltage limits the efficiency performance when operating at lower supply and drain voltages. The extra degree of freedom to modulate the load impedance of the amplifier enables improvement in efficiency when the minimum practical drain voltage is reached in an envelope tracking system.

FIG. 11 is a schematic diagram of a $5^{th}$ embodiment that in accordance with the present disclosure is a reconfigurable wideband inverted phase load modulated power amplifier 124 that is open loop tunable. This $5^{th}$ embodiment shows an application of the $3^{rd}$ and $4^{th}$ embodiments, but is also applicable to the $1^{st}$ and $2^{nd}$ embodiments for improving the load-insensitivity of the load modulated power amplifier under high VSWR conditions such as when there is a mismatch with an antenna coupled to the output of the load modulated power amplifier. This $5^{th}$ embodiment shows a system where the output VSWR is detected through VSWR detector 126 that includes circuitry that determines the mismatched load impedance. For example, the VSWR detection circuitry can detect real and imaginary or S-parameter magnitude and angle or other VSWR related parameters. This information is usable to determine whether the VSWR is due to a mismatched load impedance (Zload) that is >50Ω (nominal design) or <50Ω in its simplest practice.

Figure 13:
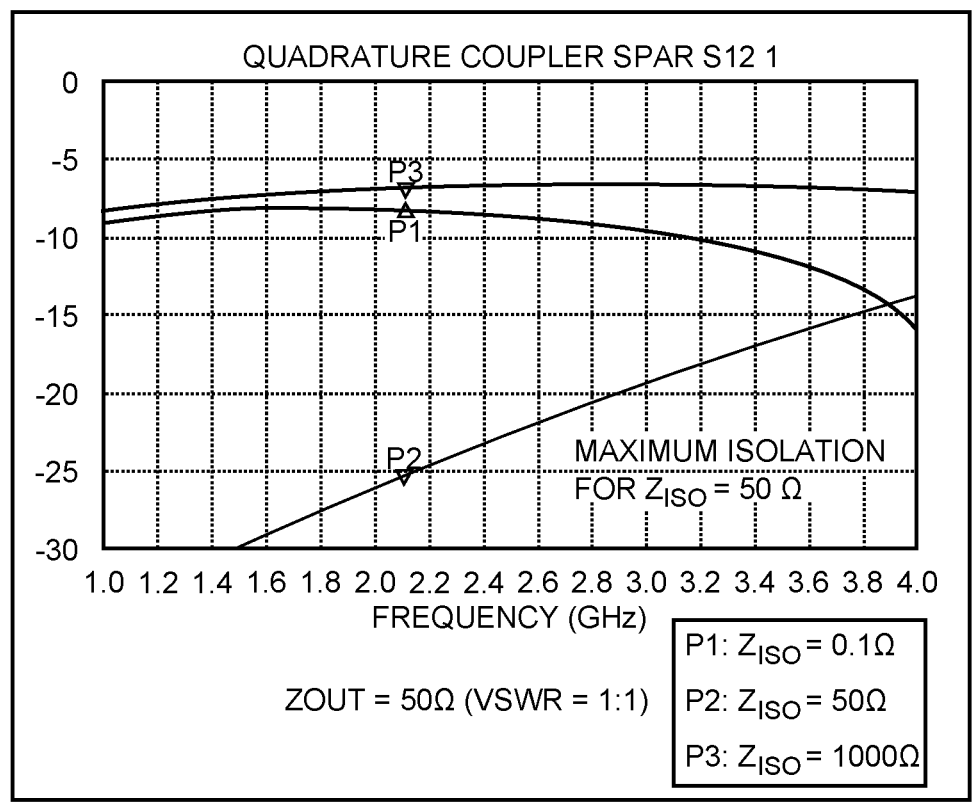
FIG. 13 is a graph depicting 4-port quadrature coupler scattering parameter S12 isolation between the carrier amplifier and the peak amplifier during operation with output impedance of 50Ω and a voltage standing wave ratio (VSWR) of 1:1.
Figure 14:
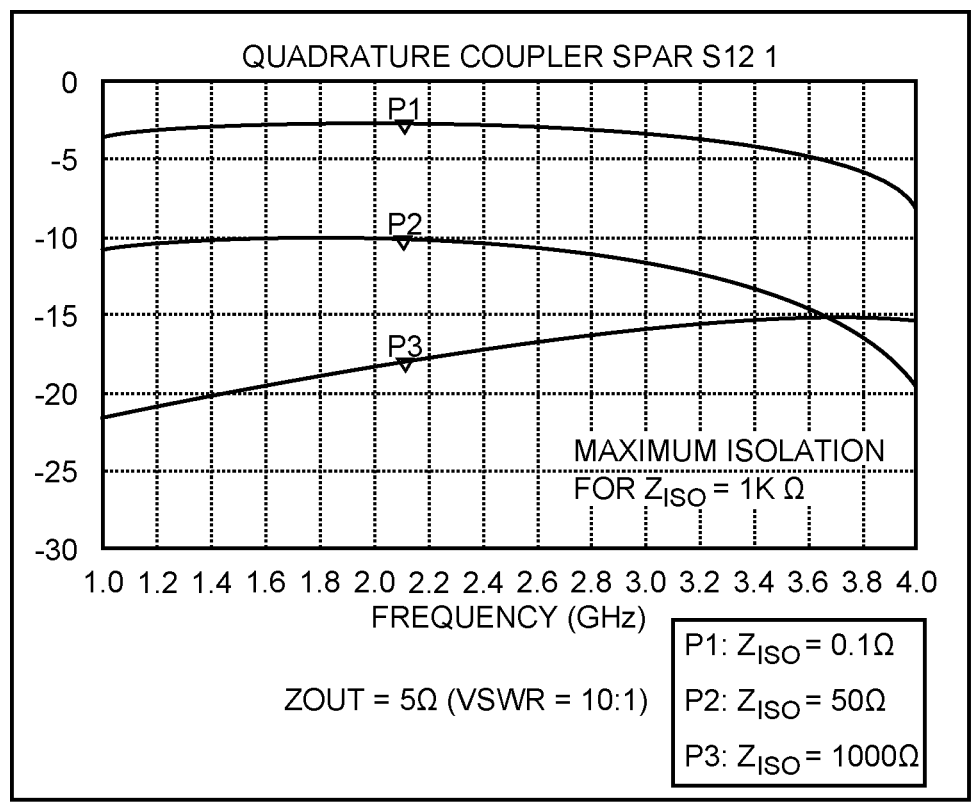
FIG. 14 is a graph depicting 4-port quadrature coupler scattering parameter S12 isolation between the carrier amplifier and the peak amplifier during operation with an output impedance of 5Ω and a VSWR of 10:1.
Figure 15:
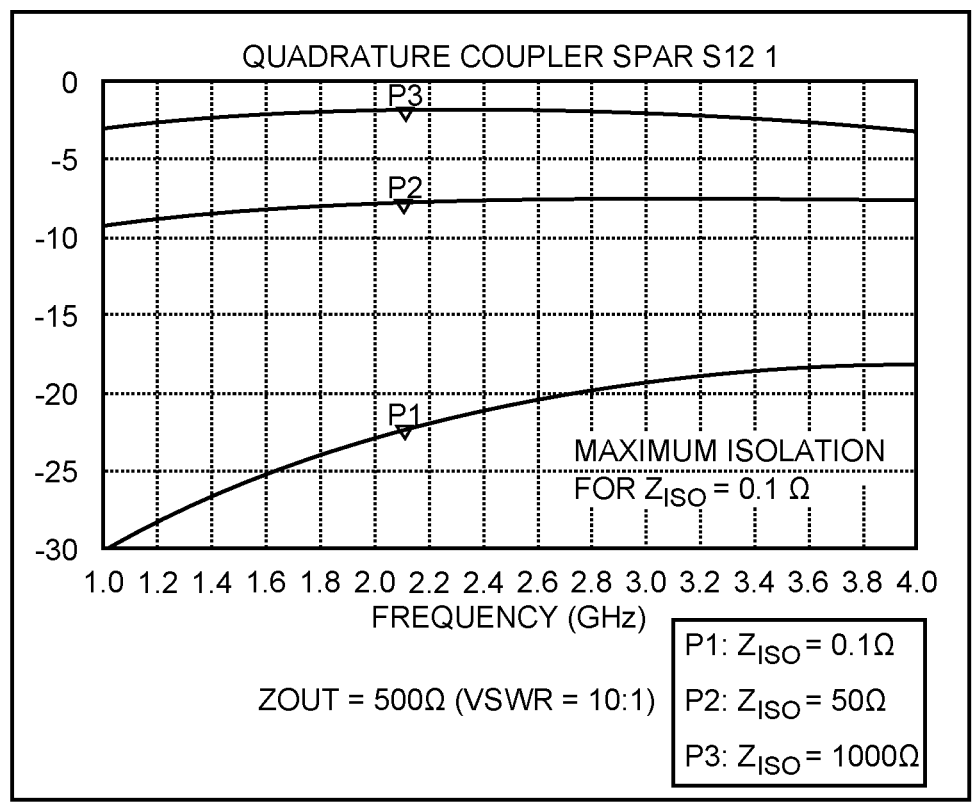
FIG. 15 is a graph depicting 4-port quadrature coupler scattering parameter S12 isolation between the carrier amplifier and the peak amplifier during operation with an output impedance of 500Ω and a VSWR of 10:1.

The characteristic nature of a quadrature coupler which is illustrated in FIGS. 13, 14, and 15, indicate that when the output is perfectly matched to 50Ω and $Z_{ISO}$ is 50Ω, the isolation between the coupler impedance ports Z1 and Z2, corresponding to the isolation between the carrier amplifier 92 and the peak amplifier 94, is excellent, as illustrated in FIG. 13. When the output port (Z3) is mismatched with a 5Ω output load corresponding to a 10:1 VSWR mismatched condition, then the isolation degrades when $Z_{ISO}$ is 50Ω or less. However, if $Z_{ISO}$ is increased to a value >50Ω, the isolation between ports Z1 and Z2 improves dramatically. When the output port (Z3) is mismatched with a 500Ω output load corresponding to a 10:1 VSWR mismatched condition, then the isolation degrades when $Z_{ISO}$ is 50Ω or greater. However, if $Z_{ISO}$ is decreased to a value <50Ω, the isolation between ports Z1 and Z2 improves dramatically. It is illustrated in FIGS. 16-23 that improved OPBO efficiency may be achieved in either region where $Z_{ISO}$ is >50Ω or $Z_{ISO}$<50Ω. Therefore, a means for providing load insensitivity and high OPBO efficiency may be achieved by detecting the VSWR mismatch condition and tuning $Z_{ISO}$ in the appropriate region for maximum efficiency:
1) When VSWR detector measures Zload>50Ω, $Z_{ISO}$ is optimized for <50Ω
2) When VSWR detector measures Zload<50Ω, $Z_{ISO}$ is optimized for >50Ω

This may be implemented through a pre-calibrated LUT that contains optimum efficiency solutions for $Z_{ISO}$ as a function of (Pin, frequency, VSWR mismatch information) as an example.

An exemplary embodiment of the present disclosure was modeled and simulated in a gallium nitride (GaN) high electron mobility transistor (HEMT) technology with a transition frequency fT~90 GHz and off-state breakdown voltage of ~50V. The knee voltage of the I-V characteristics of the technology is ~5V while the nominal supply voltage is no greater than 12V at an approximate current density of 500 mA/mm of gate periphery. Embodiments of this disclosure were designed using AWR Corporation's microwave office (MWO) simulation tools with a foundry process design kit (PDK).

Figure 12:
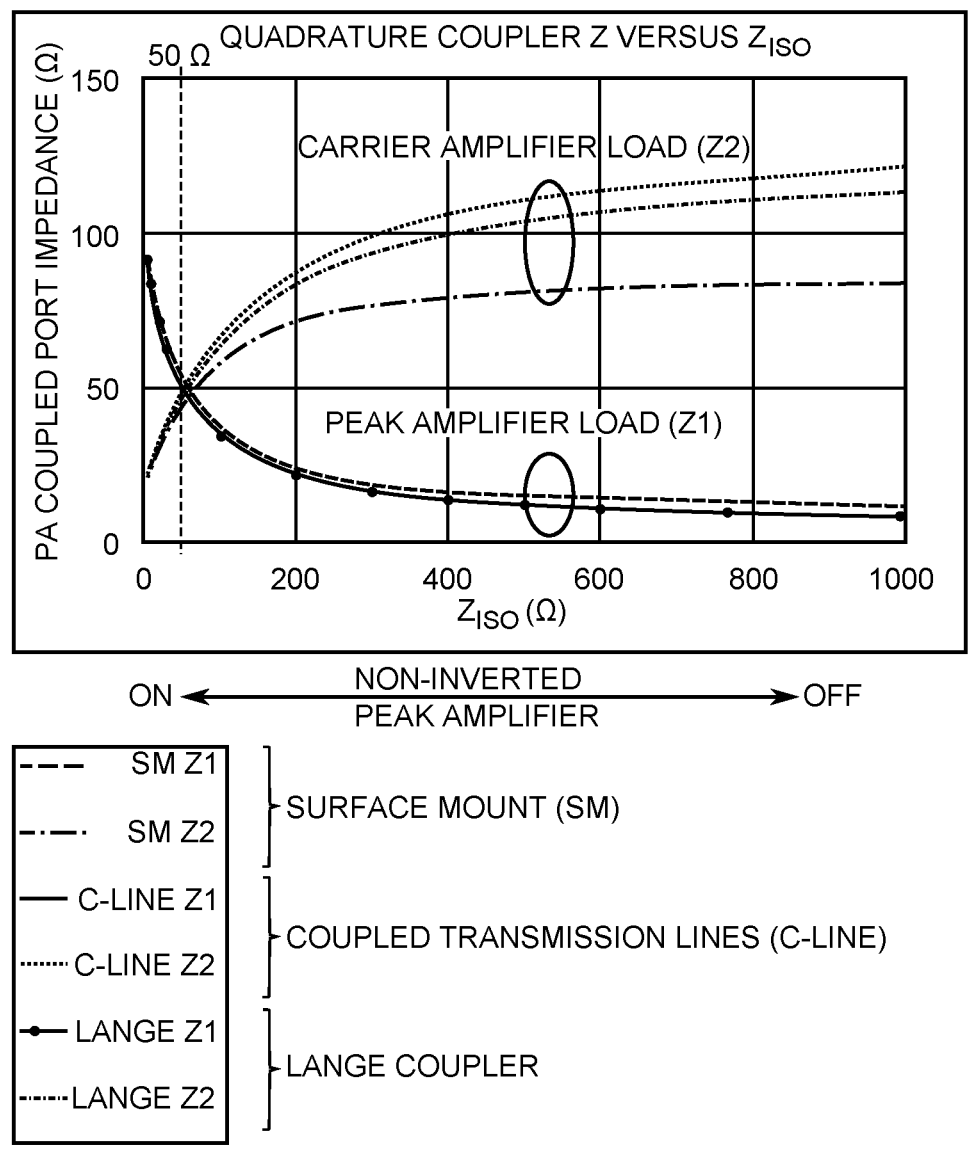
FIG. 12 is a graph depicting 4-port quadrature coupler impedance modulation in accordance to the present disclosure.

FIG. 12 shows the 4-port quadrature coupler impedance modulation of the carrier amplifier 92 (Z2, zero degree) and peak amplifier 94 (Z1, 90 degree) amplifier load impedance ports as a function of the isolation termination impedance $Z_{ISO}$. It should be recognized that $Z_{ISO}$ at Z4 may also be complex impedance. For simplicity Z2 and Z1 load impedance characteristics are shown for swept real values of $Z_{ISO}$ for various quadrature couplers, 1) Surface Mount Branchline, 2) Coupled line, and 3) Lange. The Lange coupler has the widest frequency bandwidth capability and also shows the widest range of the carrier amplifier (Z2) and the peak amplifier (Z1) port impedance tuning range. The impedance tuning range for Z2 may vary from Zload/2 to greater than 2*Zload where Zload is the normalized 50Ω coupler characteristic impedance. This range is 2 times larger than a conventional symmetric 2-way Doherty impedance inverter which typically ranges from Zload up to 2*Zload at 6 dB back off power. Therefore, the embodiments of the present disclosure provide both two times greater load modulation as well as the ability to modulate the impedance below Zload, unlike the conventional Doherty impedance inverter operation. Moreover, the present disclosure demonstrates that high efficiency may be achieved by inverting the direction of the impedance modulation where the carrier amplifier load Z2 is tuned for lower impedance than Zload at output power back off (OPBO) ($Z_{ISO}$<Zload) while the peak amplifier 94 is tuned for high impedance Z1 at OPBO which is the opposite of the Doherty operation. Therefore, embodiments of this disclosure can be assigned to a more general load modulated amplifier class.

FIG. 13 is a graph illustrating that when the output is matched, the best carrier-peak amplifier isolation occurs when $Z_{ISO}$ is equal to Zload=Zout=50Ω. At the extreme $Z_{ISO}$ impedances of 0.1Ω and 1KΩ, the isolation is still reasonably better than 7 dB across a wide band but is not ideal. However, it is still better than the isolation a quarter-wave impedance inverter would be able to achieve across this 2 octave frequency band or even a more modest 2-2.7 GHz cellular application band. Under extreme output VSWR mismatches it will be shown that $Z_{ISO}$ may be chosen to improve the 2 octave broadband isolation by choosing one of two ranges of $Z_{ISO}$: 1) $Z_{ISO}$>Zload or 2) $Z_{ISO}$<Zload (50Ω).

FIG. 14 is a graph showing that when the output has a VSWR of 10:1 due to a Zout impedance of 5Ω (Zout<50Ω), a $Z_{ISO}$ in the range of >50Ω may be chosen for improved isolation and optimum efficiency performance. Later in the disclosure it will be shown that a $Z_{ISO}$ may be chosen in either $Z_{ISO}$>50Ω or $Z_{ISO}$<50Ω ranges to achieve the enhanced OPBO efficiency, counterintuitive to Doherty amplifier operation, and therefore this disclosure is referred to more generally as a load modulation amplifier.

FIG. 15 is a graph illustrating that when the output has a VSWR of 10:1 due to a Zout impedance of 500Ω (Zout>50Ω), a $Z_{ISO}$ in the range of <50Ω may be chosen for improved isolation and optimum efficiency performance. Later in the disclosure it will be shown that a $Z_{ISO}$ may be chosen in either $Z_{ISO}$>50Ω or $Z_{ISO}$<50Ω to achieve the enhanced OPBO efficiency, counterintuitive to Doherty operation and conventional wisdom.

Figure 16:
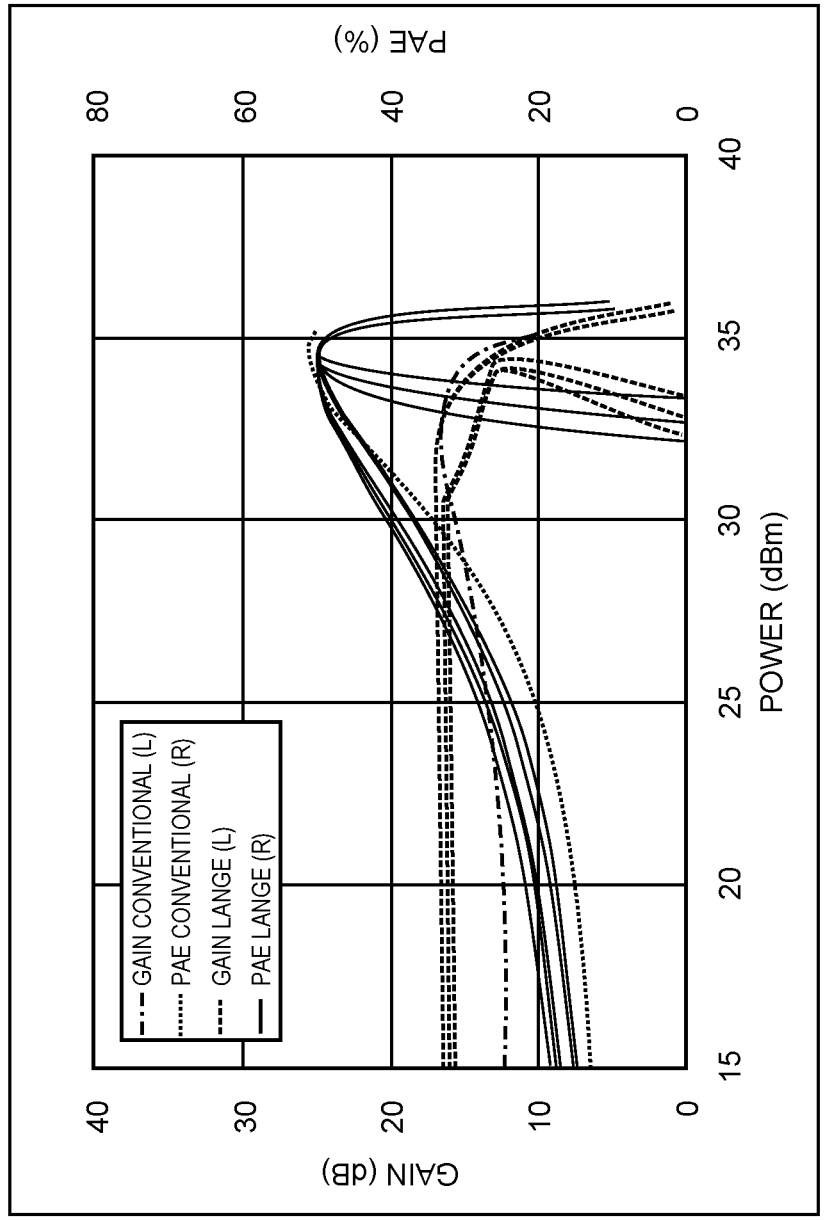
FIG. 16 is a graph depicting gain versus power for a Lange-coupled modulated amplifier during operation at isolation termination impedances of 50Ω, 100Ω, 500Ω, 1000Ω, and 5000Ω.

FIG. 16 is a graph depicting gain and power added efficiency (PAE) versus Pout for the Lange-coupled load modulated amplifier of the $1^{st}$ and $2^{nd}$ embodiments where the isolation impedance $Z_{ISO}$ is swept from 50Ω to 5KΩ. Also shown as a reference comparison is the gain and PAE versus Pout for a conventional 2-way Doherty Amplifier. As $Z_{ISO}$ is increased the Z2 load presented by the coupler to the carrier amplifier also increases and results in a higher increase in PAE as the output power is backed off. Note that the gain is flat, exhibiting reasonably low AM-AM distortion. The AM-PM distortion (not shown) is also well behaved and is less than a couple of degrees over the applicable output power range. Also note that these amplifiers were designed with linear operation as a focus.

Figure 17:
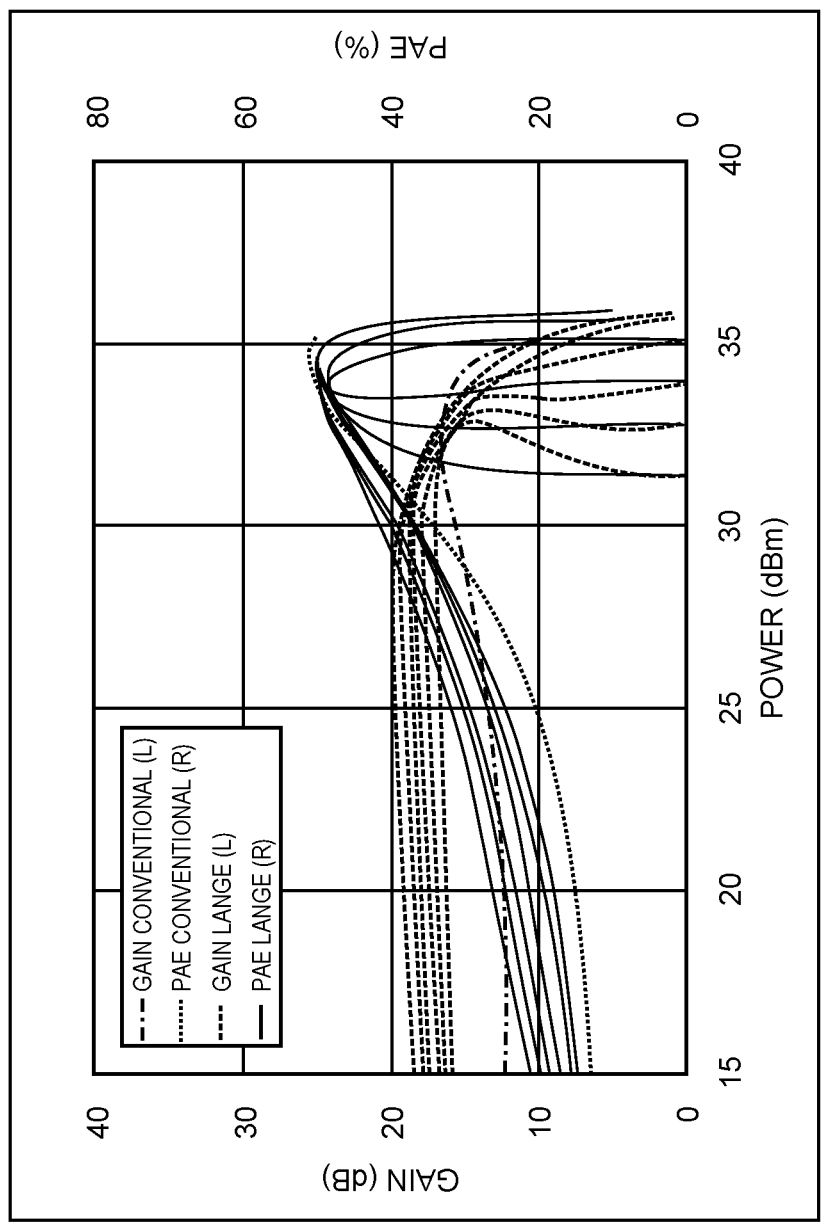
FIG. 17 is a graph depicting gain versus power for a Lange-coupled load modulated amplifier during operation at isolation termination impedances of 0Ω, 5Ω, 10Ω, 20Ω, 30Ω, 40Ω and 50Ω.

FIG. 17 is graph illustrating gain and PAE versus Pout for the Lange-coupled load modulated amplifier of the $1^{st}$ and $2^{nd}$ embodiments (FIGS. 7 and 8), where the isolation impedance $Z_{ISO}$ is swept from 50Ω to 0Ω. Also shown as a reference comparison is the gain and PAE versus Pout for a conventional 2-way Doherty amplifier. As $Z_{ISO}$ is decreased, the Z2 load presented by the coupler to the carrier amplifier also decreases, and results in a higher increase in PAE as the output power is backed off. This mode of operation departs from the traditional Doherty operation where the carrier amplifier is presented a lower impedance (~Zload/2) at OPBO and actually resulted in slightly better OPBO efficiency than when the carrier amplifier was presented a large impedance (~2*Zload) under OPBO operation (Doherty type amplifier). This is believed to be due to the complex characteristics of the quadrature coupler combined with the carrier amplifier and peak amplifier bias settings where a more favorable complex load line is provided. Note that the gain is still flat, exhibiting reasonably low AM-AM distortion. The AM-PM distortion (not shown) is also well behaved and is less than a couple of degrees over the applicable output power range. Also note that these amplifiers were designed with linear operation as a focus.

Figure 18:
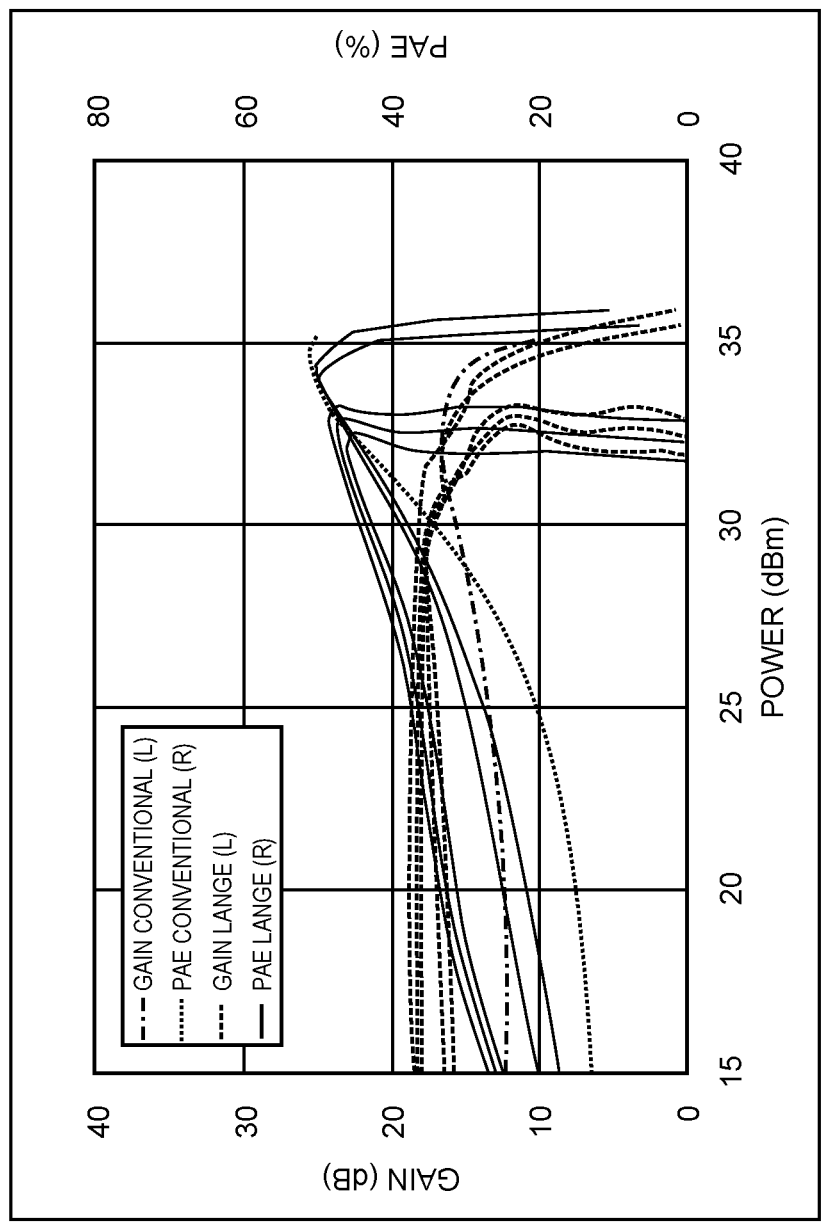
FIG. 18 is a graph depicting gain versus power for a Lange-coupled inverted load modulated amplifier during operation at isolation termination impedances of 50Ω, 100Ω, 500Ω, 1000Ω, and 5000Ω.
Figure 19:
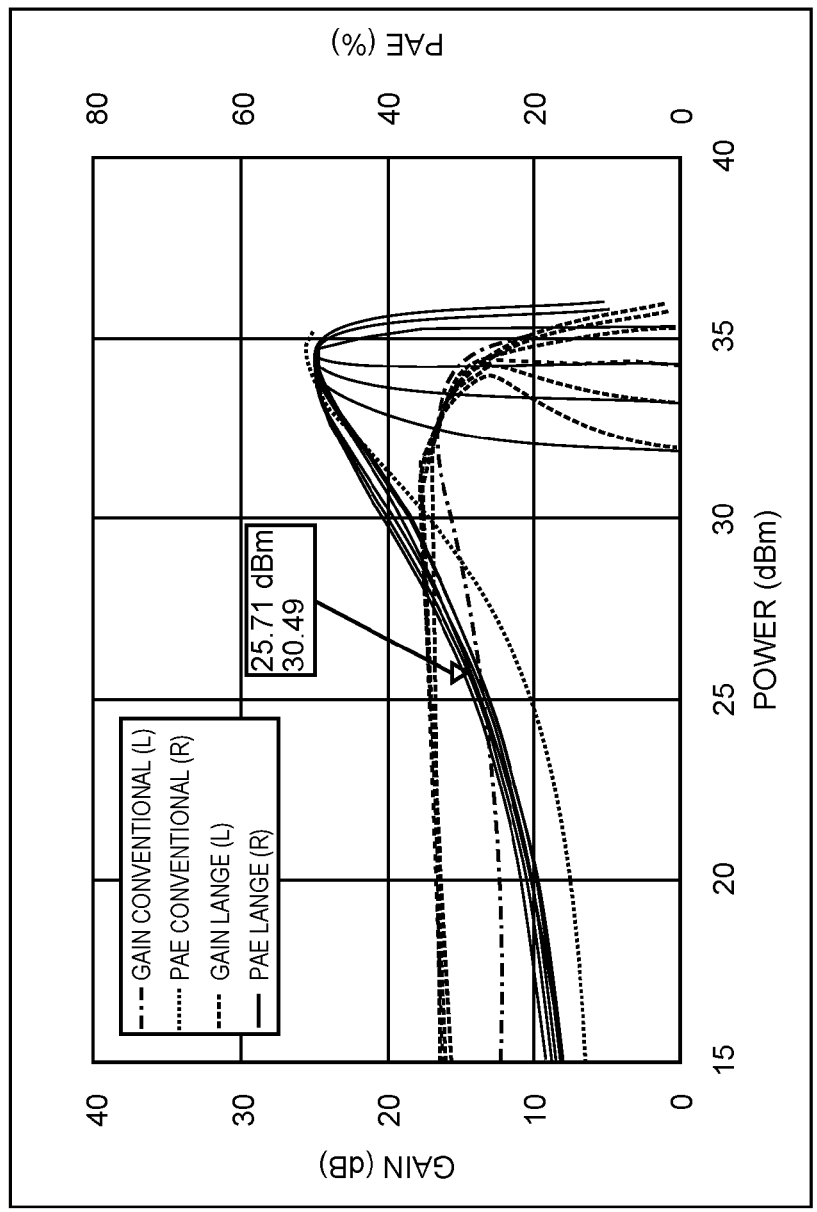
FIG. 19 is a graph depicting gain versus power for a Lange-coupled inverted load modulated amplifier during operation at isolation termination impedances of 0Ω, 5Ω, 10Ω, 20Ω, 30Ω, 40Ω and 50Ω.

FIG. 18 is a graph depicting gain and PAE versus Pout for the Lange-coupled inverted load modulated amplifier of the $3^{rd}$ through $5^{th}$ embodiments (FIGS. 9-11) where the isolation impedance $Z_{ISO}$ is swept from 50Ω to 5KΩ. Also shown as a reference comparison is the gain and PAE versus Pout for a conventional 2-way Doherty amplifier. As $Z_{ISO}$ is increased, the Z1 load presented by the coupler 118 to the carrier amplifier 92 decreases and results in a higher increase in PAE as the output power is backed off. This mode of operation departs from the traditional Doherty amplifier operation where the carrier amplifier is presented a lower impedance (~Zload/2) at OPBO and actually resulted in slightly better OPBO efficiency than when the carrier amplifier 92 was presented a large impedance (~2*Zload) under OPBO operation (Doherty type amplifier) as shown in FIG. 19. This is believed to be due to the complex characteristics of the quadrature coupler combined with the carrier amplifier and peak amplifier bias settings where a more optimum complex load line is provided. Note that the gain is still flat, exhibiting reasonably low AM-AM distortion. The AM-PM distortion (not shown) is also well behaved and is less than a couple of degrees over the applicable output power range. Also note that the amplifiers 114, 120, and 124 were designed with linear operation as a focus.

FIG. 19 is a graph illustrating gain and PAE versus Pout for the Lange-coupled inverted load modulated amplifier of the $3^{rd}$ through $5^{th}$ embodiments (FIGS. 9-11), where the isolation impedance $Z_{ISO}$ is swept from 0Ω to 50Ω. Also shown as a reference comparison is the gain and PAE versus Pout for a conventional 2-way Doherty amplifier. As $Z_{ISO}$ is decreased, the Z1 load presented by the coupler 118 to the carrier amplifier 92 increases and results in a higher increase in PAE as the output power is backed off. Note that the gain is flat, exhibiting reasonably low AM-AM distortion. The AM-PM distortion (not shown) is also well behaved and is less than a couple of degrees over the applicable output power range. Also note that the amplifiers 114, 120, and 124 were designed with linear operation as a focus.

Figure 20:
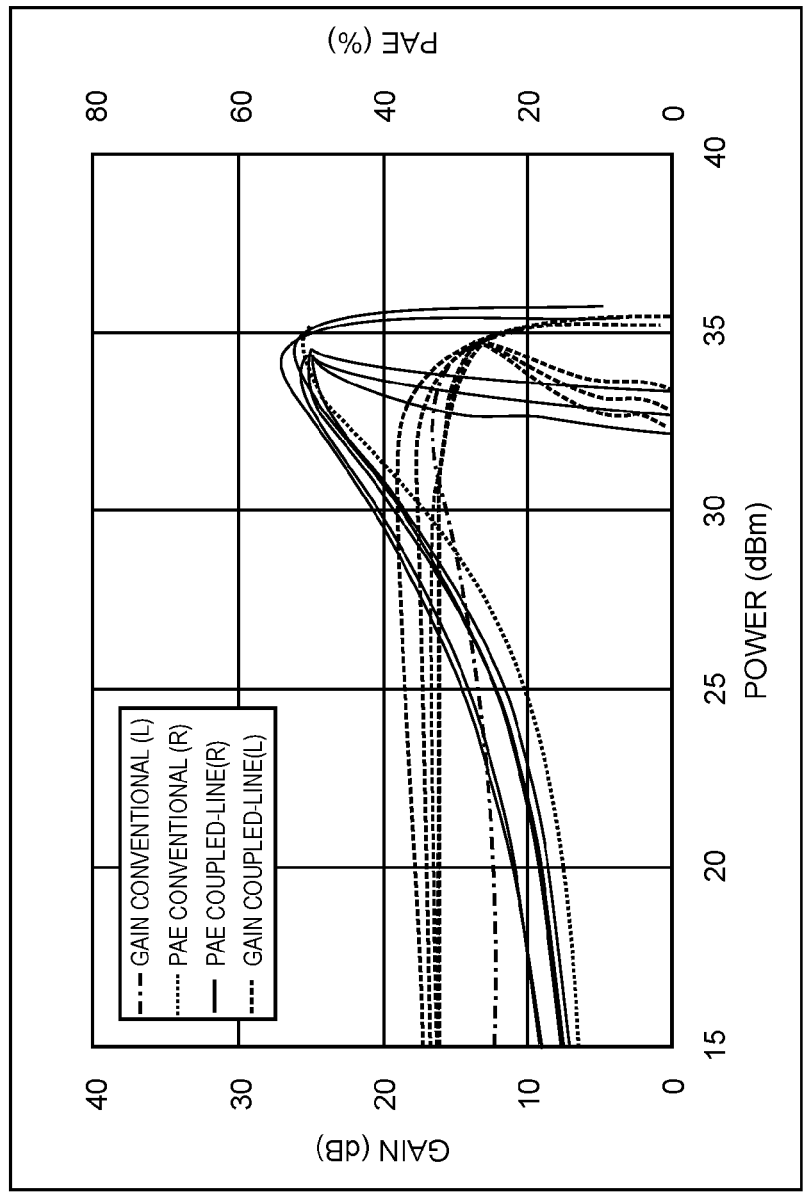
FIG. 20 is a graph depicting gain versus power for a quadrature coupled-line load modulated amplifier during operation at isolation termination impedances of 50Ω, 100Ω, 500Ω, 1000Ω, and 5000Ω.

FIG. 20 is a graph showing gain and PAE versus Pout for the quadrature coupled line load modulated amplifier of the $1^{st}$ and $2^{nd}$ embodiments (FIGS. 7 and 8) where the isolation impedance $Z_{ISO}$ is swept from 50Ω to 5KΩ. Also shown as a reference comparison is the gain and PAE versus Pout for a conventional 2-way Doherty. As $Z_{ISO}$ is increased the Z2 load presented by the coupler to the carrier amplifier also increases and results in a higher increase in PAE as the output power is backed off. Note that the gain is flat exhibiting reasonably low AM-AM distortion. The AM-PM distortion (not shown) is also well behaved and is less than a couple of degrees over the applicable output power range. Also note that the amplifiers 90 and 110 were designed with linear operation as a focus.

Figure 21:
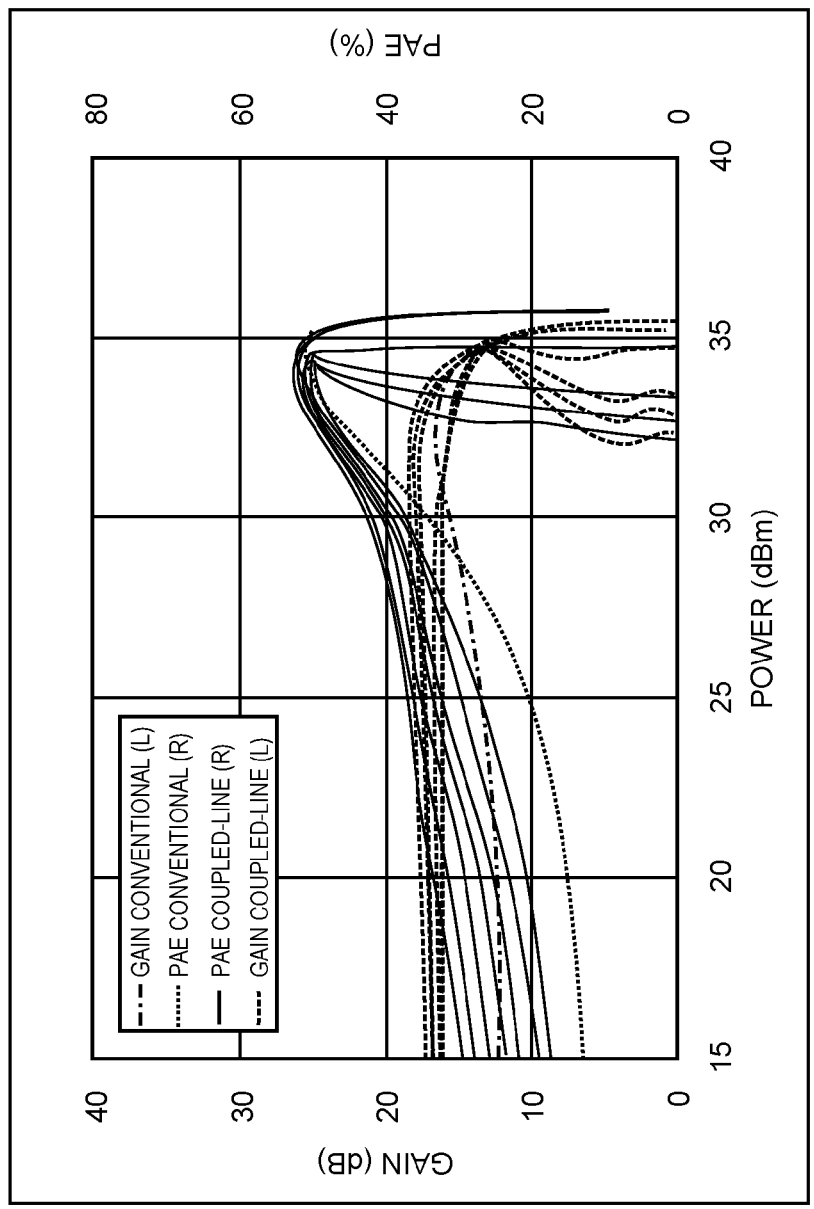
FIG. 21 is a graph depicting gain versus power for a quadrature coupled-line load modulated amplifier during operation at isolation termination impedances of 0Ω, 5Ω, 10Ω, 20Ω, 30Ω, 40Ω and 50Ω.

FIG. 21 is a graph illustrating gain and PAE versus Pout for the quadrature coupled line load modulated amplifier of the $1^{st}$ and $2^{nd}$ embodiments (FIGS. 7 and 8) where the isolation impedance $Z_{ISO}$ is swept from 50Ω to 0Ω. Also shown as a reference comparison is the gain and PAE versus Pout for a conventional 2-way Doherty amplifier. As $Z_{ISO}$ is decreased, the Z2 load presented by the coupler to the carrier amplifier also decreases and results in a higher increase in PAE as the output power is backed off. This mode of operation departs from the traditional Doherty operation where the carrier amplifier is presented a lower impedance (~Zload/2) at OPBO and actually resulted in slightly better OPBO efficiency than when the carrier amplifier was presented a large impedance (~2*Zload) under OPBO operation (Doherty type). This is believed to be due to the complex characteristics of the quadrature coupler combined with the carrier amplifier and peak amplifier bias settings where a more optimum complex load line is provided. Note that the gain is still flat exhibiting reasonably low AM-AM distortion. The AM-PM distortion (not shown) is also well behaved and is less than a couple of degrees over the applicable output power range. Also note that the amplifiers 90 and 110 were designed with linear operation as a focus.

Figure 22:
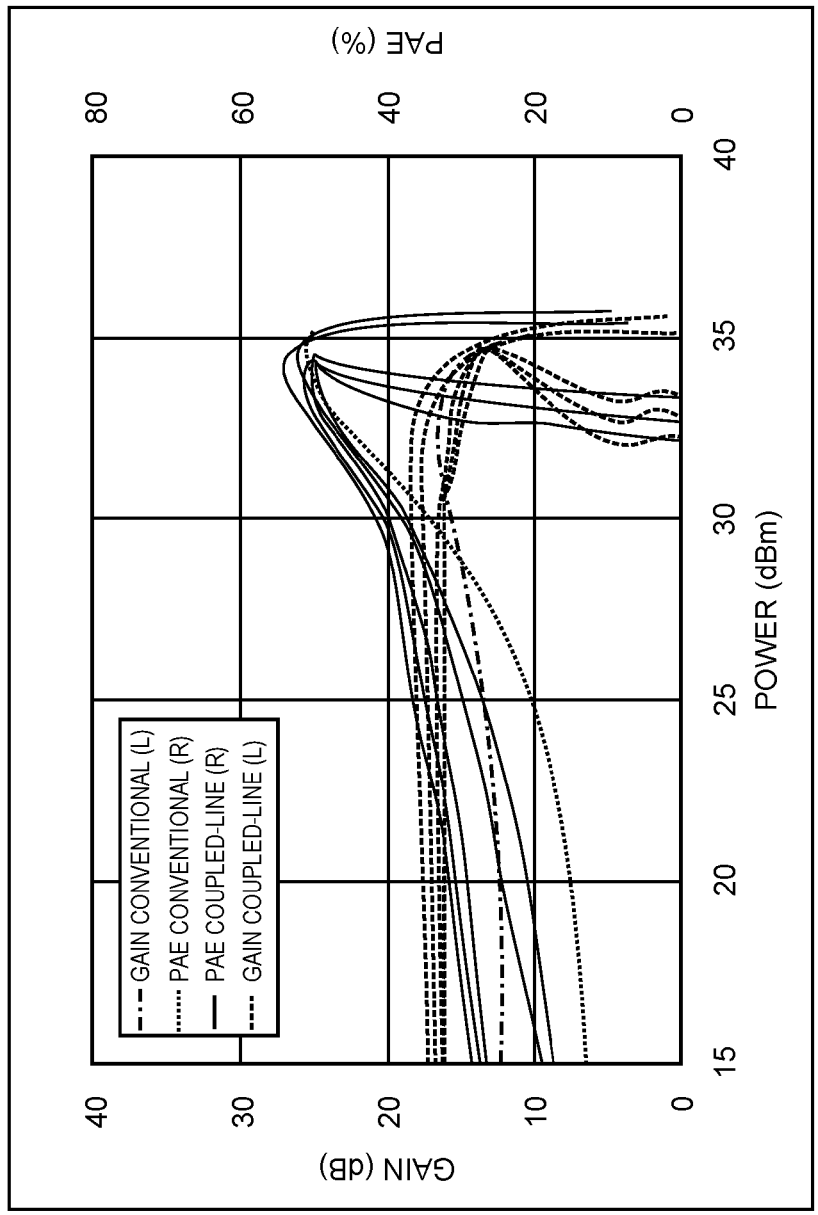
FIG. 22 is a graph depicting gain versus power for a quadrature coupled-line inverted load modulated amplifier during operation at isolation termination impedances of 50Ω, 100Ω, 500Ω, 1000Ω, and 5000Ω.

FIG. 22 illustrates gain and PAE versus Pout for the quadrature coupled-line inverted load modulated amplifier of the $3^{rd}$ through $5^{th}$ embodiments (FIGS. 9-11) where the isolation impedance $Z_{ISO}$ is swept from 50Ω to 5KΩ. Also shown as a reference comparison is the gain and PAE versus Pout for a conventional 2-way Doherty amplifier. As $Z_{ISO}$ is increased, the Z1 load presented by the coupler to the carrier amplifier decreases and results in a higher increase in PAE as the output power is backed off. This mode of operation departs from the traditional Doherty amplifier operation where the carrier amplifier is presented a lower impedance (~Zload/2) at OPBO and actually resulted in slightly better OPBO efficiency than when the carrier amplifier was presented a large impedance (~2*Zload) under OPBO operation (Doherty type) as shown in the upcoming FIG. 29. This is believed to be due to the complex characteristics of the quadrature coupler combined with the carrier amplifier and peak amplifier bias settings where a more optimum complex load line is provided. Note that the gain is still flat, exhibiting reasonably low AM-AM distortion. The AM-PM distortion (not shown) is also well behaved and is less than a couple of degrees over the applicable output power range. Also note that the amplifiers 114, 120, 1nd 124 were designed with linear operation as a focus.

Figure 23:
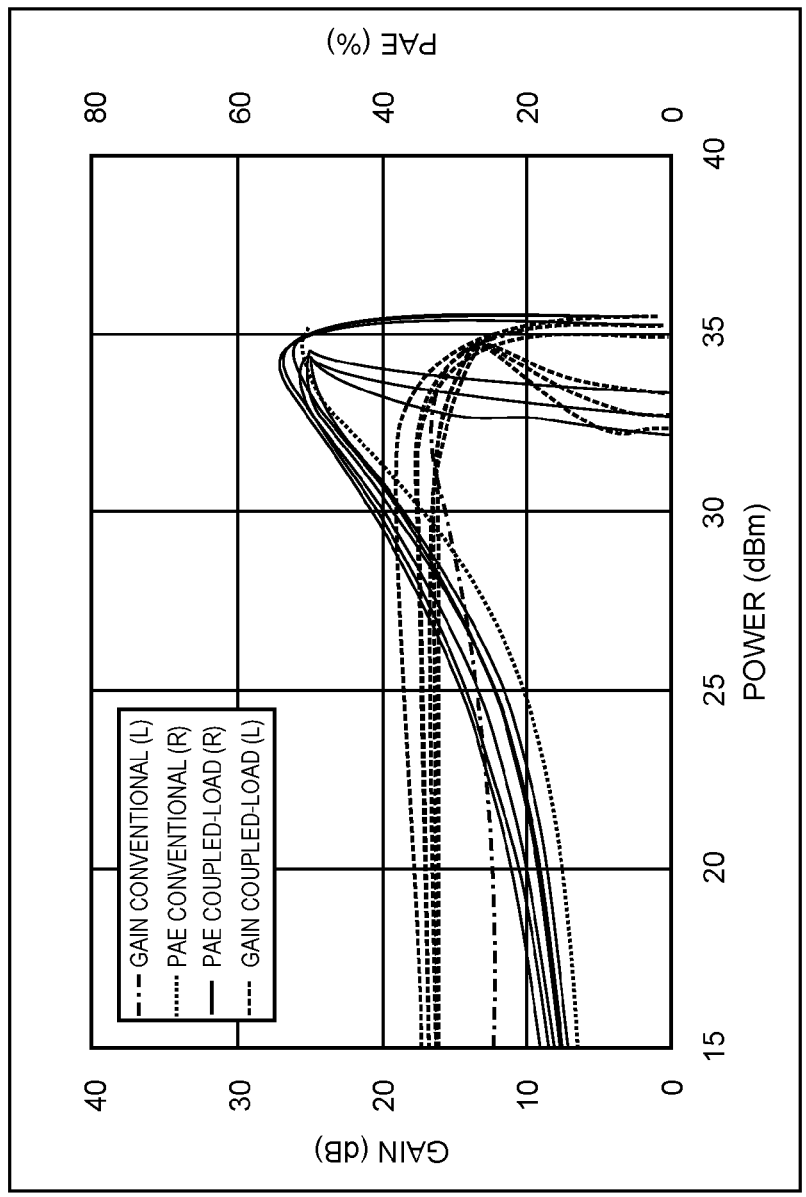
FIG. 23 is a graph depicting gain versus power for a quadrature coupled-line inverted load modulated amplifier during operation at isolation termination impedances of 0Ω, 5Ω, 10Ω, 20Ω, 30Ω, 40Ω and 50Ω.

FIG. 23 illustrates gain and PAE versus Pout for the quadrature coupled line inverted load modulated amplifier of the $3^{rd}$ through $5^{th}$ embodiments (FIGS. 9-11) where the isolation impedance $Z_{ISO}$ is swept from 0Ω to 50Ω. Also shown as a reference comparison is the gain and PAE versus Pout for a conventional 2-way Doherty amplifier. As $Z_{ISO}$ is decreased, the Z1 load presented by the coupler to the carrier amplifier increases and results in a higher increase in PAE as the output power is backed off. Note that the gain is flat, exhibiting reasonably low AM-PM distortion. The AM-PM distortion (not shown) is also well behaved and is less than a couple of degrees over the applicable output power range. Also note that the amplifiers 114, 120, and 124 were designed with linear operation as a focus.

Figure 24:
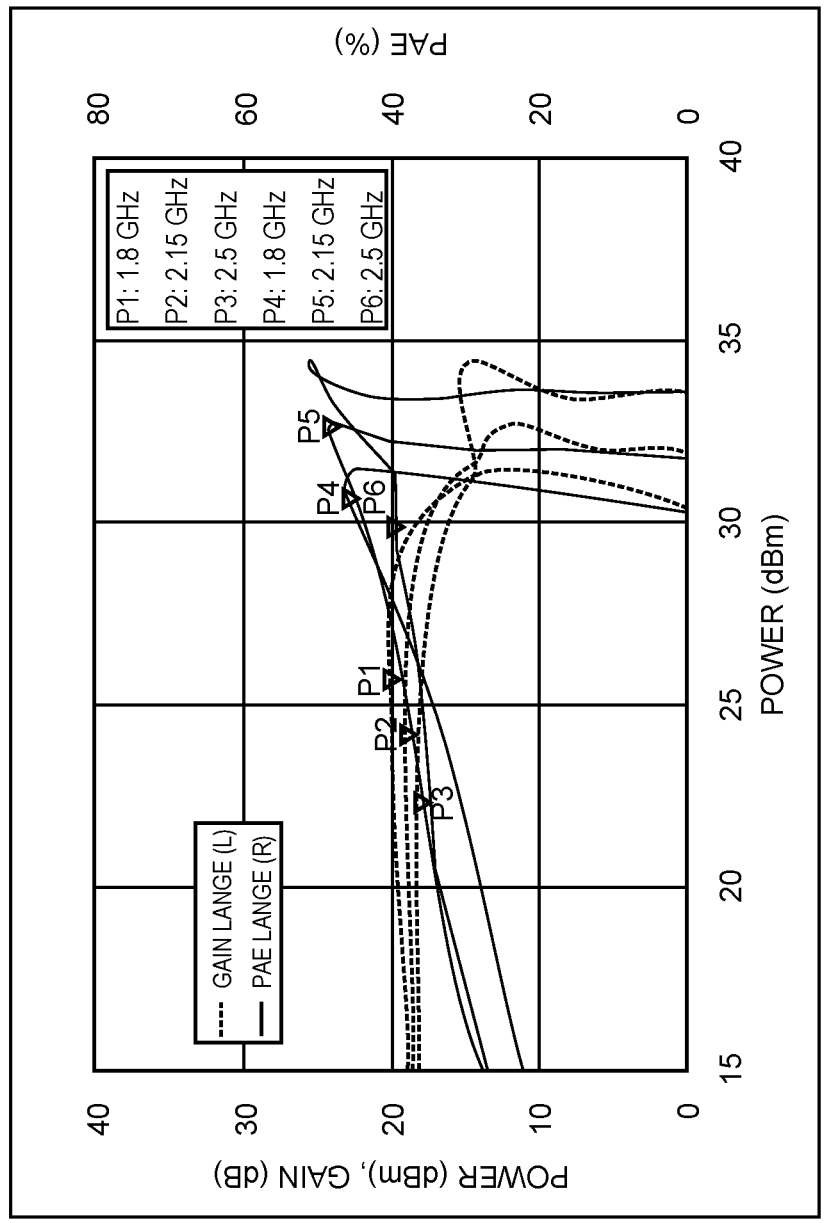
FIG. 24 is a graph depicting gain versus power for a Lange-coupled inverted load modulated amplifier during operation at output frequencies of 1.8 GHz, 2.15 GHz, and 2.5 GHz, ±15% bandwidth (BW).

FIG. 24 is a graph illustrating Lange-coupled inverted load modulated amplifier efficiency and gain response at 1.8, 2.15, and 2.5 GHz. The graph traces are for the isolation impedance $Z_{ISO}$=5KΩ when the carrier amplifier 92 sees a small load impedance ~Zload/2. Over the frequency range of +/−15% and a back off power range of 6 dB, the inverted load modulated amplifier achieves roughly better than 39% efficiency across the band. As expected, the efficiency is poorest at the upper band frequency of 2.5 GHz. The upper band efficiency may be improved by adding inductive impedance to $Z_{ISO}$ in series with a resistive load impedance Rload.

Figure 25:
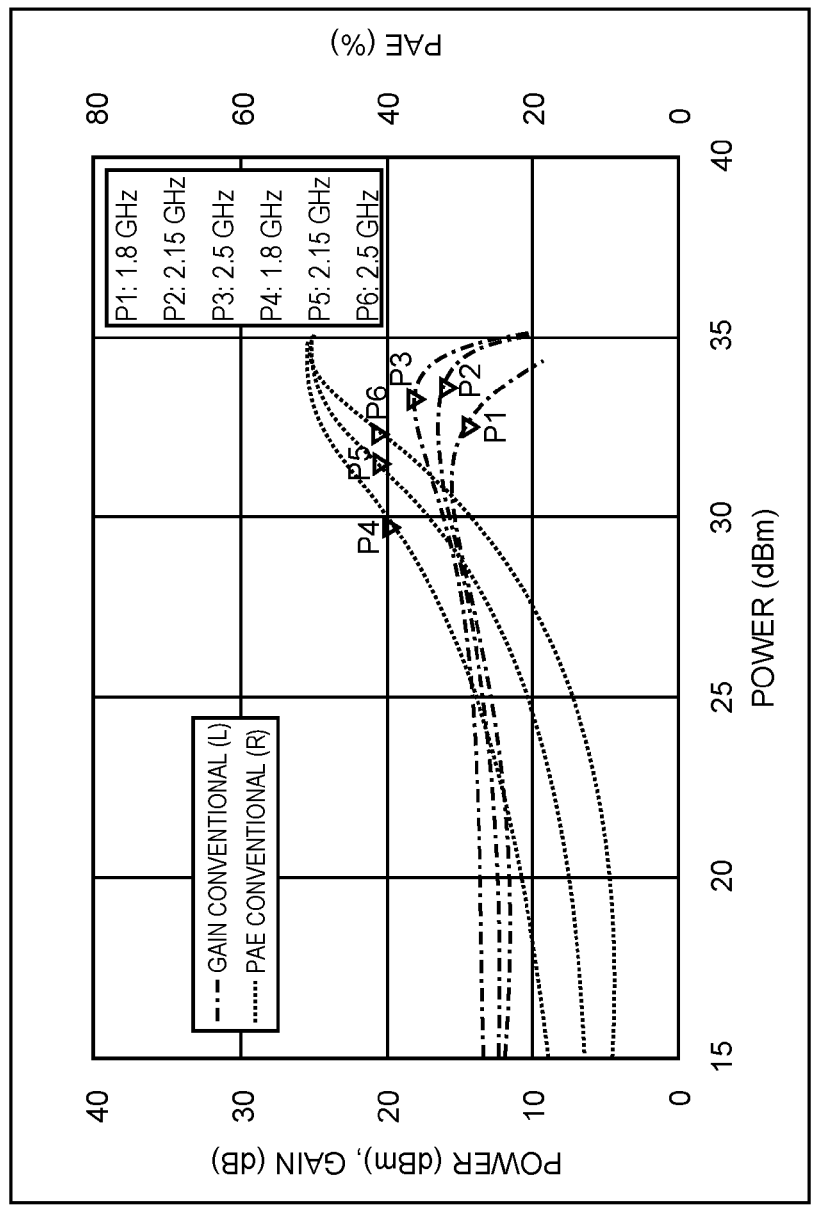
FIG. 25 is a graph depicting gain versus power for a conventional Doherty amplifier of the related art during operation at output frequencies of 1.8 GHz, 2.15 GHz, and 2.5 GHz, ±15% BW.

FIG. 25 is a graph illustrating the Doherty amplifier efficiency and gain response at 1.8, 2.15, and 2.5 GHz. Over the frequency range of +/−15% and a back off power of 6 dB, the conventional Doherty amplifier achieves no better than 38% efficiency at the lower band of 1.8 GHz and only 29% at the upper band frequency of 2.5 GHz. This is roughly a 10% degradation over the inverted load modulated power amplifiers of this disclosure over the +/−15% bandwidth.

Figure 26:
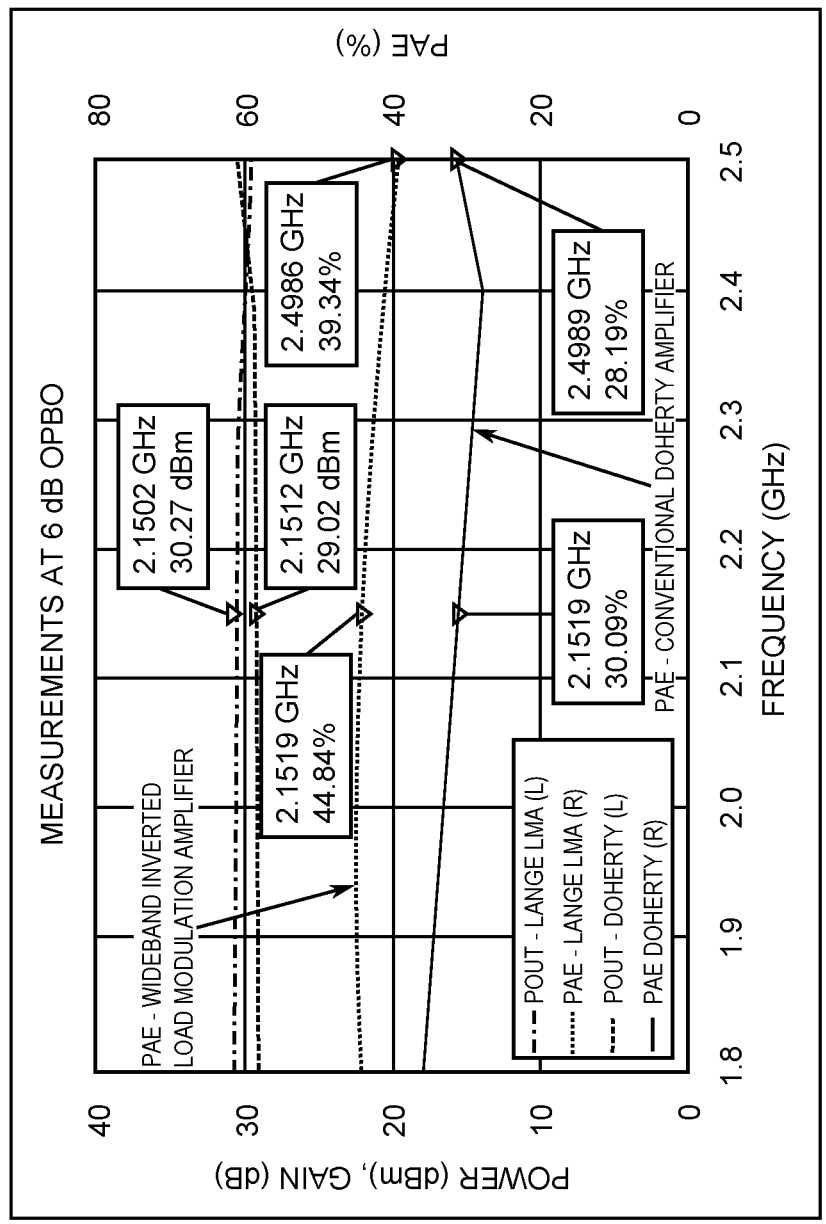
FIG. 26 is a graph depicting wideband output power and power added efficiency (PAE) of an inverted load modulation embodiment of the present disclosure versus a conventional Doherty amplifier with both operating at 6 dB output power back off (OPBO).

FIG. 26 is a graph showing the wideband response of the inverted load modulated amplifier versus the conventional Doherty amplifier over a +/−15% bandwidth at an OPBO of ~6 dB for each amplifier respectively. In particular, FIG. 26 illustrates the improved 6 dB OPBO PAE of the inverted load modulated amplifier embodiment which maintains >39% PAE over a wide band with 1 dB more 6-dB OPBO Pout while the conventional Doherty amplifier has as much as 14% and on average >10% poorer 6-dB OPBO PAE over the frequency range.

Figure 27:
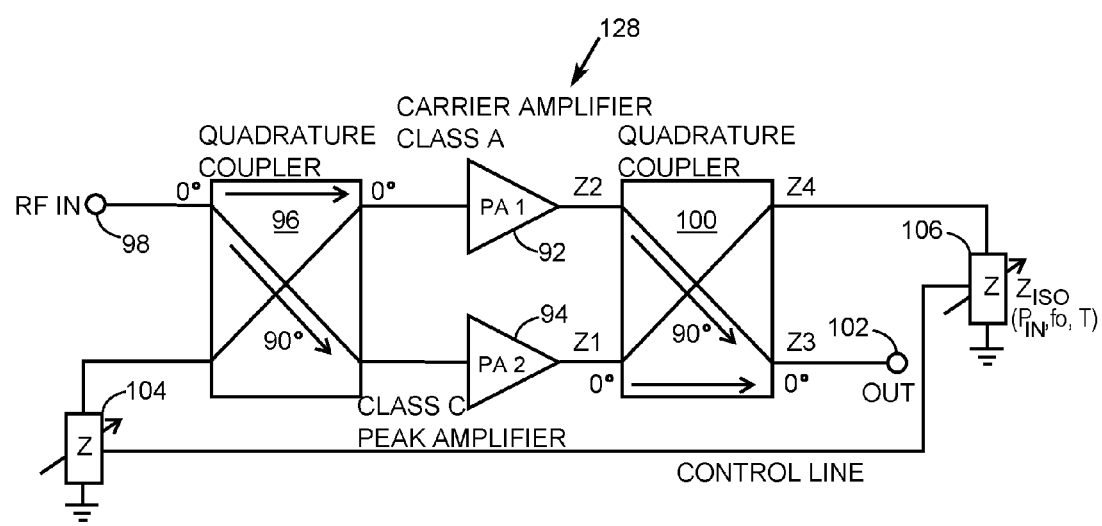
FIG. 27 is a schematic diagram of a quadrature combined load modulated power amplifier.

FIG. 27 is a schematic diagram of a quadrature combined load modulated power amplifier 128. The terminating impedance of the second quadrature coupler 100 coupled to the output load terminal 102 may be dynamically changed (continuous or discrete steps) to present a desired load impedance to either the carrier amplifier 92 or the peak amplifier 94 for maximizing power, efficiency or linearity at a given power level, frequency, or temperature. The input termination port impedance may also be tuned simultaneously to obtain optimum RF performance. Note that the phase relationship of the carrier amplifier 92 in relation to the output is 90 degrees offset, which is similar to the Doherty amplifier. What is different is that in this particular embodiment, the carrier amplifier 92 will see a load impedance which is lower than Zload at some OPBO level below the overall amplifier saturation point, and this is achieved by tuning $Z_{ISO}$<Zload. This is contrary to the operating principles of the Doherty amplifier whose carrier load impedance increases from Rload to 2*Rload at OPBO. Moreover, the carrier amplifier 92 may see an impedance that is Zload/2 at OPBO below the saturated power level of the carrier amplifier 92. It should be noted that the Doherty amplifier cannot provide a carrier load impedance below Rload and therefore is restricted in load modulation range. The result of low carrier load impedance at OPBO is illustrated in upcoming FIG. 29.

Figure 28:
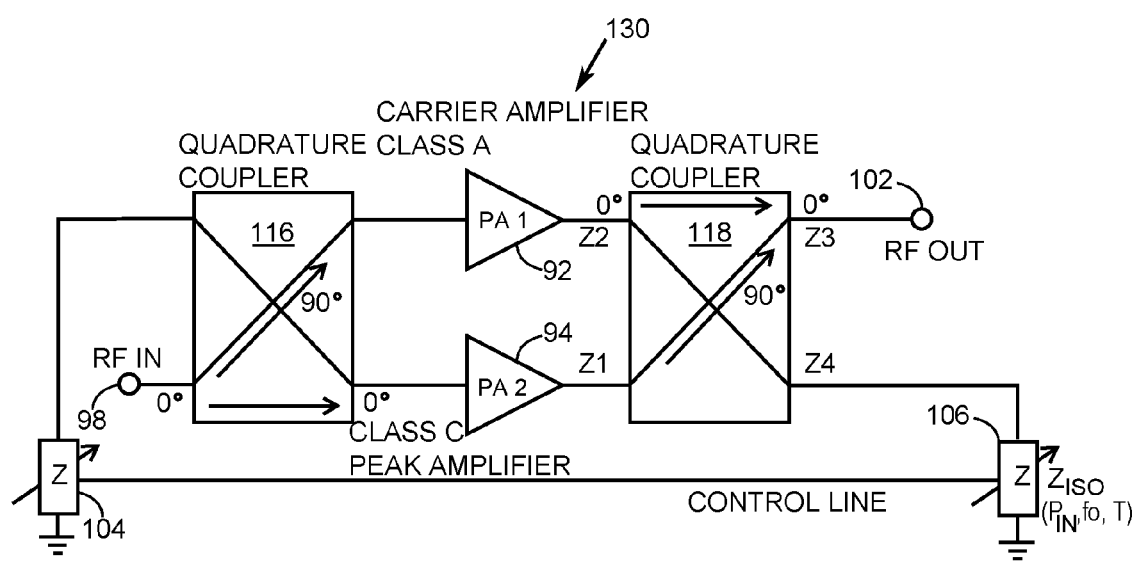
FIG. 28 is a schematic diagram of an inverted phase quadrature combined load modulated power amplifier.

FIG. 28 is a schematic diagram of an inverted phase quadrature combined load modulated power amplifier 130. This is different from the previous embodiment of FIG. 27, in that the output of the carrier amplifier 92 is coupled in-phase at a combined amplifier output. The terminating impedance of the output coupler may be dynamically changed (continuous or discrete steps) to present a desired load impedance to either the carrier amplifier 92 or the peak amplifier 94 for optimizing power, efficiency, or linearity at a given power level, frequency, or temperature. The input termination port impedance may also be tuned simultaneously to obtain optimum RF performance. Note that the phase relationship of the carrier amplifier 92 in relation the output is now 0 degrees offset, unlike the Doherty amplifier. Like the previous embodiment, the carrier amplifier 92 will see a load impedance which is lower than Zload at some OPBO level below the overall amplifier's saturation point, and this is achieved by tuning $Z_{ISO}$>Zload. This is contrary to the operating principles of the Doherty amplifier whose carrier load impedance increases from Rload to 2*Rload at OPBO. Moreover, the carrier amplifier 92 may see an impedance that is Zload/2 at OPBO below the saturated power level of the carrier amplifier 92. It should be noted that the Doherty amplifier cannot provide a carrier load impedance below Rload and therefore is restricted in load modulation range. The result of low carrier load impedance at OPBO is illustrated in upcoming FIG. 30.

Figure 29:
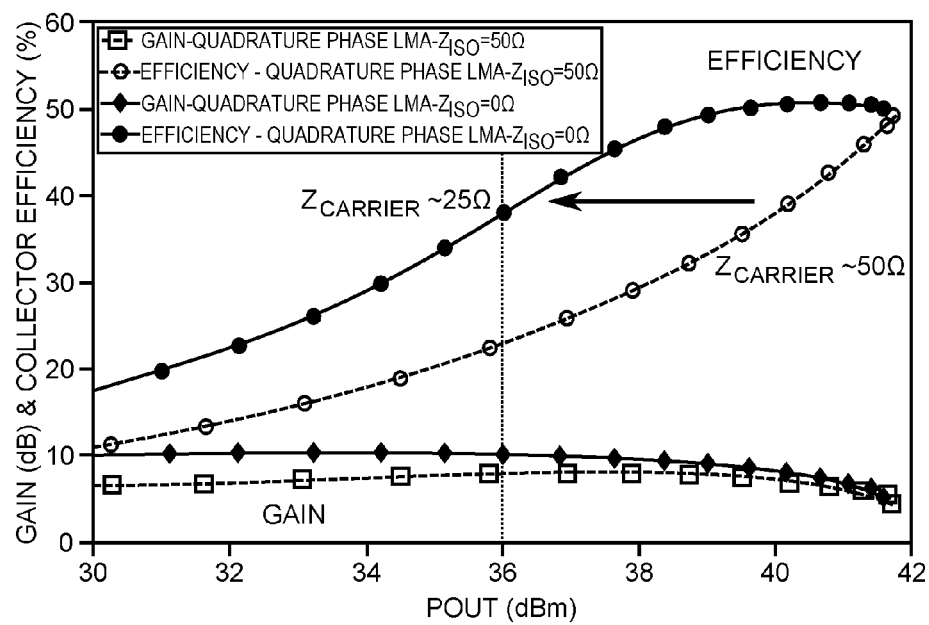
FIG. 29 is a graph depicting measured quadrature phase load modulated gain and efficiency versus output power.

FIG. 29 is a graph of measured gain and collector efficiency vs. Pout for the quadrature phase load modulated power amplifier 128 of FIG. 27. The carrier amplifier 92 is biased in class A and the peak amplifier is biased in class C. These characteristics were measured for $Z_{ISO}$=50Ω and $Z_{ISO}$=0Ω to illustrate the range of load modulation between these $Z_{ISO}$ impedances, but should be noted that a continuous or discrete range of impedances may be employed. These impedances correspond to a carrier amplifier load impedance of 50Ω and 25Ω respectively. For the lower carrier impedance of 25Ω, a dramatic improvement in OPBO efficiency is obtained compared to the 50Ω carrier impedance setting. This operating principle is contrary to the Doherty amplifier, which modulates the carrier load to higher impedances at ~6 dB OPBO to increase the efficiency. The fundamental difference is that the Doherty amplifier is setting the OPBO load for maximum saturated class A operation, whereas the present disclosure places the operation of the carrier amplifier 92 in the linear region.

Figure 30:
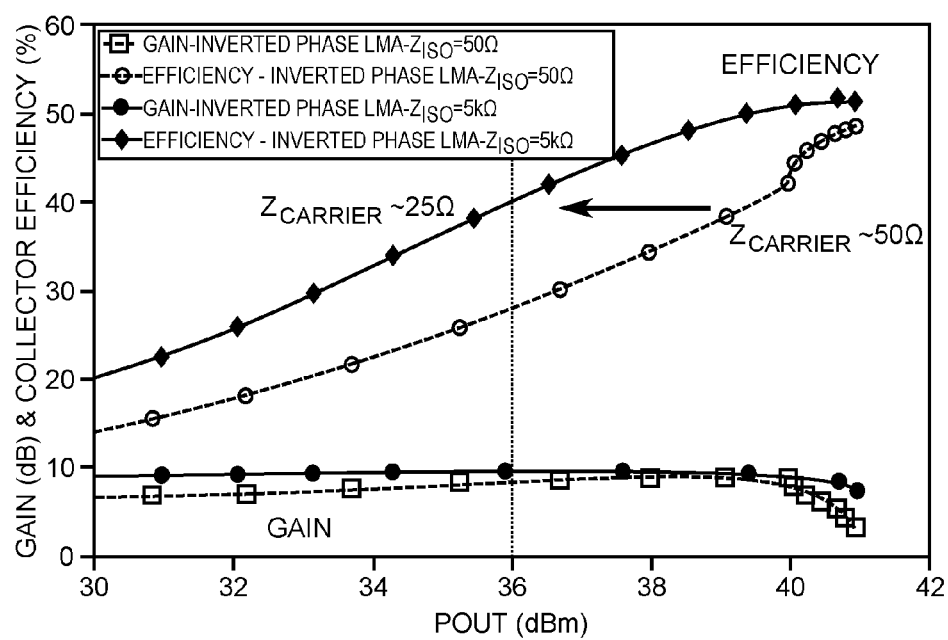
FIG. 30 is a graph depicting measured quadrature inverted phase load modulated gain and efficiency versus output power.

FIG. 30 is a graph of measured gain and collector efficiency versus Pout for the inverted quadrature phase load modulated power amplifier 130 of FIG. 28. The carrier amplifier 92 is biased in class A and the peak amplifier 94 is biased in class C. These characteristics were measured for $Z_{ISO}$=50Ω and $Z_{ISO}$=5KΩ but should be noted that a continuous or discrete range of impedances may be employed. These impedances correspond to a carrier amplifier load impedance of 50Ω and 25Ω respectively. For the lower carrier impedance of 25Ω, a dramatic improvement in OPBO efficiency is obtained compared to the 50Ω carrier impedance setting. This operating principle is contrary to the Doherty amplifier, which modulates the carrier load to higher impedances at ~6 dB OPBO to increase the efficiency. The fundamental difference is that the Doherty amplifier is setting the OPBO load for maximum saturated class A operation, whereas the present disclosure places the amplifier in the linear region.

Figure 31:
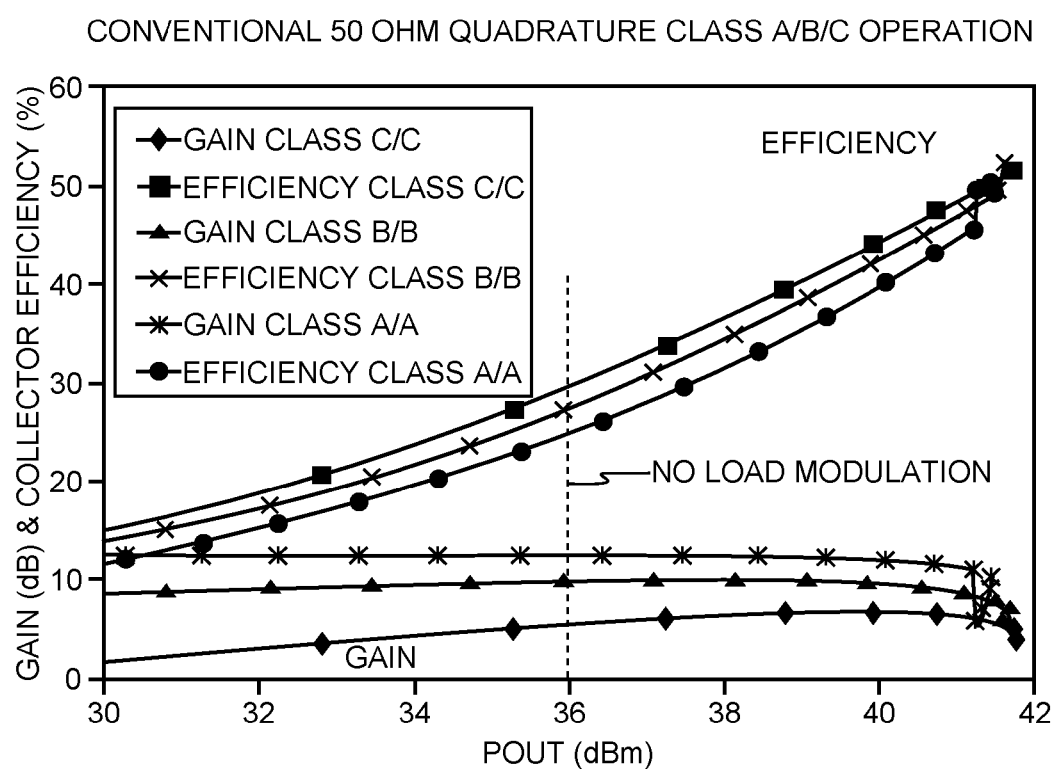
FIG. 31 is a graph depicting conventional 50Ω quadrature operation for class A, class B, and class C amplifiers with no load modulation.

As a reference comparison, FIG. 31 is a graph that shows the measured conventional 50Ω quadrature operation of the quadrature combined load modulated power amplifier 128 where both the carrier amplifier 92 and the peak amplifier 94 are operated at the same bias and $Z_{ISO}$=50Ω. The corresponding efficiency and gain curves for class A, B, and C are illustrated and show the expected characteristic efficiency 'drop-off' response as output power is backed off. The plots show the characteristic gain expansion of the class C case and its associated higher efficiency than the class B or C cases as power ramps up. At ~5-6 dB OPBO, or an output power of ~36 dBm, the efficiency is at best 30% for the class C case and 25% for the class A case, as compared to 38 and 40% for the quadrature phase and inverted phase load modulated amplifiers at the lower load impedance. The lower impedance capability of this new load modulation amplifier has far reaching implications to high linear efficiency optimization at lower voltages. It may be combined with envelope tracking or drain mode biasing such as class G in order to optimize power efficiency further. And this would come with other inherent benefits such as wider bandwidth and real time reconfigurability.

Figure 32:
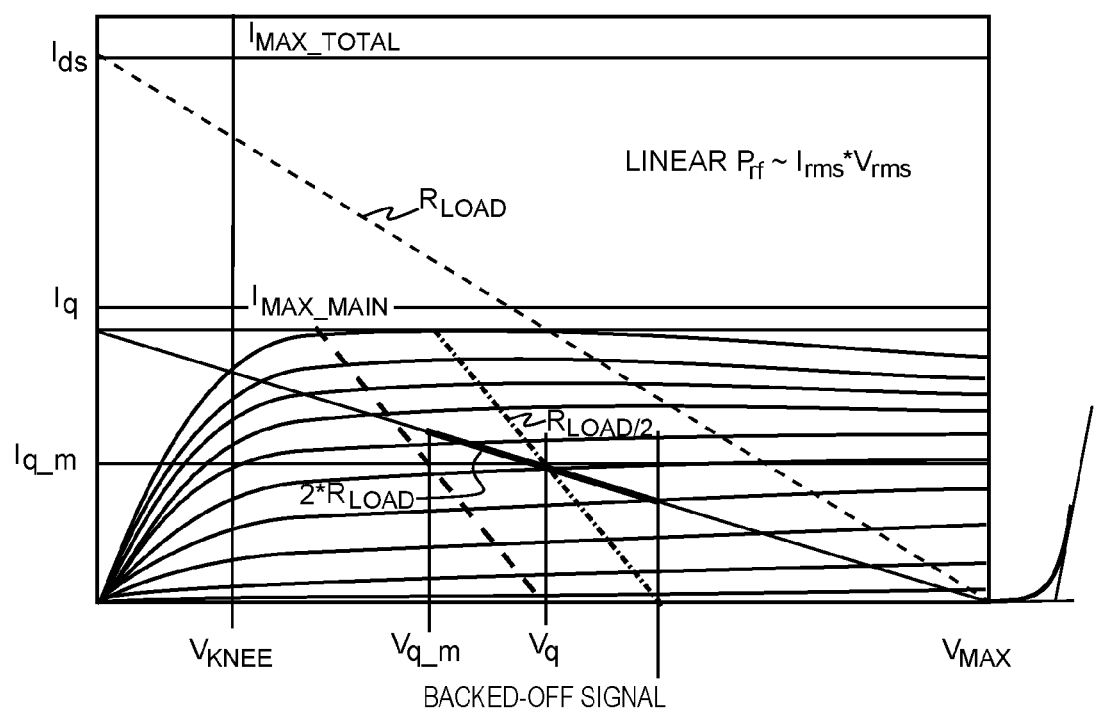
FIG. 32 is an IV curve graph with load lines depicting conventional class A (Rload) load line operation, low impedance (RLoad/2) load modulation under lower power backed off signal, and low impedance (Rload/2) load modulation under low power backed off signal and lower supply voltage Vq_m, illustrating more efficient load line impedance at lower supply voltage with higher current swing (than 2*Rload conventional Doherty OPBO load-line configuration).

FIG. 32 is a graph illustrating current-voltage I-V load line operation of the carrier amplifier 92 when the amplifier is backed off of its saturation. In particular, the IV curve graph includes load-lines depicting conventional class A (Rload) load line operation, low impedance (RLoad/2) load modulation under lower power backed off signal, and low impedance (Rload/2) load modulation under low power backed off signal and lower supply voltage Vq_m, illustrating more efficient load line impedance at lower supply voltage with higher current swing (than 2*Rload). The voltage and current excursion for a conventional load modulation amplifier such as a Doherty amplifier is constricted by the 2*Rload impedance and is limiting in power efficiency for smaller than saturated power operation. In order to improve the linear efficiency of the carrier amplifier 92 at backed off powers below saturation for the carrier amplifier, the load impedance may be reduced as we are suggesting in the present disclosure. In the embodiments described in this disclosure, higher linear power can be obtained using a load impedance of Rload/2 resulting in a root mean squared current Irms having a larger excursion for the same DC power. This results in improved small signal power efficiency as compared to the larger load. In addition, drain voltage could be reduced via APT or ET (as examples) in conjunction with lowering the load impedance in order to obtain even higher small signal power efficiency illustrated in thick dashed line. One approach is to reduce the Rp load towards ~Rload/2 to improve the RF Ids swing for a given RF Vout swing. This will increase the Pav=Vrms*Irms by a large factor due to the larger AC current swing (assuming that gain is large). The factor of four reduction in Rload will result in a factor of four increase in RF Ids for the given RF Vout swing. This will require a larger RF Vin swing, however, if there is sufficient amplifier gain, then this should be negligible and linear efficiency will be improved dramatically. Since the RF Vout voltage is not clipped by the knee, further improvement in drain efficiency may be achieved by reducing the quiescent Vdrain or voltage applied to the amplifier (via average power tracking (APT) or ET for example). The potential improvement is conceptually illustrated for increasing the efficiency of a related art Doherty amplifier designed for envelope tracking (ET).

Figure 33:
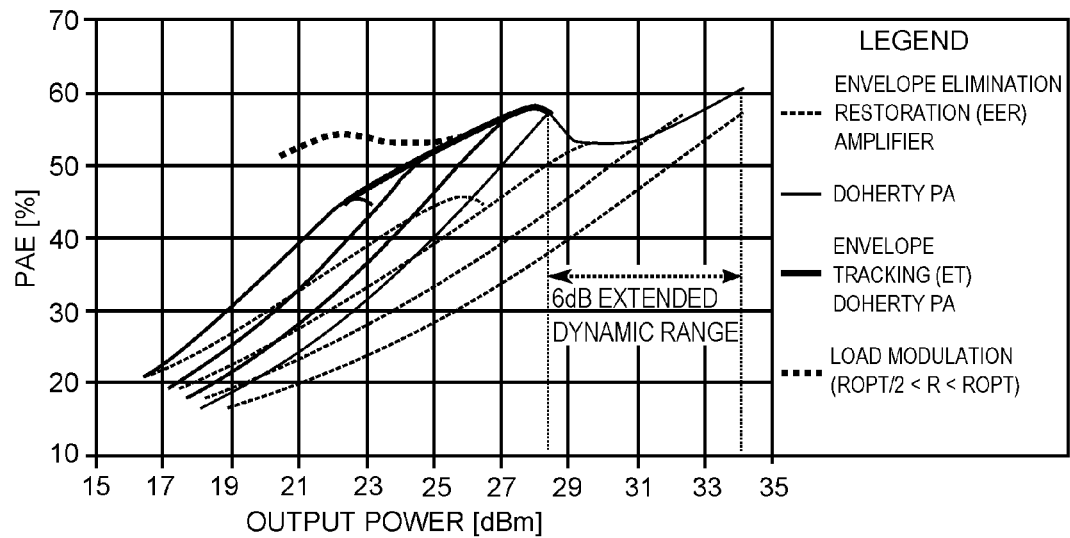
FIG. 33 is a graph of load modulation combined with a Doherty amplifier configured for envelope tracking (ET).

FIG. 33 is a graph that illustrates how load modulation may improve the efficiency of a Doherty amplifier designed for ET. It is previously known that ET can be used to improve the >6 dB backed off efficiency of a conventional Doherty amplifier. At 6 dB OPBO, the peak amplifier is off and the carrier amplifier is presented with a 2*Ropt class A load and is saturated. As output power is backed off even further, the carrier amplifier becomes uncompressed and its efficiency starts to decrease. ET or APT may be applied to recover the efficiency by lowering the drain voltage of the carrier amplifier as conceptually illustrated by the efficiency envelope of FIG. 33 shown in thick black line. To further improve the efficiency, the load of the carrier may be reduced in order to allow more Irms excursion and achieve better Pout for a given drain voltage bias point depicted as a bold dotted line. The present load modulation amplifier embodiments disclosed herein can enable this type of operation while providing reconfigurability over wide modulation bandwidths, power ranges, and carrier frequency of operation.

Figure 34:
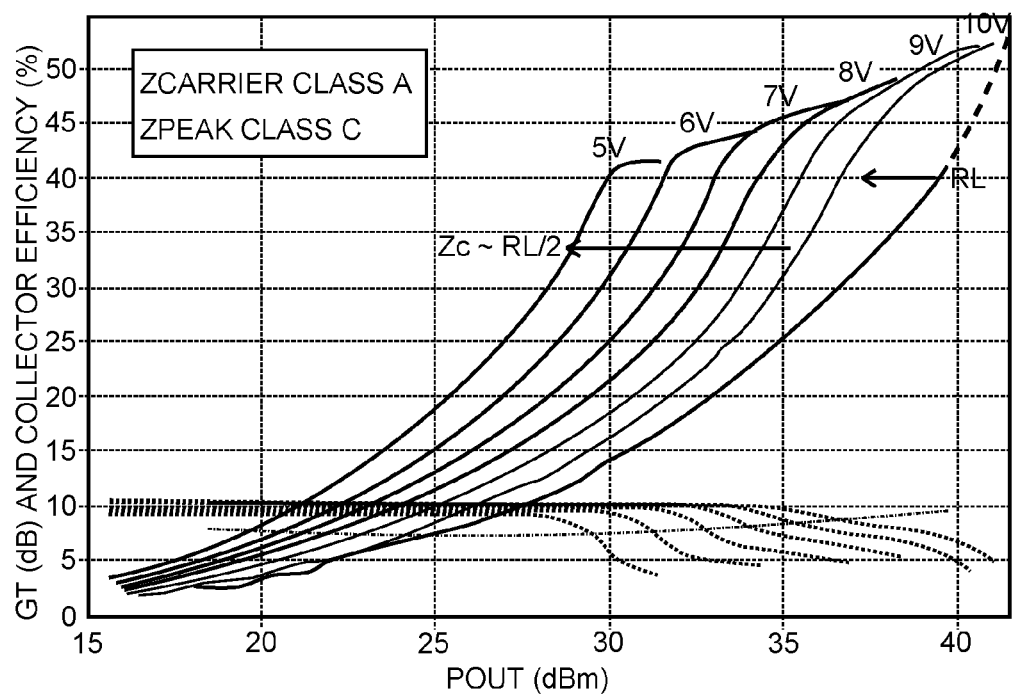
FIG. 34 is a graph of measured total gain and collector efficiency versus output power for a quadrature phase load modulated amplifier of the present disclosure illustrating improved backed off efficiency through the combination of load modulation (to lower Zc impedance~RL/2) and lower supply modulated operating voltage.

FIG. 34 is a graph of measured total gain and collector efficiency versus output power for a quadrature phase load modulated amplifier of the present disclosure illustration improved backed off efficiency through the combination of load modulation (to lower Zc impedance~RL/2) and lower supply modulated operating voltage. Moreover, FIG. 34 depicts preliminary data indicating the benefits that can be achieved by combining the load modulation amplifier embodiments of this disclosure with drain-voltage modulation at low powers in order to further improve the OPBO efficiency. It should be noted that this is a breadboard demonstration using available amplifier cells, and that a printed circuit board (PCB) used for bread-boarding and the breadboard tuning was not designed for maximum efficiency or power. It is also believed that the inverted phase load modulation amplifier, such as those shown in FIGS. 9-11, will achieve less amplitude modulation-amplitude modulation (AM-AM) distortion than will the reconfigurable load modulated power amplifier 90 of FIG. 7. The measured data of FIG. 34 is very encouraging in light of this and demonstrates the fundamental linear efficiency improvement that can be obtained from combining low impedance load modulation with low drain voltage operation.

Figures 1, 35:
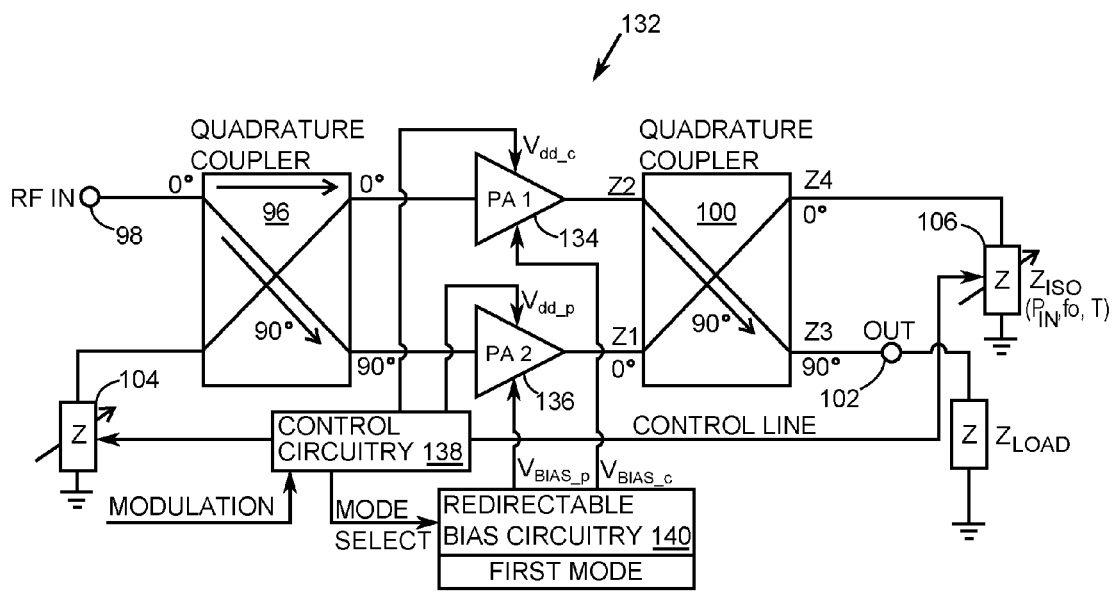
Figures 2, 35:
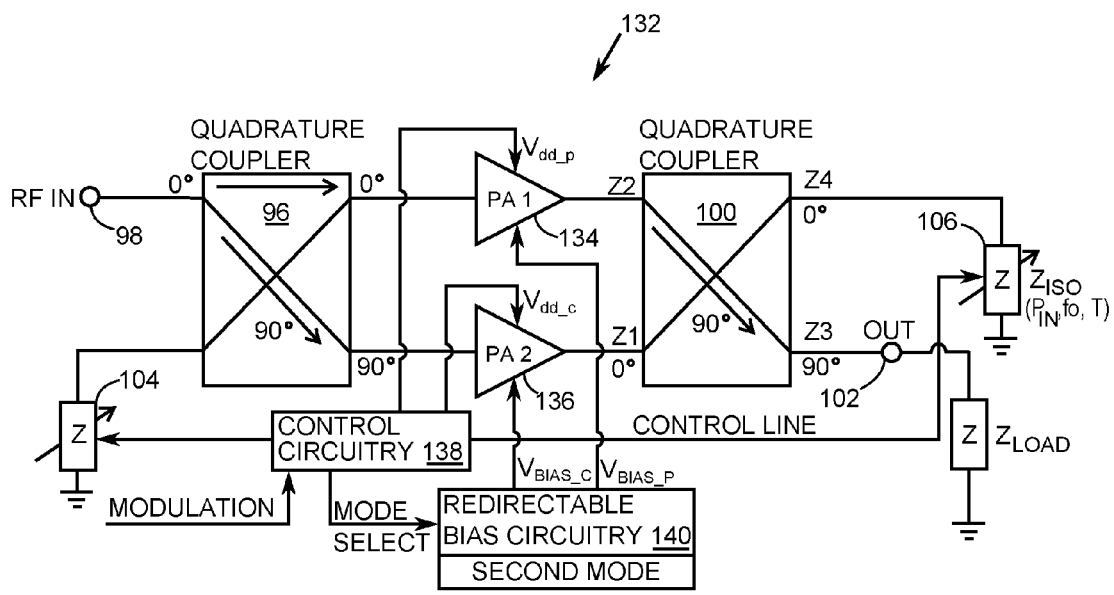

Referring to FIG. 35-1, a reconfigurable load modulated amplifier 132 includes a first power amplifier (PA) 134 and a second PA 136. The first PA 134 and the second PA 136 are supplied power by a first drain voltage and a second drain voltage, respectively. The second quadrature coupler 100 is configured to combine power from both the first PA 134 and the second PA 136 for output through the output port 102. The first and second drain voltages are asymmetric drain modulation voltages. In one embodiment, a control circuitry 138 is configured to statically set at least one of the first drain voltage and the second drain voltage such that the first drain voltage is different than the second drain voltage. In another embodiment, the control circuitry 138 is configured to dynamically adjust at least one of the first drain voltage and the second drain voltage such that the first drain voltage is different than the second drain voltage.

In at least one embodiment, the control circuitry 138 is also configured to receive modulation associated with an RF signal applied to the input 98. The modulation can be a dynamically changing modulated signal format. In one embodiment, the first drain voltage and/or the second drain voltage is modulated in response to a wireless fidelity (Wi-Fi) signal. In another embodiment, the first drain voltage and/or the second drain voltage is modulated in response to a long term evolution (LTE) signal. In yet another embodiment, the first drain voltage and/or the second drain voltage is modulated in response to envelope tracking (ET). In still another embodiment, the first drain voltage and/or the second drain voltage is modulated in response to average power tracking (APT). In yet another embodiment, the first drain voltage and/or the second drain voltage is modulated in response to changes in a modulated signal peak-to-average ratio (PAPR). In still yet another embodiment, the first drain voltage and/or the second drain voltage is modulated in response to changes to a carrier aggregated signal that comprises at least two aggregated carrier channels. In yet another embodiment, the first drain voltage and/or the second drain voltage is modulated in response to instantaneous peak power over signal amplitude swing. In still another embodiment, the first drain voltage and/or the second drain voltage is modulated in response to a change in PAPR based on network environmental conditions.

Redirectable bias circuitry 140 generates a first bias for the first PA 134 and a second bias for the second PA 136 under the control of the control circuitry 138 that generates a mode select signal that selects between a first mode and a second mode. As shown in FIG. 35-1, in the first mode, the redirectable bias circuitry 140 generates the first bias voltage as a carrier bias voltage $V_{BIAS\_C}$ that biases the first PA 134 for Class A operation so that the first PA 134 functions as a carrier amplifier and the first drain voltage is a carrier drain voltage Vdd_c. Also while in the first mode, the redirectable bias circuitry 140 generates the second bias voltage as a peak bias voltage $V_{BIAS\_P}$ so that the second PA 136 functions as a peak amplifier and the second drain voltage is a peak drain voltage Vdd_p. In this case, the reconfigurable load modulated power amplifier 132 is configured to couple the first PA 134, which in this case is the carrier amplifier, to the load impedance $Z_{LOAD}$ through a 90° phase shift port of the second quadrature coupler 100.

In some operational scenarios, the first PA 134 is the peak amplifier and the second PA 136 is the carrier amplifier. A determination of which of the first PA 134 and the second PA 136 should be the peak amplifier and which should be the carrier is dependent upon carrier phase with respect to output and the isolation termination impedance $Z_{ISO}$ with respect to nominal load impedance $Z_{LOAD}$. For example, as shown in FIG. 35-2, in the second mode, the redirectable bias circuitry 140 generates the first bias voltage as the peak bias voltage $V_{BIAS\_P}$ that biases the first PA 134 for Class C operation so that the first PA 134 functions as the peak amplifier and the first drain voltage is the peak drain voltage Vdd_p. Also while in the second mode, the redirectable bias circuitry 140 generates the second bias voltage as the carrier $V_{BIAS\_C}$ so that the second PA 136 functions as the carrier amplifier and the second drain voltage is a carrier drain voltage Vdd_c. In this case, the reconfigurable load modulated power amplifier that is configured to couple the first PA 136, which in this case is the carrier amplifier, to the load impedance $Z_{LOAD}$ through a 0° phase shift port of the second quadrature coupler 100. The load impedance $Z_{LOAD}$ is typically 50Ω.

The reconfigurable load modulated amplifier 132 provides reconfigurations that allow for dynamically adjusting the asymmetrical Vdd_c and Vdd_p to achieve different output power backoff (OPBO) peak efficiency profiles to address dynamic PAPRs. In other words, the reconfigurable load modulated amplifier 132 is reconfigurable by, for example, a baseband processor based upon modulation PAPRs and/or a carrier aggregation (CA) mode. The reconfiguration can be achieved in an occasional manner such as a switch from one CA mode to another or in contrast, the reconfiguration can be nearly instantaneous while addressing dynamic PAPRs. Moreover, the isolation termination impedance $Z_{ISO}$ is tunable as a function of output power and OPBO.

In one embodiment, the control circuitry 138 is further configured to maintain the second drain voltage greater than the first drain voltage when the isolation termination impedance $Z_{ISO}$ coupled to the isolation port Z4 of the second quadrature coupler 100 is greater than the load impedance $Z_{LOAD}$ coupled to the output port 102. In another embodiment, the control circuitry 138 is further configured to maintain the second drain voltage less than the first drain voltage when the isolation termination impedance $Z_{ISO}$ coupled to the isolation port Z4 of the second quadrature coupler 100 is greater than the load impedance $Z_{LOAD}$ coupled to the output port 102. In yet another embodiment, the control circuitry 138 is further configured to maintain the second drain voltage greater than the first drain voltage when the isolation termination impedance $Z_{ISO}$ is coupled to the isolation port Z4 of the second quadrature coupler 100 is less than the load impedance $Z_{LOAD}$ coupled to the output port 102. In still another embodiment, the control circuitry 138 is further configured to maintain the second drain voltage less than the first drain voltage when the isolation termination impedance $Z_{ISO}$ coupled to the isolation port Z4 of the second quadrature coupler 100 is less than the load impedance $Z_{LOAD}$ coupled to the output port 102.

Figure 36:
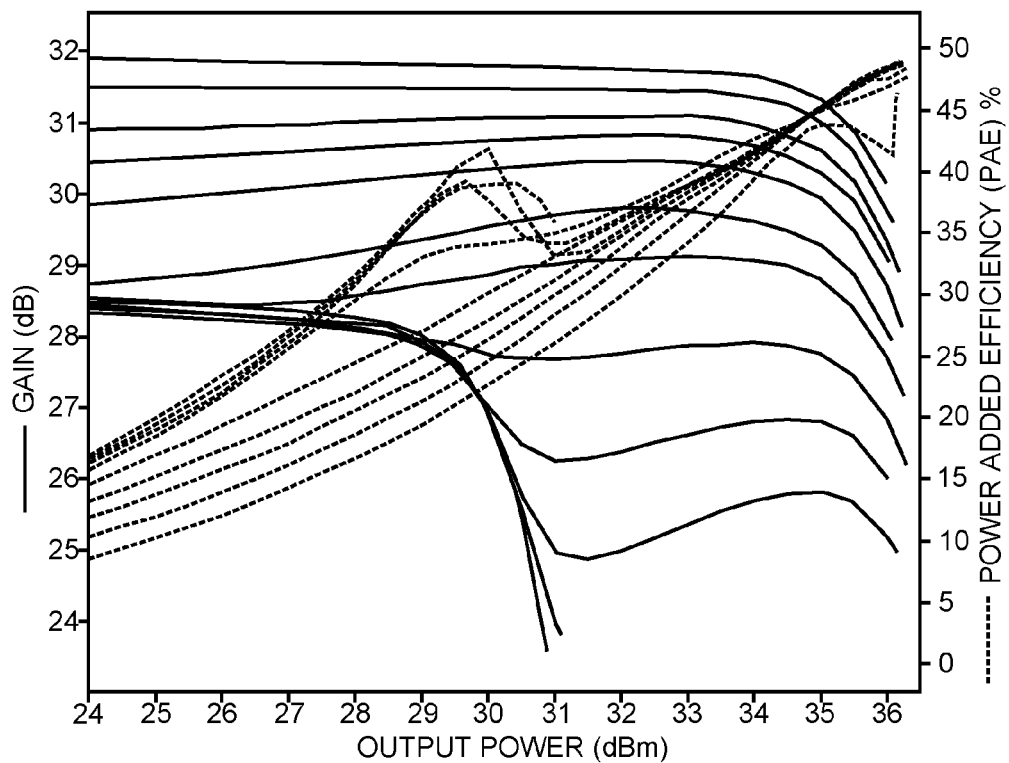
FIG. 36 is a graph that depicts gain and power added efficiency (PAE) versus output power for the reconfigurable load modulated power amplifier of FIG. 35-2 for a continuous wave measurement at 1900 MHz with an isolation termination impedance of 3 MΩ, wherein a carrier amplifier supply voltage and a peak amplifier supply voltage are both 4.5V.
Figure 37:
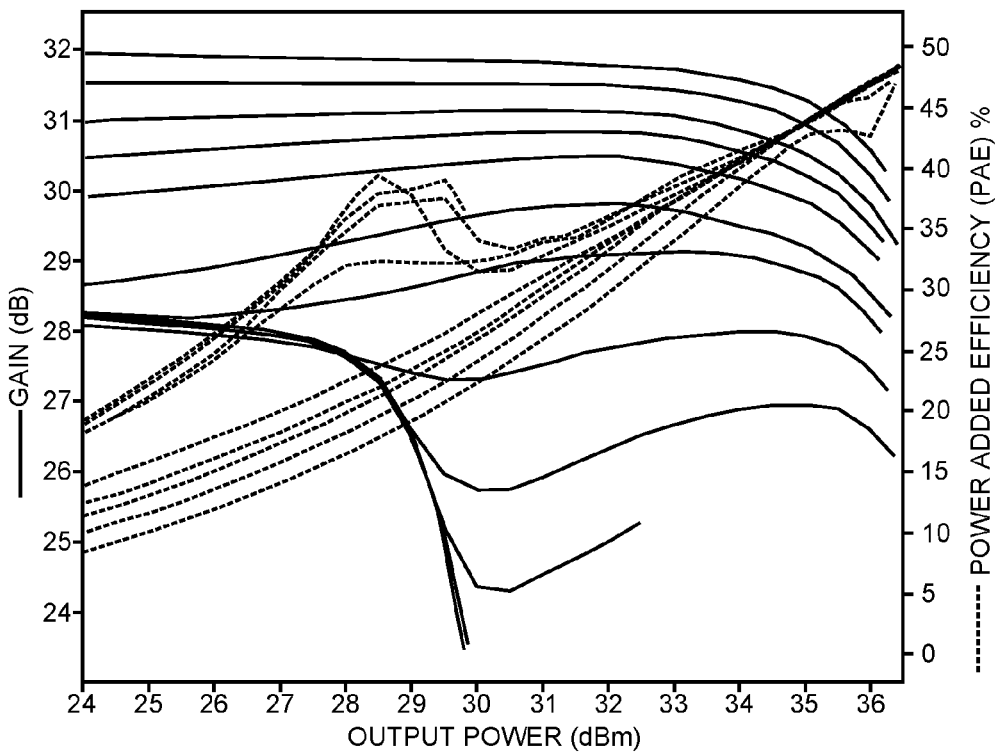
FIG. 37 is a graph that depicts gain PAE for the reconfigurable load modulated power amplifier of FIG. 35-2 for a continuous wave measurement at 1900 MHz with an isolation termination impedance of 3 MΩ, wherein a carrier amplifier supply voltage is 4V and a peak amplifier supply voltage is 5V.

FIG. 36 is a graph that depicts gain and power added efficiency (PAE) versus output power for the reconfigurable load modulated power amplifier 132 of FIG. 35-2 for a continuous wave measurement at 1900 MHz with an isolation termination impedance $Z_{ISO}$ of 3 MΩ, wherein a carrier amplifier supply voltage and a peak amplifier supply voltage are both 4.5V. FIG. 37 is a graph that depicts gain and PAE for the reconfigurable load modulated power amplifier 132 of FIG. 35-2 for a continuous wave measurement at 1900 MHz with an isolation impedance of 3 MΩ, wherein a carrier amplifier supply voltage is 4V and a peak amplifier supply voltage is 5V. In particular, FIG. 36 and FIG. 37 illustrate that the OPBO location where peak power added efficiency (PAE) occurs for an asymmetric drain voltage case, wherein Vdd_c is less than Vdd_p for an isolation termination impedance $Z_{ISO}$ greater than 50Ω over a swept peak current bias while the second PA 136, which in this case is the carrier PA, is coupled to the output through a 0° phase shift. With regard to the embodiment of FIG. 35-2, the second PA 136 that functions as the carrier amplifier is configured to operate with Class A biasing while the first PA 134 is configured to operate with Class C biasing.

Figure 38:
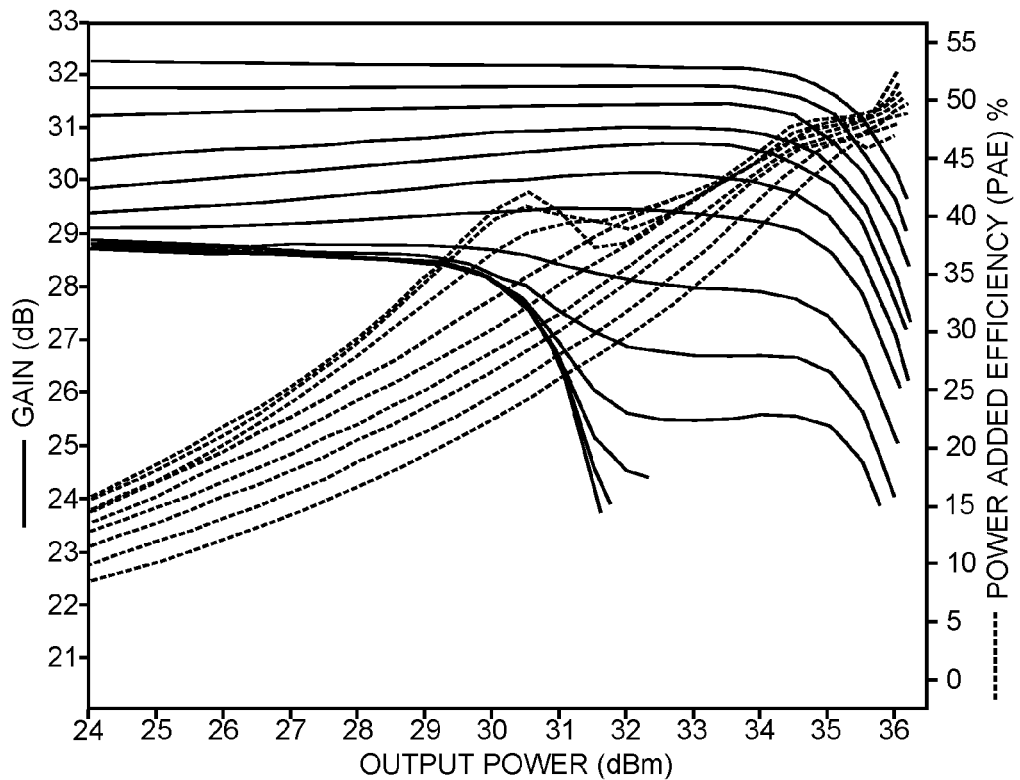
FIG. 38 is a graph that depicts gain and PAE versus output power for the reconfigurable load modulated power amplifier of FIG. 35-1 for a continuous wave measurement at 1900 MHz with an isolation termination impedance $Z_{ISO}$ of 5Ω, wherein a carrier amplifier supply voltage and a peak amplifier supply voltage are both 4.5V.
Figure 39:
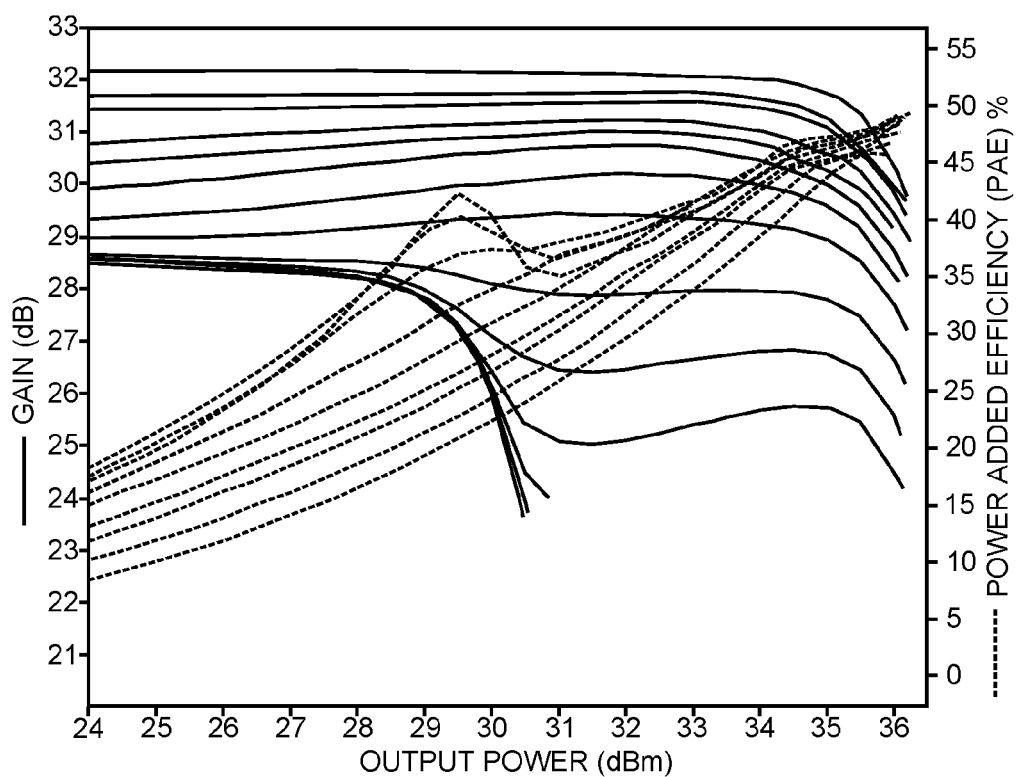
FIG. 39 is a graph that depicts gain and PAE versus output power for the reconfigurable load modulated power amplifier of FIG. 35-1 for a continuous wave measurement at 1900 MHz with an isolation termination impedance $Z_{ISO}$ of 5Ω, wherein a carrier amplifier supply voltage is 4V and a peak amplifier supply voltage is 5V.

FIG. 38 is a graph that depicts gain and PAE versus output power for the reconfigurable load modulated power amplifier 132 of FIG. 35-1 for a continuous wave measurement at 1900 MHz with an isolation termination impedance $Z_{ISO}$ of 5Ω, wherein a carrier amplifier supply voltage and a peak amplifier supply voltage are both 4.5V. FIG. 39 is a graph that depicts gain and PAE versus output power for the reconfigurable load modulated power amplifier of FIG. 35-1 for a continuous wave measurement at 1900 MHz with an isolation termination impedance $Z_{ISO}$ of 50, wherein a carrier amplifier supply voltage is 4V and a peak amplifier supply voltage is 5V. FIG. 38 and FIG. 39 illustrate that the OPBO location where peak power added efficiency (PAE) occurs for an asymmetric drain voltage case, wherein Vdd_c is less than Vdd_p for an isolation termination impedance $Z_{ISO}$ less than 50Ω over a swept peak current bias while the first PA 134, which in this case is the carrier PA, is coupled to the output through a 90° phase shift. With regard to the embodiment of FIG. 35-1, the first PA 134 that functions as the carrier amplifier is configured to operate with Class A biasing while the second PA 136 that functions as the peak amplifier is configured to operate with Class C biasing.

Figure 40:
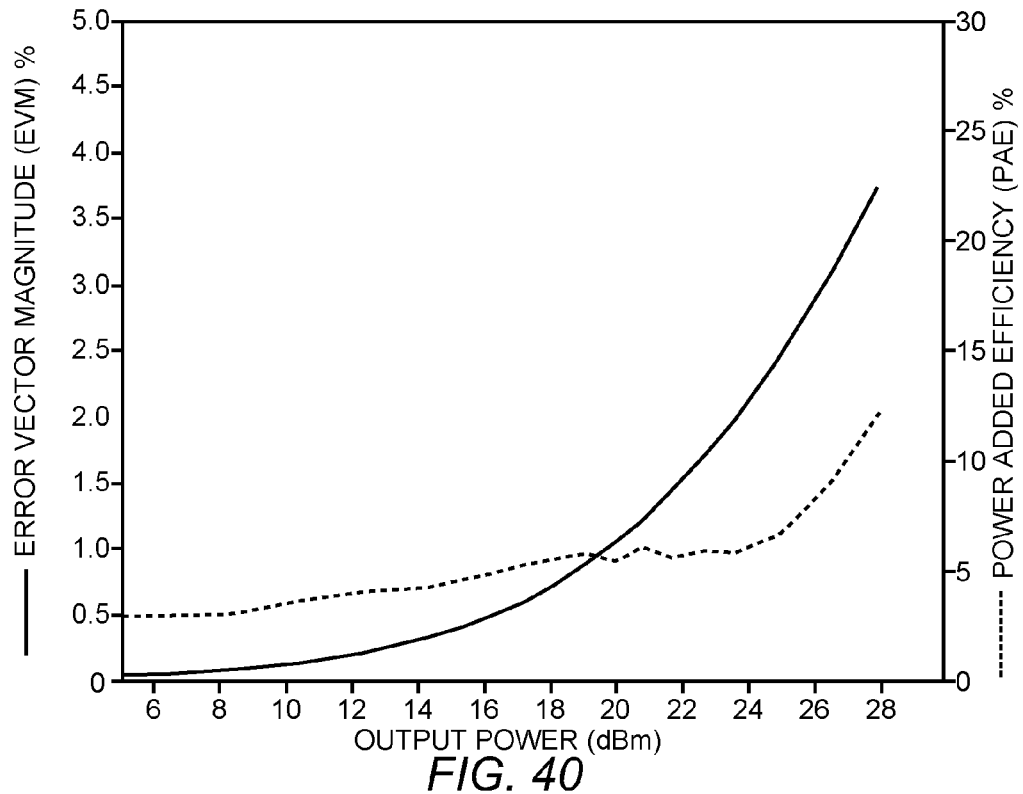
FIG. 40 is graph of error vector magnitude (EVM) and PAE versus output power for the reconfigurable load modulated power amplifier of FIG. 35-2 operated with digital pre-distortion (DPD) for a modulated complex wave measurement at 1900 MHz with an isolation termination impedance $Z_{ISO}$ of 3 MΩ, wherein a carrier amplifier supply voltage and a peak amplifier supply voltage are both 4.5V.
Figure 41:
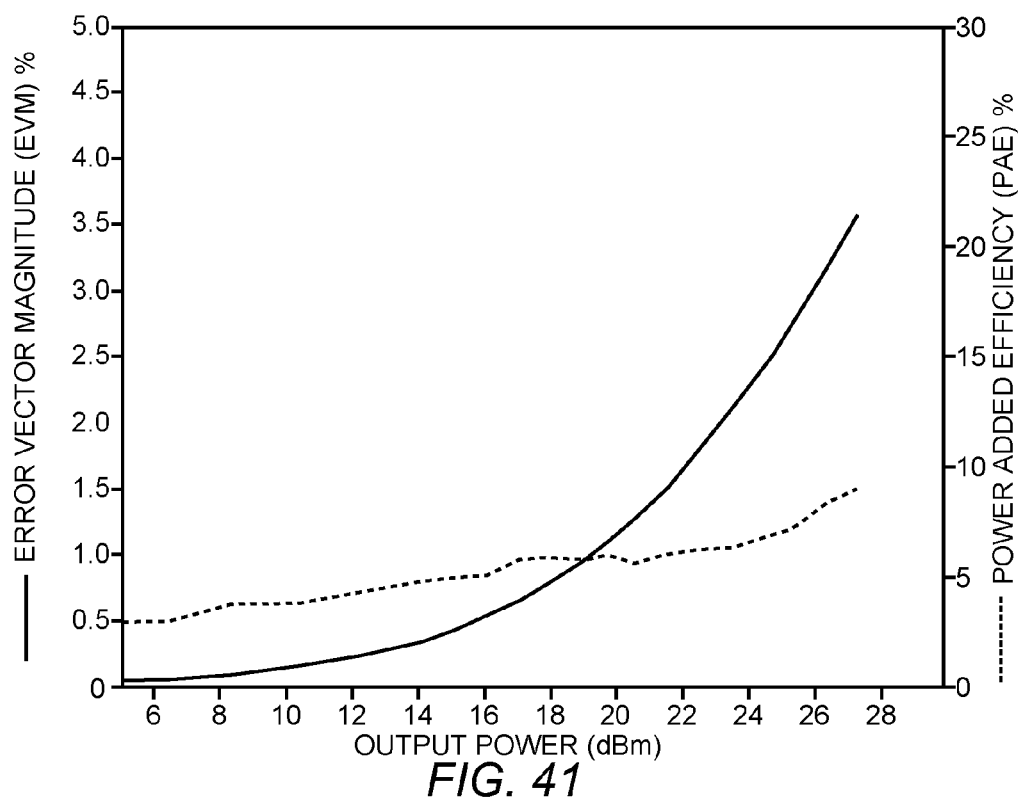
FIG. 41 is graph of EVM and PAE versus output power for the reconfigurable load modulated power amplifier of FIG. 35-2 operated with DPD for a modulated complex wave measurement at 1900 MHz with an isolation termination impedance $Z_{ISO}$ of 3 MΩ, wherein a carrier amplifier supply voltage is 4V and a peak amplifier supply voltage is 5V.

FIG. 40 is a graph of error vector magnitude (EVM) and PAE versus output power for the reconfigurable load modulated power amplifier 132 of FIG. 35-2 operated with digital pre-distortion (DPD) for a modulated complex wave measurement at 1900 MHz with an isolation termination impedance $Z_{ISO}$ of 3 MΩ, wherein a carrier amplifier supply voltage and a peak amplifier supply voltage are both 4.5V. FIG. 41 is a graph of EVM and PAE versus output power for the reconfigurable load modulated power amplifier of FIG. 35-2 operated with DPD for a modulated complex wave measurement at 1900 MHz with an isolation termination impedance $Z_{ISO}$ of 3 MΩ, wherein a carrier amplifier supply voltage is 4V and a peak amplifier supply voltage is 5V. In particular, FIG. 40 and FIG. 41 illustrate that the linear PAE at 1.8% EVM increases from 22% to 24.5% for the asymmetric Vdd case where Vdd_c is less than Vdd_p for an isolation termination impedance $Z_{ISO}$ that is greater than 50Ω after DPD has been applied.

Figure 42:
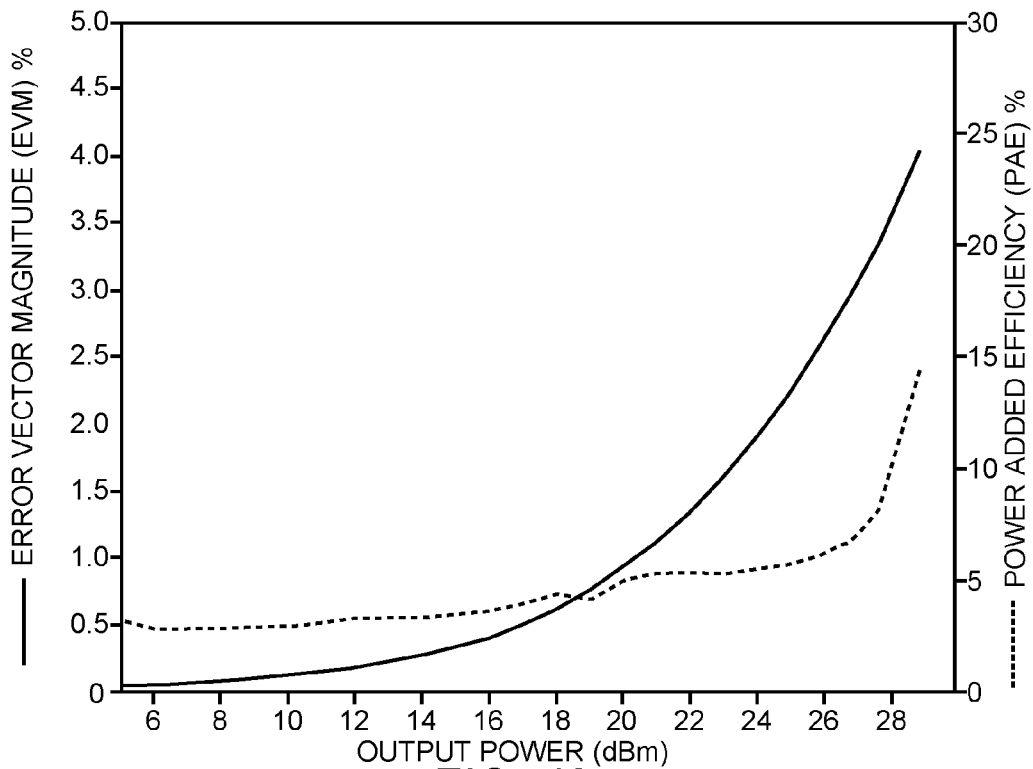
FIG. 42 is a graph of EVM and PAE versus output power for the reconfigurable load modulated power amplifier of FIG. 35-1 operated with DPD for a modulated complex wave measurement at 1900 MHz with an isolation termination impedance $Z_{ISO}$ of 5Ω, wherein a carrier amplifier supply voltage and a peak amplifier supply voltage are both 4.5V.
Figure 43:
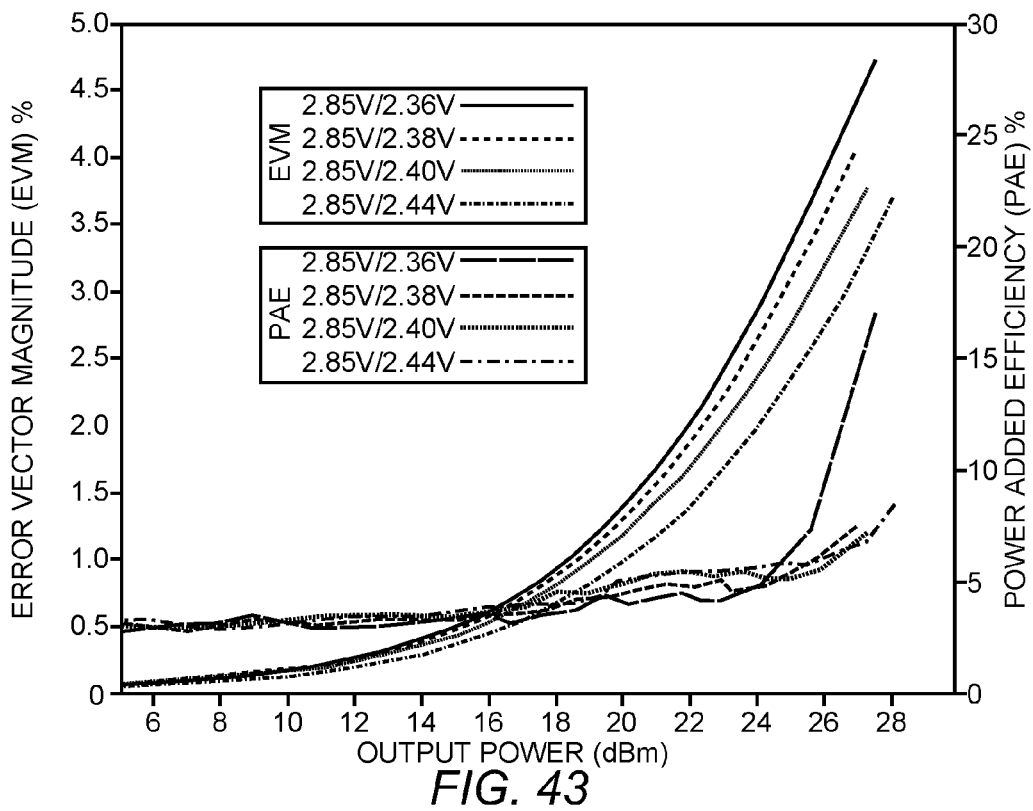
FIG. 43 is a graph of EVM and PAE versus output power for the reconfigurable load modulated power amplifier of FIG. 35-1 operated with DPD for a modulated complex wave measurement at 1900 MHz with an isolation termination impedance $Z_{ISO}$ of 5Ω, wherein a carrier amplifier supply voltage is 4V and a peak amplifier supply voltage is 5V.

FIG. 42 is a graph of EVM and PAE versus output power for the reconfigurable load modulated power amplifier 132 of FIG. 35-1 operated with DPD for a modulated complex wave measurement at 1900 MHz with an isolation termination impedance $Z_{ISO}$ of 5Ω, wherein a carrier amplifier supply voltage and a peak amplifier supply voltage are both 4.5V. FIG. 43 is graph of EVM and PAE versus output power for the reconfigurable load modulated power amplifier of FIG. 35-1 operated with DPD for a modulated complex wave measurement at 1900 MHz with an isolation termination impedance $Z_{ISO}$ of 5Ω, wherein a carrier amplifier supply voltage is 4V and a peak amplifier supply voltage is 5V. FIG. 42 and FIG. 43 illustrate that the linear PAE at 1.8% EVM increases from 22% to 24.5% for the asymmetric drain voltage case, wherein Vdd_c is less than Vdd_p for a fixed isolation termination impedance $Z_{ISO}$ that is less than 50Ω after DPD has been applied.

Figure 44:
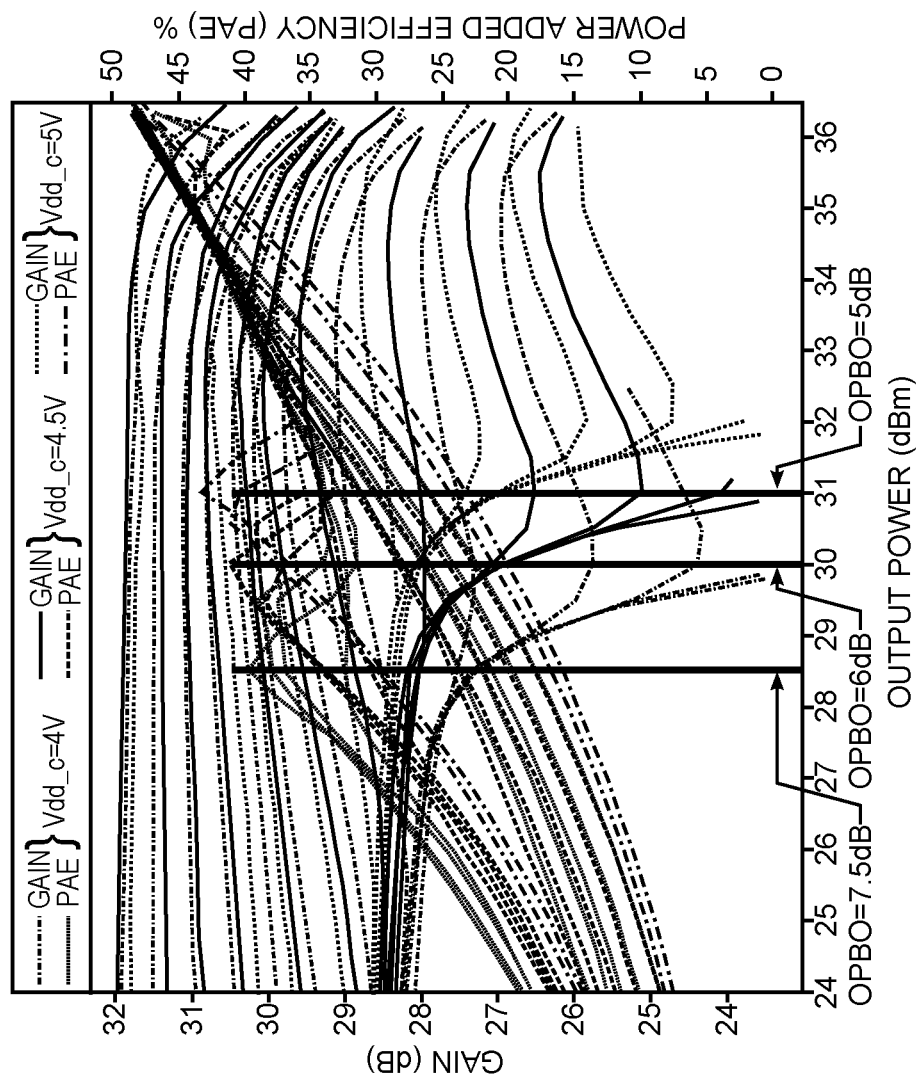
FIG. 44 is a graph that depicts gain and power added efficiency (PAE) versus output power for the reconfigurable load modulated power amplifier of FIG. 35-2 for a continuous wave measurement at 1900 MHz with an isolation termination impedance $Z_{ISO}$ of 3 MΩ, wherein a peak amplifier supply voltage is held at 5V and a carrier amplifier supply voltage switched between 5V, 4.5V, and 4V, respectively.

FIG. 44 is a graph that depicts gain and PAE versus output power for the reconfigurable load modulated power amplifier 132 of FIG. 35-2 for a continuous wave measurement at 1900 MHz with an isolation termination impedance $Z_{ISO}$ of 3 MΩ, wherein a peak amplifier supply voltage is held at 5V and a carrier amplifier supply voltage switched between 4V, 4.5V, and 5V, respectively. In this case, the first PA 134 functions as the peak amplifier and the second PA 136 functions as the carrier amplifier. FIG. 44 illustrates that in this exemplary case locations of OPBO peak efficiency occur at 5 dB, 6 dB, and 7.5 dB for carrier drain voltages Vdd_c of 5V, 4.5V, and 4V, respectively. Thus, when the isolation termination impedance $Z_{ISO}$ is greater than 50Ω, the location of where OPBP peak efficiency occurs can be increased by asymmetrically biasing the reconfigurable load modulated amplifier 132 such that Vdd_p is greater than Vdd_c.

Figure 45:
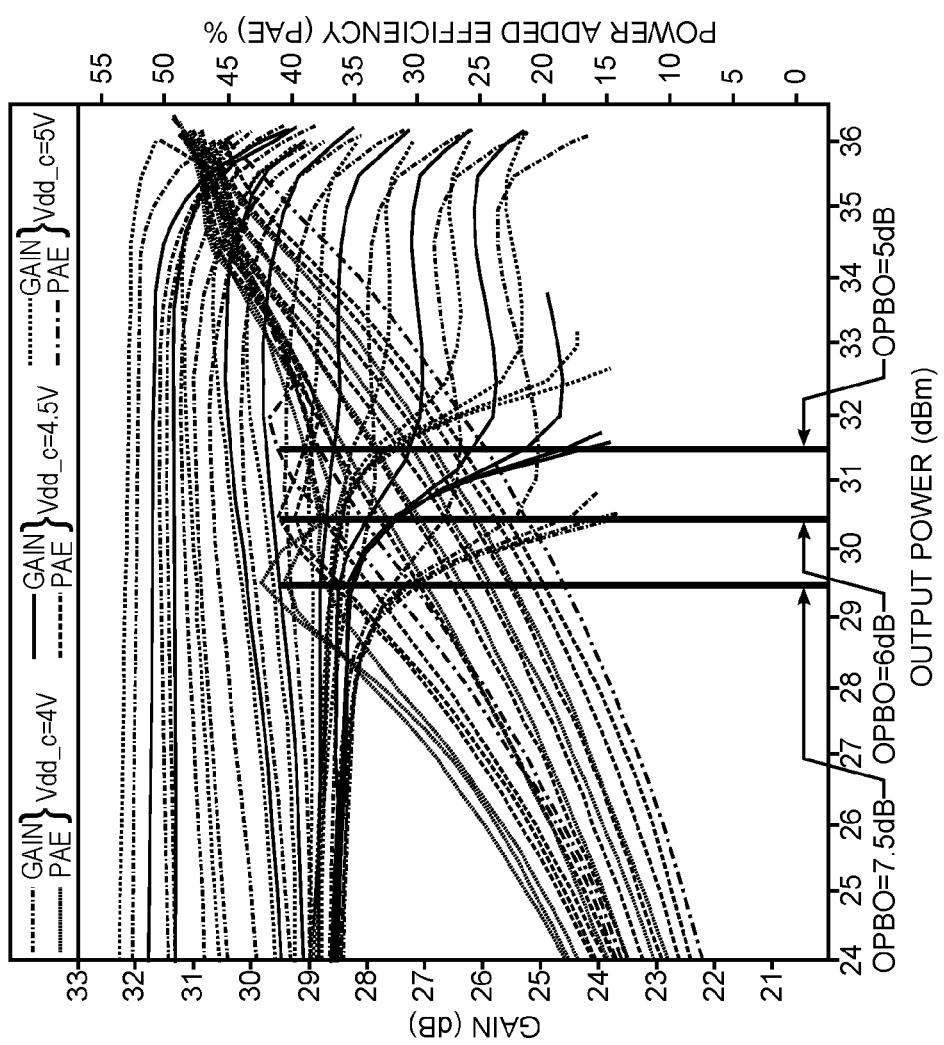
FIG. 45 is a graph that depicts gain and power added efficiency (PAE) versus output power for the reconfigurable load modulated power amplifier of FIG. 35-1 for a continuous wave measurement at 1900 MHz with an isolation termination impedance $Z_{ISO}$ of 5Ω, wherein a peak amplifier supply voltage is held at 5V and a carrier amplifier supply voltage switched between 5V, 4.5V, and 4V, respectively.

FIG. 45 is a graph that depicts gain and power added efficiency (PAE) versus output power for the reconfigurable load modulated power amplifier 132 of FIG. 35-1 for a continuous wave measurement at 1900 MHz with an isolation termination impedance $Z_{ISO}$ of 5Ω, wherein a peak amplifier supply voltage is held at 5V and a carrier amplifier supply voltage switched between 4V, 4.5V, and 5V, respectively. In this case, the first PA 134 functions as the carrier amplifier and the second PA 136 functions as the peak amplifier. FIG. 44 illustrates that in this exemplary case locations of OPBO peak efficiency occur at 5 dB, 6 dB, and 7.5 dB for carrier drain voltages Vdd_c of 5V, 4.5V, and 4V, respectively. Thus, when the isolation termination impedance $Z_{ISO}$ is less than 50Ω, the location at which OPBP peak efficiency occurs can be increased by asymmetrically biasing the reconfigurable load modulated amplifier 132 such that Vdd_p is greater than Vdd_c.

An exemplary application of the reconfigurable load modulated amplifier 132 is in fifth generation (5G) wireless communication equipment. For example, the use of massive multiple-input multiple-output (MIMO) and phased array antennas typically require a circulator to enable more efficient use of DPD. However, circulators are relatively large and cumbersome to integrate. As a result, there is an advantage to eliminating circulators from use with massive MIMO and phase array antennas. However, elimination of the circulator will pedance when the first PA 134 is operating at 6 dB backed off of compression for the first PA 134. In other embodiments, a load impedance presented to the first PA 134 is less than the nominal load impedance when the firsts. In one embodiment, eliminating a circulator involves detecting the VSWR introduced by the phased array antenna due to beam steering and determining whether the antenna's impedance is greater than 50Ω or less than 50Ω. In a first case, wherein the antenna's impedance is greater than 50Ω a baseband controller controls the output impedance tuning network 106 (FIGS. 35-1 and 35-2) such that the isolation termination impedance $Z_{ISO}$ is greater than 50Ω in order to preserve load insensitive operation of the reconfigurable load modulated amplifier 132. In a second case wherein the antenna's impedance is less than 50Ω a baseband controller controls the output impedance tuning network 106 (FIGS. 35-1 and 35-2) such that the isolation termination impedance $Z_{ISO}$ is less than 50Ω in order to preserve load insensitive operation of the reconfigurable load modulated amplifier 132. In the first case, the carrier amplifier is coupled to the output load $Z_{LOAD}$ through a 0° phase. In the second case, the carrier amplifier is coupled to the load impedance $Z_{LOAD}$. Note that the a 90°/0° phase shift is controlled by the control circuitry 138 or a baseband controller (not shown) that swaps the carrier and peak amplifiers through electronic control by changing their bias class conditions such as Class A for the carrier amplifier and Class C for the peak amplifier.

In one embodiment, the control circuitry 138 is coupled to an isolation port Z4 of the second quadrature coupler 100 by way of a control line that controls the output impedance tuning network 106. The control circuitry 138 is further configured to generate a control signal that tunes the adjustable impedance of the output impedance tuning network 106 to generate isolation termination impedance $Z_{ISO}$ at the isolation port of the second quadrature coupler 100 such that the adjustable impedance presented to the first PA 134 ranges between 40% of one-half of a nominal load impedance and 300% of the nominal load impedance in response to power at the output port 102. In exemplary embodiments, the nominal load impedance can be within range from 25Ω to 100Ω. However, it is to be understood that nominal load impedances outside this range are not beyond the scope of this disclosure. In one exemplary embodiment, the nominal load impedance is 50Ω.

In one embodiment the reconfigurable load modulated amplifier 132 further includes voltage standing wave ratio (VSWR) detection circuitry (FIG. 11, element 126) configured to detect a VSWR mismatch condition associated with the output port 106 and signal a detection of the VSWR mismatch condition to the control circuitry 138 or open loop baseband signal LUT 112 that in response tunes the adjustable impedance $Z_{ISO}$ to mitigate the VSWR mismatch condition. In at least one embodiment, the VSWR detection circuitry 126 is configured to determine if an antenna impedance is below or higher than the nominal load impedance. For example, the VSWR detection circuitry 126 is configured to detect that an antenna impedance is less than the nominal load impedance, and then in response, set by way of the control circuitry 138 the adjustable impedance to a termination impedance range that is greater than the nominal load impedance to increase isolation between the first PA 134 and the second PA 136 for improving load insensitive load modulation operation when the first PA 134 is 90° phase coupled to the output port 102.

In another example, the VSWR detection circuitry 126 is configured to detect that an antenna impedance is greater than the nominal load impedance, and then in response set by way of the control circuitry 138 the adjustable impedance to a termination impedance range that is greater than the nominal load impedance to increase isolation between the first PA 134 and the second PA 136 for improving load insensitive load modulation operation when the first PA is 90° phase coupled to the output port 102. In yet another example, the VSWR detection circuitry 126 is configured to detect that an antenna impedance is less than the nominal load impedance, and then in response, set by way of the control circuitry 138 the adjustable impedance to a termination impedance range that is greater than the nominal load impedance to increase isolation between the first PA 134 and the second PA 136 for improving load insensitive load modulation operation when the first PA is 0° phase coupled to the output port 102.

In yet another example, the VSWR detection circuitry 126 is configured to detect that an antenna impedance is greater than the nominal load impedance, and then in response set by way of the control circuitry 138 the adjustable impedance to a termination impedance range that is greater than the nominal load impedance to increase isolation between the first PA 134 and the second PA 136 for improving load insensitive load modulation operation when the first PA is 0° phase coupled to the output port 102.

In other embodiments, a load impedance presented to the first PA 134 is the nominal load impedance when the first PA 134 is operating at high saturated power levels, and the load impedance presented to the first PA 134 is at least twice the nominal load impedance when the first PA 134 is operating at 6 dB backed off of compression for the first PA 134. In other embodiments, a load impedance presented to the first PA 134 is less than the nominal load impedance when the first PA 134 is operating at high saturated power levels, and the load impedance presented to the first PA 134 is at least twice the nominal load impedance when the first PA 134 is operating at 6 dB backed of compression for the first PA 134. In another embodiment, the load impedance presented to the first PA 134 is less than the nominal load impedance when the first PA 134 is operating at less than 6 dB backed off of compression for the first PA 134. In yet another embodiment, the load impedance presented to the first PA 134 is less than the nominal load impedance when the first PA 134 is operating at more than 6 dB backed off of compression for the first PA 134.

In still other embodiments, a load impedance presented to the second PA 136 is the nominal load impedance when the second PA 136 is operating at high saturated power levels, and wherein the load impedance presented to the second PA 136 is at least twice the nominal load impedance when the second PA 136 is operating at 6 dB backed off of compression for the second PA 136. In yet other embodiments, a load impedance presented to the second PA 136 is less than the nominal load impedance when the second PA 136 is operating at high saturated power levels, and wherein the load impedance presented to the second PA 136 is at least twice the nominal load impedance when the second PA 136 is operating at 6 dB backed off of compression for the second PA 136. In additional embodiments, a load impedance presented to the second PA 136 is less than the nominal load impedance when the second PA 136 is operating at less than 6 dB backed off of compression for the second PA 136. In yet another embodiment, a load impedance presented to the second PA 136 is less than the nominal load impedance when the second PA 136 is operating at more than 6 dB backed off of compression for the second PA 136.

Those skilled in the art will recognize improvements and modifications to the embodiments of the present disclosure. All such improvements and modifications are considered within the scope of the concepts disclosed herein and the claims that follow.

What is claimed is:

1. A reconfigurable load modulation amplifier comprising:
   a first power amplifier (PA) configured to be supplied by a first drain voltage:
   a second PA coupled in parallel with the first PA, wherein the second PA is configured to be supplied by a second drain voltage;
   a quadrature coupler configured to combine power from both the first PA and the second PA for output through an output port; and
   control circuitry configured to set at least one of the first drain voltage and the second drain voltage such that the first drain voltage is different than the second drain voltage, wherein the control circuitry is coupled to an isolation port of the quadrature coupler and further configured to generate a control signal that tunes an adjustable impedance at the isolation port of the quadrature coupler such that the adjustable impedance presented to the first PA ranges between 40% of one-half of a nominal load impedance and 300% of the nominal load impedance in response to power at the output port.

2. The reconfigurable load modulation amplifier of claim 1 wherein the control circuitry is further configured to dynamically adjust at least one of the first drain voltage and the second drain voltage such that the first drain voltage is different than the second drain voltage.

3. The reconfigurable load modulation amplifier of claim 1 wherein:
   the first PA is biased for Class A operation;
   the second PA is biased for Class C operation; and
   the first PA is coupled to a load impedance through a 90° phase shift port of the quadrature coupler.

4. The reconfigurable load modulation amplifier of claim 3 wherein the control circuitry is further configured to maintain the second drain voltage greater than the first drain voltage when an isolation termination impedance coupled to an isolation port of the quadrature coupler is greater than a load impedance coupled to the output port.

5. The reconfigurable load modulation amplifier of claim 3 wherein the control circuitry is further configured to maintain the second drain voltage less than the first drain voltage when an isolation termination impedance coupled to an isolation port of the quadrature coupler is greater than a load impedance coupled to the output port.

6. The reconfigurable load modulation amplifier of claim 3 wherein the control circuitry is further configured to maintain the second drain voltage greater than the first drain voltage when an isolation termination impedance coupled to an isolation port of the quadrature coupler is less than a load impedance coupled to the output port.

7. The reconfigurable load modulation amplifier of claim 3 wherein the control circuitry is further configured to maintain the second drain voltage less than the first drain voltage when an isolation termination impedance coupled to an isolation port of the quadrature coupler is less than a load impedance coupled to the output port.

8. The reconfigurable load modulation amplifier of claim 1 wherein:
   the first PA is biased for Class C operation;
   the second PA is biased for Class A operation; and
   the second PA is coupled to a load impedance through a 0° phase shift port of the quadrature coupler.

9. The reconfigurable load modulation amplifier of claim 8 wherein the control circuitry is further configured to maintain the second drain voltage greater than the first drain voltage when an isolation termination impedance coupled to an isolation port of the quadrature coupler is greater than a load impedance coupled to the output port.

10. The reconfigurable load modulation amplifier of claim 8 wherein the control circuitry is further configured to maintain the second drain voltage less than the first drain voltage when an isolation termination impedance coupled to an isolation port of the quadrature coupler is greater than a load impedance coupled to the output port.

11. The reconfigurable load modulation amplifier of claim 8 wherein the control circuitry is further configured to maintain the second drain voltage greater than the first drain voltage when an isolation termination impedance coupled to an isolation port of the quadrature coupler is less than a load impedance coupled to the output port.

12. The reconfigurable load modulation amplifier of claim 8 wherein the control circuitry is further configured to maintain the second drain voltage less than the first drain voltage when an isolation termination impedance coupled to an isolation port of the quadrature coupler is less than a load impedance coupled to the output port.

13. The reconfigurable load modulation amplifier of claim 1 wherein the first PA is further configured to be supplied by the first drain voltage while the first drain voltage is modulated in response to a dynamically changing modulated signal format.

14. The reconfigurable load modulation amplifier of claim 1 wherein the second PA is further configured to be supplied by the second drain voltage while the second drain voltage is modulated in response to a dynamically changing modulated signal format.

15. The reconfigurable load modulation amplifier of claim 1 wherein the first PA is further configured to be supplied by the first drain voltage while the first drain voltage is modulated in response to a dynamically changing modulated signal format and the second PA is further configured to be supplied by the second drain voltage while the second drain voltage is modulated in response to the dynamically changing modulated signal format.

16. The reconfigurable load modulation amplifier of claim 1 wherein the first PA is further configured to be supplied by the first drain voltage while the first drain voltage is modulated in response to envelope tracking.

17. The reconfigurable load modulation amplifier of claim 1 wherein the second PA is further configured to be supplied by the second drain voltage while the second drain voltage is modulated in response to envelope tracking.

18. The reconfigurable load modulation amplifier of claim 1 wherein the first PA is further configured to be supplied by the first drain voltage while the first drain voltage is modulated in response to envelope tracking and the second PA is further configured to be supplied by the second drain voltage while the second drain voltage is modulated in response to envelope tracking.

19. The reconfigurable load modulation amplifier of claim 1 wherein the first PA is further configured to be supplied by the first drain voltage while the first drain voltage is modulated in response to instantaneous peak power over signal amplitude swing.

20. The reconfigurable load modulation amplifier of claim 1 wherein the second PA is further configured to be supplied by the second drain voltage while the second drain voltage is modulated in response to instantaneous peak power over signal amplitude swing.

21. The reconfigurable load modulation amplifier of claim 1 wherein the first PA is further configured to be supplied by the first drain voltage while the first drain voltage is modulated in response to instantaneous peak power over signal amplitude swing and the second PA is further configured to be supplied by the second drain voltage while the second drain voltage is modulated in response to instantaneous peak power over signal amplitude swing.

22. The reconfigurable load modulation amplifier of claim 1 wherein the first PA is further configured to be supplied by the first drain voltage while the first drain voltage is modulated in response to an average power tracking of an aggregate input signal.

23. The reconfigurable load modulation amplifier of claim 1 wherein the second PA is further configured to be supplied by the second drain voltage while the second drain voltage is modulated in response to an average power tracking of an aggregate input signal.

24. The reconfigurable load modulation amplifier of claim 1 wherein the first PA is further configured to be supplied by the first drain voltage while the first drain voltage is modulated in response to an average power tracking of an aggregate input signal and the second PA is further configured to be supplied by the second drain voltage while the second drain voltage is modulated in response to an average power tracking of an aggregate input signal.

25. The reconfigurable load modulation amplifier of claim 1 wherein the first PA is further configured to be supplied by the first drain voltage while the first drain voltage is modulated in response to peak power of an aggregate input signal.

26. The reconfigurable load modulation amplifier of claim 1 wherein the second PA is further configured to be supplied by the second drain voltage while the second drain voltage is modulated in response to peak power of an aggregate input signal.

27. The reconfigurable load modulation amplifier of claim 1 wherein the first PA is further configured to be supplied by the first drain voltage while the first drain voltage is modulated in response to peak power of an aggregate input signal and the second PA is further configured to be supplied by the second drain voltage while the second drain voltage is modulated in response to peak power of an aggregate input signal.

28. The reconfigurable load modulation amplifier of claim 1 wherein the first PA is further configured to be supplied by the first drain voltage while the first drain voltage is modulated in response to instantaneous power of an aggregate input signal.

29. The reconfigurable load modulation amplifier of claim 1 wherein the second PA is further configured to be supplied by the second drain voltage while the second drain voltage is modulated in response to instantaneous power of an aggregate input signal.

30. The reconfigurable load modulation amplifier of claim 1 wherein the first PA is further configured to be supplied by the first drain voltage while the first drain voltage is modulated in response to instantaneous power of an aggregate input signal and the second PA is further configured to be supplied by the second drain voltage while the second drain voltage is modulated in response to instantaneous power of an aggregate input signal.

31. The reconfigurable load modulation amplifier of claim 1 wherein the first PA is further configured to be supplied by the first drain voltage while the first drain voltage is modulated in response to a change in signal peak to average power ratio (PAPR) based on network environmental conditions.

32. The reconfigurable load modulation amplifier of claim 1 wherein the second PA is further configured to be supplied by the second drain voltage while the second drain voltage is modulated in response to a change in signal PAPR based on network environmental conditions.

33. The reconfigurable load modulation amplifier of claim 1 wherein the first PA is further configured to be supplied by the first drain voltage while the first drain voltage is modulated in response to a change in signal PAPR based on network environmental conditions and the second PA is further configured to be supplied by the second drain voltage while the second drain voltage is modulated in response to the change in signal PAPR based on network environmental conditions.

34. The reconfigurable load modulation amplifier of claim 1 wherein the nominal load impedance is in a range from 25 Ohms to 100 Ohms.

35. The reconfigurable load modulation amplifier of claim 1 wherein the nominal load impedance is 50 Ohms.

36. The reconfigurable load modulation amplifier of claim 1 further including voltage standing wave ratio (VSWR) detection circuitry configured to detect a VSWR mismatch condition associated with the output port and signal a detection of the VSWR mismatch condition to the control circuitry that in response tunes the adjustable impedance to mitigate the VSWR mismatch condition.

37. The reconfigurable load modulation amplifier of claim 36 wherein the VSWR detection circuitry is configured to determine if an antenna impedance is below or higher than the nominal load impedance.

38. The reconfigurable load modulation amplifier of claim 36 wherein the VSWR detection circuitry is configured to detect that an antenna impedance is less than the nominal load impedance, and then in response set by way of the control circuitry the adjustable impedance to a termination impedance range that is greater than the nominal load impedance to increase isolation between the first PA and the second PA for improving load insensitive load modulation operation when the first PA is 90° phase coupled to the output port.

39. The reconfigurable load modulation amplifier of claim 36 wherein the VSWR detection circuitry is configured to detect that an antenna impedance is greater than the nominal load impedance, and then in response set by way of the control circuitry the adjustable impedance to a termination impedance range that is greater than the nominal load impedance to increase isolation between the first PA and the second PA for improving load insensitive load modulation operation when the first PA is 90° phase coupled to the output port.

40. The reconfigurable load modulation amplifier of claim 36 wherein the VSWR detection circuitry is configured to detect that an antenna impedance is less than the nominal load impedance, and then in response set by way of the control circuitry the adjustable impedance to a termination impedance range that is greater than the nominal load impedance to increase isolation between the first PA and the second PA for improving load insensitive load modulation operation when the first PA is 0° phase coupled to the output port.

41. The reconfigurable load modulation amplifier of claim 36 wherein the VSWR detection circuitry is configured to detect that an antenna impedance is greater than the nominal load impedance, and then in response set by way of the control circuitry the adjustable impedance to a termination impedance range that is greater than the nominal load impedance to increase isolation between the first PA and the second PA for improving load insensitive load modulation operation when the first PA is 0° phase coupled to the output port.

42. The reconfigurable load modulation amplifier of claim 36 wherein a load impedance presented to the first PA is the nominal load impedance when the first PA is operating at high saturated power levels, and wherein the load impedance presented to the first PA is at least twice the nominal load impedance when the first PA is operating at 6 dB backed off of compression for the first PA.

43. The reconfigurable load modulation amplifier of claim 36 wherein a load impedance presented to the first PA is less than the nominal load impedance when the first PA is operating at high saturated power levels, and wherein the load impedance presented to the first PA is at least twice the nominal load impedance when the first PA is operating at 6 dB backed off of compression for the first PA.

44. The reconfigurable load modulation amplifier of claim 36 wherein a load impedance presented to the first PA is less than the nominal load impedance when the first PA is operating at less than 6 dB backed off of compression for the first PA.

45. The reconfigurable load modulation amplifier of claim 36 wherein a load impedance presented to the first PA is less than the nominal load impedance when the first PA is operating at more than 6 dB backed off of compression for the first PA.

46. The reconfigurable load modulation amplifier of claim 36 wherein a load impedance presented to the second PA is the nominal load impedance when the second PA is operating at high saturated power levels, and wherein the load impedance presented to the second PA is at least twice the nominal load impedance when the second PA is operating at 6 dB backed off of compression for the second PA.

47. The reconfigurable load modulation amplifier of claim 36 wherein a load impedance presented to the second PA is less than the nominal load impedance when the second PA is operating at high saturated power levels, and wherein the load impedance presented to the second PA is at least twice the nominal load impedance when the second PA is operating at 6 dB backed off of compression for the second PA.

48. The reconfigurable load modulation amplifier of claim 36 wherein a load impedance presented to the second PA is less than the nominal load impedance when the second PA is operating at less than 6 dB backed off of compression for the second PA.

49. The reconfigurable load modulation amplifier of claim 36 wherein a load impedance presented to the second PA is more than the nominal load impedance when the second PA is operating at less than 6 dB backed off of compression for the second PA.

50. The reconfigurable load modulation amplifier of claim 1 further including redirectable bias circuitry that is configured to bias the first PA for Class A operation and the second PA for Class C operation in a first mode and bias the first PA for Class C operation and the second PA for Class A operation in a second mode.

51. The reconfigurable load modulation amplifier of claim 50 wherein the control circuitry is further configured to generate a mode select signal that switches the mode selectable bias circuitry between the first mode and the second mode.

* * * * *